(12) United States Patent
Namba

(10) Patent No.: US 9,607,837 B1
(45) Date of Patent: Mar. 28, 2017

(54) METHOD FOR FORMING SILICON OXIDE CAP LAYER FOR SOLID STATE DIFFUSION PROCESS

(71) Applicant: ASM IP Holding B.V., Almere (NL)

(72) Inventor: Kunitoshi Namba, Machida (JP)

(73) Assignee: ASM IP Holding B.V., Almere (NL)

( * ) Notice: Subject to any disclaimer, the term of this patent is extended or adjusted under 35 U.S.C. 154(b) by 0 days.

(21) Appl. No.: 14/977,291

(22) Filed: Dec. 21, 2015

(51) Int. Cl.
*H01L 21/22* (2006.01)
*H01L 21/225* (2006.01)
*H01L 21/02* (2006.01)

(52) U.S. Cl.
CPC ...... *H01L 21/2256* (2013.01); *H01L 21/0228* (2013.01); *H01L 21/02129* (2013.01); *H01L 21/02211* (2013.01); *H01L 21/02274* (2013.01)

(58) Field of Classification Search
CPC .................. H01L 2924/0002; H01L 2924/00
See application file for complete search history.

(56) References Cited

U.S. PATENT DOCUMENTS

| | | |
|---|---|---|
| D56,051 S | 8/1920 | Cohn |
| 2,161,626 A | 6/1939 | Loughner et al. |
| 2,745,640 A | 5/1956 | Cushman |
| 2,990,045 A | 9/1959 | Root |
| 3,089,507 A | 5/1963 | Drake et al. |
| 3,094,396 A | 6/1963 | Sylvester et al. |
| 3,232,437 A | 2/1966 | Hultgren |
| 3,833,492 A | 9/1974 | Bollyky |
| 3,854,443 A | 12/1974 | Baerg |
| 3,862,397 A | 1/1975 | Anderson et al. |
| 3,887,790 A | 6/1975 | Ferguson |
| 4,054,071 A | 10/1977 | Patejak |
| 4,058,430 A | 11/1977 | Suntola et al. |
| 4,134,425 A | 1/1979 | Gussefeld et al. |
| 4,145,699 A | 3/1979 | Hu et al. |
| 4,176,630 A | 12/1979 | Elmer |
| 4,181,330 A | 1/1980 | Kojima |
| 4,194,536 A | 3/1980 | Stine et al. |
| 4,322,592 A | 3/1982 | Martin |

(Continued)

FOREIGN PATENT DOCUMENTS

| | | |
|---|---|---|
| CN | 1563483 | 1/2005 |
| CN | 101330015 | 12/2008 |

(Continued)

OTHER PUBLICATIONS

USPTO; Office Action dated Aug. 27, 2010 in U.S. Appl. No. 12/118,596.

(Continued)

*Primary Examiner* — Caridad Everhart
*Assistant Examiner* — Ankush Singal
(74) *Attorney, Agent, or Firm* — Snell & Wilmer LLP

(57) ABSTRACT

A method for protecting a doped silicate glass layer includes: forming a doped silicate glass layer on a substrate in a reaction chamber by plasma-enhanced atomic layer deposition (PEALD) using a first RF power; and forming a non-doped silicate glass layer having a thickness of less than 4 nm on the doped silicate glass layer in the reaction chamber, without breaking vacuum, by plasma-enhanced atomic layer deposition (PEALD) using a second RF power, wherein the second RF power is at least twice the first RF power.

20 Claims, 6 Drawing Sheets

(56) References Cited

U.S. PATENT DOCUMENTS

| | | |
|---|---|---|
| 4,389,973 A | 6/1983 | Suntola et al. |
| 4,393,013 A | 7/1983 | McMenamin |
| 4,401,507 A | 8/1983 | Engle |
| 4,414,492 A | 11/1983 | Hanlet |
| 4,436,674 A | 3/1984 | McMenamin |
| 4,479,831 A | 10/1984 | Sandow |
| 4,499,354 A | 2/1985 | Hill et al. |
| 4,512,113 A | 4/1985 | Budinger |
| 4,570,328 A | 2/1986 | Price et al. |
| 4,579,623 A | 4/1986 | Suzuki et al. |
| D288,556 S | 3/1987 | Wallgren |
| 4,653,541 A | 3/1987 | Oehlschlaeger et al. |
| 4,654,226 A | 3/1987 | Jackson et al. |
| 4,681,134 A | 7/1987 | Paris |
| 4,718,637 A | 1/1988 | Contin |
| 4,722,298 A | 2/1988 | Rubin et al. |
| 4,735,259 A | 4/1988 | Vincent |
| 4,753,192 A | 6/1988 | Goldsmith et al. |
| 4,756,794 A | 7/1988 | Yoder |
| 4,780,169 A | 10/1988 | Stark et al. |
| 4,789,294 A | 12/1988 | Sato et al. |
| 4,821,674 A | 4/1989 | deBoer et al. |
| 4,827,430 A | 5/1989 | Aid et al. |
| 4,837,185 A | 6/1989 | Yau et al. |
| 4,854,263 A | 8/1989 | Chang et al. |
| 4,857,137 A | 8/1989 | Tashiro et al. |
| 4,857,382 A | 8/1989 | Sheng et al. |
| 4,882,199 A | 11/1989 | Sadoway et al. |
| 4,976,996 A | 12/1990 | Monkowski et al. |
| 4,978,567 A | 12/1990 | Miller |
| 4,984,904 A | 1/1991 | Nakano et al. |
| 4,985,114 A | 1/1991 | Okudaira |
| 4,986,215 A | 1/1991 | Yamada |
| 4,987,856 A | 1/1991 | Hey |
| 4,991,614 A | 2/1991 | Hammel |
| 5,013,691 A | 5/1991 | Lory et al. |
| 5,027,746 A | 7/1991 | Frijlink |
| 5,028,366 A | 7/1991 | Harakal et al. |
| 5,060,322 A | 10/1991 | Delepine |
| 5,062,386 A | 11/1991 | Christensen |
| 5,065,698 A | 11/1991 | Koike |
| 5,074,017 A | 12/1991 | Toya et al. |
| 5,098,638 A | 3/1992 | Sawada |
| 5,104,514 A | 4/1992 | Quartarone |
| 5,116,018 A | 5/1992 | Friemoth et al. |
| D327,534 S | 6/1992 | Manville |
| 5,119,760 A | 6/1992 | McMillan et al. |
| 5,167,716 A | 12/1992 | Boitnott et al. |
| 5,178,682 A | 1/1993 | Tsukamoto et al. |
| 5,183,511 A | 2/1993 | Yamazaki et al. |
| 5,192,717 A | 3/1993 | Kawakami |
| 5,194,401 A | 3/1993 | Adams et al. |
| 5,199,603 A | 4/1993 | Prescott |
| 5,221,556 A | 6/1993 | Hawkins et al. |
| 5,242,539 A | 9/1993 | Kumihashi et al. |
| 5,243,195 A | 9/1993 | Nishi |
| 5,246,500 A | 9/1993 | Samata et al. |
| 5,271,967 A | 12/1993 | Kramer et al. |
| 5,288,684 A | 2/1994 | Yamazaki et al. |
| 5,306,946 A | 4/1994 | Yamamoto |
| 5,315,092 A | 5/1994 | Takahashi et al. |
| 5,326,427 A | 7/1994 | Jerbic |
| 5,336,327 A | 8/1994 | Lee |
| 5,354,580 A | 10/1994 | Goela et al. |
| 5,356,478 A | 10/1994 | Chen et al. |
| 5,360,269 A | 11/1994 | Ogawa et al. |
| 5,380,367 A | 1/1995 | Bertone |
| 5,382,311 A | 1/1995 | Ishikawa et al. |
| 5,404,082 A | 4/1995 | Hernandez et al. |
| 5,413,813 A | 5/1995 | Cruse et al. |
| 5,415,753 A | 5/1995 | Hurwitt et al. |
| 5,421,893 A | 6/1995 | Perlov |
| 5,422,139 A | 6/1995 | Fischer |
| 5,430,011 A | 7/1995 | Tanaka et al. |
| 5,494,494 A | 2/1996 | Mizuno et al. |
| 5,496,408 A | 3/1996 | Motoda et al. |
| 5,504,042 A | 4/1996 | Cho et al. |
| 5,518,549 A | 5/1996 | Hellwig |
| 5,527,417 A | 6/1996 | Iida et al. |
| 5,531,835 A | 7/1996 | Fodor et al. |
| 5,574,247 A | 11/1996 | Nishitani et al. |
| 5,577,331 A | 11/1996 | Suzuki |
| 5,589,002 A | 12/1996 | Su |
| 5,589,110 A | 12/1996 | Motoda et al. |
| 5,595,606 A | 1/1997 | Fujikawa et al. |
| 5,601,641 A | 2/1997 | Stephens |
| 5,604,410 A | 2/1997 | Vollkommer et al. |
| 5,616,947 A | 4/1997 | Tamura |
| 5,621,982 A | 4/1997 | Yamashita |
| 5,632,919 A | 5/1997 | MacCracken et al. |
| D380,527 S | 7/1997 | Velez |
| 5,679,215 A | 10/1997 | Barnes et al. |
| 5,681,779 A | 10/1997 | Pasch et al. |
| 5,683,517 A | 11/1997 | Shan |
| 5,695,567 A | 12/1997 | Kordina |
| 5,718,574 A | 2/1998 | Shimazu |
| 5,724,748 A | 3/1998 | Brooks |
| 5,728,223 A | 3/1998 | Murakarni et al. |
| 5,730,801 A | 3/1998 | Tepman et al. |
| 5,732,744 A | 3/1998 | Barr et al. |
| 5,736,314 A | 4/1998 | Hayes et al. |
| 5,777,838 A | 7/1998 | Tamagawa et al. |
| 5,781,693 A | 7/1998 | Balance et al. |
| 5,796,074 A | 8/1998 | Edelstein et al. |
| 5,801,104 A | 9/1998 | Schuegraf et al. |
| 5,819,434 A | 10/1998 | Herchen et al. |
| 5,827,757 A | 10/1998 | Robinson, Jr. et al. |
| 5,836,483 A | 11/1998 | Disel |
| 5,837,320 A | 11/1998 | Hampden-Smith et al. |
| 5,852,879 A | 12/1998 | Schumaier |
| 5,853,484 A | 12/1998 | Jeong |
| 5,855,680 A | 1/1999 | Soininen et al. |
| 5,855,681 A | 1/1999 | Maydan et al. |
| 5,873,942 A | 2/1999 | Park |
| 5,877,095 A | 3/1999 | Tamura et al. |
| D409,894 S | 5/1999 | McClurg |
| 5,908,672 A | 6/1999 | Ryu |
| 5,916,365 A | 6/1999 | Sherman |
| 5,920,798 A | 7/1999 | Higuchi et al. |
| 5,968,275 A | 10/1999 | Lee et al. |
| 5,975,492 A | 11/1999 | Brenes |
| 5,979,506 A | 11/1999 | Aarseth |
| 5,997,588 A | 12/1999 | Goodwin |
| 5,997,768 A | 12/1999 | Scully |
| D419,652 S | 1/2000 | Hall et al. |
| 6,013,553 A | 1/2000 | Wallace |
| 6,015,465 A | 1/2000 | Kholodenko et al. |
| 6,017,779 A | 1/2000 | Miyasaka |
| 6,024,799 A | 2/2000 | Chen |
| 6,035,101 A | 3/2000 | Sajoto et al. |
| 6,042,652 A | 3/2000 | Hyun |
| 6,044,860 A | 4/2000 | Neu |
| 6,050,506 A | 4/2000 | Guo et al. |
| 6,060,691 A | 5/2000 | Minami et al. |
| 6,074,443 A | 6/2000 | Venkatesh |
| 6,083,321 A | 7/2000 | Lei et al. |
| 6,086,677 A | 7/2000 | Umotoy et al. |
| 6,099,302 A | 8/2000 | Hong et al. |
| 6,122,036 A | 9/2000 | Yamasaki et al. |
| 6,124,600 A | 9/2000 | Moroishi et al. |
| 6,125,789 A | 10/2000 | Gupta et al. |
| 6,129,044 A | 10/2000 | Zhao et al. |
| 6,134,807 A | 10/2000 | Komino |
| 6,137,240 A | 10/2000 | Bogdan et al. |
| 6,140,252 A | 10/2000 | Cho et al. |
| 6,148,761 A | 11/2000 | Majewski et al. |
| 6,160,244 A | 12/2000 | Ohashi |
| 6,161,500 A | 12/2000 | Kopacz et al. |
| 6,162,323 A | 12/2000 | Koshimizu et al. |
| 6,180,979 B1 | 1/2001 | Hofmann et al. |
| 6,187,691 B1 | 2/2001 | Fukuda |
| 6,190,634 B1 | 2/2001 | Lieber et al. |
| 6,194,037 B1 | 2/2001 | Terasaki et al. |
| 6,201,999 B1 | 3/2001 | Jevtic |

(56) References Cited

U.S. PATENT DOCUMENTS

| | | |
|---|---|---|
| 6,207,932 B1 | 3/2001 | Yoo |
| 6,212,789 B1 | 4/2001 | Kato |
| 6,218,288 B1 | 4/2001 | Li et al. |
| 6,250,250 B1 | 6/2001 | Maishev et al. |
| 6,271,148 B1 | 8/2001 | Kao |
| 6,274,878 B1 | 8/2001 | Li et al. |
| 6,281,098 B1 | 8/2001 | Wang et al. |
| 6,287,965 B1 | 9/2001 | Kang et al. |
| D449,873 S | 10/2001 | Bronson |
| 6,296,909 B1 | 10/2001 | Spitsberg |
| 6,299,133 B2 | 10/2001 | Waragai et al. |
| 6,302,964 B1 | 10/2001 | Umotoy et al. |
| 6,303,523 B2 | 10/2001 | Cheung |
| 6,305,898 B1 | 10/2001 | Yamagishi et al. |
| 6,312,525 B1 | 11/2001 | Bright et al. |
| 6,315,512 B1 | 11/2001 | Tabrizi et al. |
| D451,893 S | 12/2001 | Robson |
| D452,220 S | 12/2001 | Robson |
| 6,325,858 B1 | 12/2001 | Wengert |
| 6,326,597 B1 | 12/2001 | Lubomirsky et al. |
| 6,329,297 B1 | 12/2001 | Balish |
| 6,342,427 B1 | 1/2002 | Choi et al. |
| 6,347,636 B1 | 2/2002 | Xia |
| 6,352,945 B1 | 3/2002 | Matsuki |
| 6,367,410 B1 | 4/2002 | Leahey et al. |
| 6,368,987 B1 | 4/2002 | Kopacz et al. |
| 6,370,796 B1 | 4/2002 | Zucker |
| 6,372,583 B1 | 4/2002 | Tyagi |
| 6,374,831 B1 | 4/2002 | Chandran et al. |
| 6,375,312 B1 | 4/2002 | Ikeda et al. |
| D457,609 S | 5/2002 | Piano |
| 6,383,566 B1 | 5/2002 | Zagdoun |
| 6,383,955 B1 | 5/2002 | Matsuki |
| 6,387,207 B1 | 5/2002 | Janakiraman |
| 6,391,803 B1 | 5/2002 | Kim et al. |
| 6,398,184 B1 | 6/2002 | Sowada et al. |
| 6,410,459 B2 | 6/2002 | Blalock et al. |
| 6,413,321 B1 | 7/2002 | Kim et al. |
| 6,413,583 B1 | 7/2002 | Moghadam et al. |
| 6,420,279 B1 | 7/2002 | Ono et al. |
| D461,233 S | 8/2002 | Whalen |
| D461,882 S | 8/2002 | Piano |
| 6,435,798 B1 | 8/2002 | Satoh |
| 6,436,819 B1 | 8/2002 | Zhang |
| 6,437,444 B2 | 8/2002 | Andideh |
| 6,445,574 B1 | 9/2002 | Saw et al. |
| 6,446,573 B2 | 9/2002 | Hirayama et al. |
| 6,450,757 B1 | 9/2002 | Saeki |
| 6,454,860 B2 | 9/2002 | Metzner et al. |
| 6,455,445 B2 | 9/2002 | Matsuki |
| 6,461,435 B1 | 10/2002 | Littau et al. |
| 6,468,924 B2 | 10/2002 | Lee |
| 6,472,266 B1 | 10/2002 | Yu et al. |
| 6,475,276 B1 | 11/2002 | Elers et al. |
| 6,475,930 B1 | 11/2002 | Junker et al. |
| 6,478,872 B1 | 11/2002 | Chae et al. |
| 6,482,331 B2 | 11/2002 | Lu et al. |
| 6,482,663 B1 | 11/2002 | Buckland |
| 6,483,989 B1 | 11/2002 | Okada et al. |
| 6,494,065 B2 | 12/2002 | Babbitt, III |
| 6,499,533 B2 | 12/2002 | Yamada |
| 6,503,562 B1 | 1/2003 | Saito et al. |
| 6,503,826 B1 | 1/2003 | Oda |
| 6,511,539 B1 | 1/2003 | Raaijmakers |
| 6,521,295 B1 | 2/2003 | Remington |
| 6,521,547 B1 | 2/2003 | Chang et al. |
| 6,528,430 B2 | 3/2003 | Kwan |
| 6,528,767 B2 | 3/2003 | Bagley et al. |
| 6,531,193 B2 | 3/2003 | Fonash et al. |
| 6,531,412 B2 | 3/2003 | Conti et al. |
| 6,534,395 B2 | 3/2003 | Werkhoven et al. |
| 6,558,755 B2 | 5/2003 | Berry et al. |
| 6,569,239 B2 | 5/2003 | Arai et al. |
| 6,573,030 B1 | 6/2003 | Fairbairn et al. |
| 6,576,062 B2 | 6/2003 | Matsuse |
| 6,576,064 B2 | 6/2003 | Torres et al. |
| 6,576,300 B1 | 6/2003 | Berry, III et al. |
| 6,579,833 B1 | 6/2003 | McNallan et al. |
| 6,583,048 B1 | 6/2003 | Vincent et al. |
| 6,590,251 B2 | 7/2003 | Kang et al. |
| 6,594,550 B1 | 7/2003 | Okrah |
| 6,598,559 B1 | 7/2003 | Vellore et al. |
| 6,627,503 B2 | 9/2003 | Ma et al. |
| 6,632,478 B2 | 10/2003 | Gaillard et al. |
| 6,633,364 B2 | 10/2003 | Hayashi |
| 6,635,117 B1 | 10/2003 | Kinnard et al. |
| 6,638,839 B2 | 10/2003 | Deng et al. |
| 6,645,304 B2 | 11/2003 | Yamaguchi |
| 6,648,974 B1 | 11/2003 | Ogliari et al. |
| 6,649,921 B1 | 11/2003 | Cekic et al. |
| 6,652,924 B2 | 11/2003 | Sherman |
| 6,673,196 B1 | 1/2004 | Oyabu |
| 6,682,973 B1 | 1/2004 | Paton et al. |
| D486,891 S | 2/2004 | Cronce |
| 6,688,784 B1 | 2/2004 | Templeton |
| 6,689,220 B1 | 2/2004 | Nguyen |
| 6,692,575 B1 | 2/2004 | Omstead et al. |
| 6,692,576 B2 | 2/2004 | Halpin et al. |
| 6,699,003 B2 | 3/2004 | Saeki et al. |
| 6,709,989 B2 | 3/2004 | Ramdani et al. |
| 6,710,364 B2 | 3/2004 | Guldi et al. |
| 6,713,824 B1 | 3/2004 | Mikata et al. |
| 6,716,571 B2 | 4/2004 | Gabriel et al. |
| 6,723,642 B1 | 4/2004 | Lim et al. |
| 6,730,614 B1 | 5/2004 | Lim et al. |
| 6,734,090 B2 | 5/2004 | Agarwala et al. |
| 6,740,853 B1 | 5/2004 | Johnson et al. |
| 6,743,475 B2 | 6/2004 | Skarp et al. |
| 6,743,738 B2 | 6/2004 | Todd et al. |
| 6,753,507 B2 | 6/2004 | Fure et al. |
| 6,756,318 B2 | 6/2004 | Nguyen et al. |
| 6,759,098 B2 | 7/2004 | Han |
| 6,760,981 B2 | 7/2004 | Leap |
| 6,784,108 B1 | 8/2004 | Donohoe et al. |
| D497,977 S | 11/2004 | Engelbrektsson |
| 6,815,350 B2 | 11/2004 | Kim et al. |
| 6,820,570 B2 | 11/2004 | Kilpela et al. |
| 6,821,910 B2 | 11/2004 | Adomaitis et al. |
| 6,824,665 B2 | 11/2004 | Shipley et al. |
| 6,825,134 B2 | 11/2004 | Law et al. |
| 6,846,515 B2 | 1/2005 | Vrtis |
| 6,847,014 B1 | 1/2005 | Benjamin et al. |
| 6,858,524 B2 | 2/2005 | Haukka et al. |
| 6,858,547 B2 | 2/2005 | Metzner |
| 6,863,019 B2 | 3/2005 | Shamouilian |
| 6,864,041 B2 | 3/2005 | Brown |
| 6,872,258 B2 | 3/2005 | Park et al. |
| 6,872,259 B2 | 3/2005 | Strang |
| 6,874,247 B1 | 4/2005 | Hsu |
| 6,874,480 B1 | 4/2005 | Ismailov |
| 6,875,677 B1 | 4/2005 | Conley, Jr. et al. |
| 6,876,017 B2 | 4/2005 | Goodner |
| 6,884,066 B2 | 4/2005 | Nguyen et al. |
| 6,884,319 B2 | 4/2005 | Kim |
| 6,889,864 B2 | 5/2005 | Lindfors et al. |
| 6,895,158 B2 | 5/2005 | Aylward et al. |
| 6,899,507 B2 | 5/2005 | Yamagishi et al. |
| 6,909,839 B2 | 6/2005 | Wang et al. |
| 6,911,092 B2 | 6/2005 | Sneh |
| 6,913,796 B2 | 7/2005 | Albano et al. |
| 6,930,059 B2 | 8/2005 | Conley, Jr. et al. |
| 6,935,269 B2 | 8/2005 | Lee et al. |
| 6,939,817 B2 | 9/2005 | Sandhu et al. |
| 6,951,587 B1 | 10/2005 | Narushima |
| 6,953,609 B2 | 10/2005 | Carollo |
| 6,955,836 B2 | 10/2005 | Kumagai et al. |
| 6,972,478 B1 | 12/2005 | Waite et al. |
| 6,974,781 B2 | 12/2005 | Timmermans et al. |
| 6,976,822 B2 | 12/2005 | Woodruff et al. |
| 6,984,595 B1 | 1/2006 | Yamazaki |
| 6,990,430 B2 | 1/2006 | Hosek |
| 7,021,881 B2 | 4/2006 | Yamagishi |
| 7,045,430 B2 | 5/2006 | Ahn et al. |
| 7,049,247 B2 | 5/2006 | Gates et al. |

(56) References Cited

U.S. PATENT DOCUMENTS

| | | |
|---|---|---|
| 7,053,009 B2 | 5/2006 | Conley, Jr. et al. |
| 7,055,875 B2 | 6/2006 | Bonora |
| 7,071,051 B1 | 7/2006 | Jeon et al. |
| 7,084,079 B2 | 8/2006 | Conti et al. |
| 7,088,003 B2 | 8/2006 | Gates et al. |
| 7,092,287 B2 | 8/2006 | Beulens et al. |
| 7,098,149 B2 | 8/2006 | Lukas |
| 7,109,098 B1 | 9/2006 | Ramaswamy et al. |
| 7,115,838 B2 | 10/2006 | Kurara et al. |
| 7,122,085 B2 | 10/2006 | Shero et al. |
| 7,122,222 B2 | 10/2006 | Xiao et al. |
| 7,129,165 B2 | 10/2006 | Basol et al. |
| 7,132,360 B2 | 11/2006 | Schaeffer et al. |
| 7,135,421 B2 | 11/2006 | Ahn et al. |
| 7,143,897 B1 | 12/2006 | Guzman et al. |
| 7,147,766 B2 | 12/2006 | Uzoh et al. |
| 7,153,542 B2 | 12/2006 | Nguyen et al. |
| 7,163,721 B2 | 1/2007 | Zhang et al. |
| 7,163,900 B2 | 1/2007 | Weber |
| 7,172,497 B2 | 2/2007 | Basol et al. |
| 7,192,824 B2 | 3/2007 | Ahn et al. |
| 7,192,892 B2 | 3/2007 | Ahn et al. |
| 7,195,693 B2 | 3/2007 | Cowans |
| 7,201,943 B2 | 4/2007 | Park et al. |
| 7,204,887 B2 | 4/2007 | Kawamura et al. |
| 7,205,246 B2 | 4/2007 | MacNeil et al. |
| 7,205,247 B2 | 4/2007 | Lee et al. |
| 7,207,763 B2 | 4/2007 | Lee |
| 7,208,389 B1 | 4/2007 | Tipton et al. |
| 7,211,524 B2 | 5/2007 | Ryu et al. |
| 7,234,476 B2 | 6/2007 | Arai |
| 7,235,137 B2 | 6/2007 | Kitayama et al. |
| 7,235,482 B2 | 6/2007 | Wu |
| 7,235,501 B2 | 6/2007 | Ahn et al. |
| 7,238,596 B2 | 7/2007 | Kouvetakis et al. |
| 7,265,061 B1 | 9/2007 | Cho et al. |
| D553,104 S | 10/2007 | Oohashi et al. |
| 7,290,813 B2 | 11/2007 | Bonora |
| 7,294,581 B2 | 11/2007 | Iyer et al. |
| 7,297,641 B2 | 11/2007 | Todd et al. |
| 7,298,009 B2 | 11/2007 | Yan et al. |
| D557,226 S | 12/2007 | Uchino et al. |
| 7,307,178 B2 | 12/2007 | Kiyomori et al. |
| 7,312,148 B2 | 12/2007 | Ramaswamy et al. |
| 7,312,162 B2 | 12/2007 | Ramaswamy et al. |
| 7,312,494 B2 | 12/2007 | Ahn et al. |
| 7,323,401 B2 | 1/2008 | Ramaswamy et al. |
| 7,326,657 B2 | 2/2008 | Xia et al. |
| 7,327,948 B1 | 2/2008 | Shrinivasan et al. |
| 7,329,947 B2 | 2/2008 | Adachi et al. |
| 7,335,611 B2 | 2/2008 | Ramaswamy et al. |
| 7,354,847 B2 | 4/2008 | Chan et al. |
| 7,357,138 B2 | 4/2008 | Ji et al. |
| 7,381,644 B1 | 6/2008 | Subramonium et al. |
| 7,393,418 B2 | 7/2008 | Yokogawa |
| 7,393,736 B2 | 7/2008 | Ahn et al. |
| 7,393,765 B2 | 7/2008 | Hanawa et al. |
| 7,396,491 B2 | 7/2008 | Marking et al. |
| 7,399,388 B2 | 7/2008 | Moghadam et al. |
| 7,402,534 B2 | 7/2008 | Mahajani |
| 7,405,166 B2 | 7/2008 | Liang et al. |
| 7,405,454 B2 | 7/2008 | Ahn et al. |
| D575,713 S | 8/2008 | Ratcliffe |
| 7,411,352 B2 | 8/2008 | Madocks |
| 7,414,281 B1 | 8/2008 | Fastow |
| 7,416,989 B1 | 8/2008 | Liu et al. |
| 7,422,653 B2 | 9/2008 | Blahnik et al. |
| 7,422,775 B2 | 9/2008 | Ramaswamy et al. |
| 7,429,532 B2 | 9/2008 | Ramaswamy et al. |
| 7,431,966 B2 | 10/2008 | Derderian et al. |
| 7,437,060 B2 | 10/2008 | Wang et al. |
| 7,442,275 B2 | 10/2008 | Cowans |
| 7,476,291 B2 | 1/2009 | Wang et al. |
| 7,479,198 B2 | 1/2009 | Guffrey |
| D585,968 S | 2/2009 | Elkins et al. |
| 7,489,389 B2 | 2/2009 | Shibazaki et al. |
| 7,494,882 B2 | 2/2009 | Vitale |
| 7,498,242 B2 | 3/2009 | Kumar et al. |
| 7,501,292 B2 | 3/2009 | Matsushita et al. |
| 7,503,980 B2 | 3/2009 | Kida et al. |
| D590,933 S | 4/2009 | Vansell |
| 7,514,375 B1 | 4/2009 | Shanker et al. |
| D593,969 S | 6/2009 | Li |
| 7,541,297 B2 | 6/2009 | Mallick et al. |
| 7,547,363 B2 | 6/2009 | Tomiyasu et al. |
| 7,550,396 B2 | 6/2009 | Frohberg et al. |
| 7,566,891 B2 | 7/2009 | Rocha-Alvarez et al. |
| 7,575,968 B2 | 8/2009 | Sadaka et al. |
| 7,579,785 B2 | 8/2009 | Shinmen et al. |
| 7,582,555 B1 | 9/2009 | Lang |
| 7,589,003 B2 | 9/2009 | Kouvetakis et al. |
| 7,589,029 B2 | 9/2009 | Derderian et al. |
| D602,575 S | 10/2009 | Breda |
| 7,598,513 B2 | 10/2009 | Kouvetakis et al. |
| 7,601,223 B2 | 10/2009 | Lindfors et al. |
| 7,601,225 B2 | 10/2009 | Tuominen et al. |
| 7,611,751 B2 | 11/2009 | Elers |
| 7,611,980 B2 | 11/2009 | Wells et al. |
| 7,618,226 B2 | 11/2009 | Takizawa |
| D606,952 S | 12/2009 | Lee |
| 7,629,277 B2 | 12/2009 | Ghatnagar et al. |
| 7,632,549 B2 | 12/2009 | Goundar |
| 7,640,142 B2 | 12/2009 | Tachikawa et al. |
| 7,651,583 B2 | 1/2010 | Kent et al. |
| 7,651,961 B2 | 1/2010 | Clark |
| D609,652 S | 2/2010 | Nagasaka |
| D609,655 S | 2/2010 | Sugimoto |
| 7,678,197 B2 | 3/2010 | Maki |
| 7,678,715 B2 | 3/2010 | Mungekar et al. |
| 7,682,657 B2 | 3/2010 | Sherman |
| D613,829 S | 4/2010 | Griffin et al. |
| D614,153 S | 4/2010 | Fondurulia et al. |
| D614,267 S | 4/2010 | Breda |
| D614,268 S | 4/2010 | Breda |
| D614,593 S | 4/2010 | Lee |
| 7,690,881 B2 | 4/2010 | Yamagishi |
| 7,691,205 B2 | 4/2010 | Ikedo |
| 7,713,874 B2 | 5/2010 | Milligan |
| 7,720,560 B2 | 5/2010 | Menser et al. |
| 7,723,648 B2 | 5/2010 | Tsukamoto et al. |
| 7,727,864 B2 | 6/2010 | Elers |
| 7,732,343 B2 | 6/2010 | Niroomand et al. |
| 7,740,705 B2 | 6/2010 | Li |
| 7,745,346 B2 | 6/2010 | Hausmann et al. |
| 7,748,760 B2 | 7/2010 | Kushida |
| 7,754,621 B2 | 7/2010 | Putkonen |
| 7,763,869 B2 | 7/2010 | Matsushita et al. |
| 7,767,262 B2 | 8/2010 | Clark |
| 7,771,796 B2 | 8/2010 | Kohno et al. |
| 7,780,440 B2 | 8/2010 | Shibagaki et al. |
| 7,789,965 B2 | 9/2010 | Matsushita et al. |
| 7,790,633 B1 | 9/2010 | Tarafdar et al. |
| 7,803,722 B2 | 9/2010 | Liang |
| 7,807,578 B2 | 10/2010 | Bencher et al. |
| 7,816,278 B2 | 10/2010 | Reid et al. |
| 7,824,492 B2 | 11/2010 | Tois et al. |
| 7,825,040 B1 | 11/2010 | Fukazawa et al. |
| 7,833,353 B2 | 11/2010 | Furukawahara et al. |
| 7,838,084 B2 | 11/2010 | Derderian et al. |
| 7,842,518 B2 | 11/2010 | Miyajima |
| 7,842,622 B1 | 11/2010 | Lee et al. |
| D629,874 S | 12/2010 | Hermans |
| 7,851,019 B2 | 12/2010 | Tuominen et al. |
| 7,851,232 B2 | 12/2010 | van Schravendijk et al. |
| 7,865,070 B2 | 1/2011 | Nakamura |
| 7,884,918 B2 | 2/2011 | Hattori |
| 7,888,233 B1 | 2/2011 | Gauri |
| D634,719 S | 3/2011 | Yasuda et al. |
| 7,897,215 B1 | 3/2011 | Fair et al. |
| 7,902,582 B2 | 3/2011 | Forbes et al. |
| 7,910,288 B2 | 3/2011 | Abatchev et al. |
| 7,915,139 B1 | 3/2011 | Lang |
| 7,919,416 B2 | 4/2011 | Lee et al. |
| 7,925,378 B2 | 4/2011 | Gilchrist et al. |

(56) References Cited

U.S. PATENT DOCUMENTS

| | | |
|---|---|---|
| 7,935,940 B1 | 5/2011 | Smargiassi |
| 7,939,447 B2 | 5/2011 | Bauer et al. |
| 7,955,516 B2 | 6/2011 | Chandrachood et al. |
| 7,963,736 B2 | 6/2011 | Takizawa et al. |
| 7,972,980 B2 | 7/2011 | Lee et al. |
| 7,981,751 B2 | 7/2011 | Zhu et al. |
| D643,055 S | 8/2011 | Takahashi |
| 7,992,318 B2 | 8/2011 | Kawaji |
| 7,994,721 B2 | 8/2011 | Espiau et al. |
| 7,998,875 B2 | 8/2011 | DeYoung |
| 8,003,174 B2 | 8/2011 | Fukazawa |
| 8,004,198 B2 | 8/2011 | Bakre et al. |
| 8,020,315 B2 | 9/2011 | Nishimura |
| 8,030,129 B2 | 10/2011 | Jeong |
| 8,038,835 B2 | 10/2011 | Hayashi et al. |
| 8,041,197 B2 | 10/2011 | Kasai et al. |
| 8,041,450 B2 | 10/2011 | Takizawa et al. |
| 8,043,972 B1 | 10/2011 | Liu et al. |
| 8,055,378 B2 | 11/2011 | Numakura |
| 8,060,252 B2 | 11/2011 | Gage et al. |
| 8,071,451 B2 | 12/2011 | Berry |
| 8,071,452 B2 | 12/2011 | Raisanen |
| 8,072,578 B2 | 12/2011 | Yasuda et al. |
| 8,076,230 B2 | 12/2011 | Wei |
| 8,076,237 B2 | 12/2011 | Uzoh |
| 8,082,946 B2 | 12/2011 | Laverdiere et al. |
| D652,896 S | 1/2012 | Grether |
| 8,092,604 B2 | 1/2012 | Tomiyasu et al. |
| D653,734 S | 2/2012 | Sisk |
| D654,884 S | 2/2012 | Honma |
| D655,055 S | 2/2012 | Toll |
| 8,119,466 B2 | 2/2012 | Avouris et al. |
| 8,137,462 B2 | 3/2012 | Fondurulia et al. |
| 8,137,465 B1 | 3/2012 | Shrinivasan et al. |
| 8,138,676 B2 | 3/2012 | Mills |
| 8,142,862 B2 | 3/2012 | Lee et al. |
| 8,143,174 B2 | 3/2012 | Xia et al. |
| 8,147,242 B2 | 4/2012 | Shibagaki et al. |
| 8,173,554 B2 | 5/2012 | Lee et al. |
| 8,187,951 B1 | 5/2012 | Wang et al. |
| 8,192,901 B2 | 6/2012 | Kageyama |
| 8,196,234 B2 | 6/2012 | Glunk |
| 8,197,915 B2 | 6/2012 | Oka et al. |
| 8,216,380 B2 | 7/2012 | White et al. |
| 8,231,799 B2 | 7/2012 | Bera et al. |
| D665,055 S | 8/2012 | Yanagisawa et al. |
| 8,241,991 B2 | 8/2012 | Hsieh et al. |
| 8,242,031 B2 | 8/2012 | Mallick et al. |
| 8,252,114 B2 | 8/2012 | Vukovic |
| 8,252,659 B2 | 8/2012 | Huyghebaert et al. |
| 8,252,691 B2 | 8/2012 | Beynet et al. |
| 8,272,516 B2 | 9/2012 | Salvador et al. |
| 8,278,176 B2 | 10/2012 | Bauer et al. |
| 8,282,769 B2 | 10/2012 | Iizuka |
| 8,287,648 B2 | 10/2012 | Reed et al. |
| 8,293,016 B2 | 10/2012 | Bahng et al. |
| 8,298,951 B1 | 10/2012 | Nakano |
| 8,307,472 B1 | 11/2012 | Saxon et al. |
| 8,309,173 B2 | 11/2012 | Tuominen et al. |
| 8,323,413 B2 | 12/2012 | Son |
| 8,329,599 B2 | 12/2012 | Fukazawa et al. |
| 8,334,219 B2 | 12/2012 | Lee et al. |
| D676,943 S | 2/2013 | Kluss |
| 8,367,528 B2 | 2/2013 | Bauer et al. |
| 8,372,204 B2 | 2/2013 | Nakamura et al. |
| 8,393,091 B2 | 3/2013 | Kawamoto |
| 8,394,466 B2 | 3/2013 | Hong et al. |
| 8,415,259 B2 | 4/2013 | Lee et al. |
| 8,440,259 B2 | 5/2013 | Chiang et al. |
| 8,444,120 B2 | 5/2013 | Gregg et al. |
| 8,445,075 B2 | 5/2013 | Xu et al. |
| 8,465,811 B2 | 6/2013 | Ueda |
| 8,466,411 B2 | 6/2013 | Arai |
| 8,470,187 B2 | 6/2013 | Ha |
| 8,484,846 B2 | 7/2013 | Dhindsa |
| 8,492,170 B2 | 7/2013 | Xie et al. |
| 8,496,756 B2 | 7/2013 | Cruse et al. |
| 8,506,713 B2 | 8/2013 | Takagi |
| 8,535,767 B1 | 9/2013 | Kimura |
| D691,974 S | 10/2013 | Osada |
| 8,551,892 B2 | 10/2013 | Nakano |
| 8,563,443 B2 | 10/2013 | Fukazawa |
| 8,569,184 B2 | 10/2013 | Oka |
| 8,591,659 B1 | 11/2013 | Fang et al. |
| 8,592,005 B2 | 11/2013 | Ueda |
| 8,608,885 B2 | 12/2013 | Goto et al. |
| 8,617,411 B2 | 12/2013 | Singh |
| 8,633,115 B2 | 1/2014 | Chang et al. |
| 8,647,722 B2 | 2/2014 | Kobayashi et al. |
| 8,664,627 B1 | 3/2014 | Ishikawa et al. |
| 8,667,654 B2 | 3/2014 | Gros-Jean |
| 8,668,957 B2 | 3/2014 | Dussarrat et al. |
| 8,669,185 B2 | 3/2014 | Onizawa |
| 8,683,943 B2 | 4/2014 | Onodera et al. |
| 8,711,338 B2 | 4/2014 | Liu et al. |
| D705,745 S | 5/2014 | Kurs et al. |
| 8,720,965 B2 | 5/2014 | Hino et al. |
| 8,722,546 B2 | 5/2014 | Fukazawa et al. |
| 8,726,837 B2 | 5/2014 | Patalay et al. |
| 8,728,832 B2 | 5/2014 | Raisanen et al. |
| 8,742,668 B2 | 6/2014 | Nakano et al. |
| 8,764,085 B2 | 7/2014 | Urabe |
| 8,784,950 B2 | 7/2014 | Fukazawa et al. |
| 8,784,951 B2 | 7/2014 | Fukazawa et al. |
| 8,785,215 B2 | 7/2014 | Kobayashi et al. |
| 8,790,749 B2 | 7/2014 | Skutchanova et al. |
| 8,802,201 B2 | 8/2014 | Raisanen et al. |
| 8,820,809 B2 | 9/2014 | Ando et al. |
| 8,821,640 B2 | 9/2014 | Cleary et al. |
| 8,841,182 B1 | 9/2014 | Chen et al. |
| 8,845,806 B2 | 9/2014 | Aida et al. |
| D715,410 S | 10/2014 | Lohmann |
| 8,864,202 B1 | 10/2014 | Schrameyer |
| D716,742 S | 11/2014 | Jang et al. |
| 8,877,655 B2 | 11/2014 | Shero et al. |
| 8,883,270 B2 | 11/2014 | Shero et al. |
| 8,901,016 B2 | 12/2014 | Ha et al. |
| 8,911,826 B2 | 12/2014 | Adachi et al. |
| 8,912,101 B2 | 12/2014 | Tsuji et al. |
| D720,838 S | 1/2015 | Yamagishi et al. |
| 8,933,375 B2 | 1/2015 | Dunn et al. |
| 8,940,646 B1 | 1/2015 | Chandrasekharan |
| D723,153 S | 2/2015 | Borkholder |
| 8,946,830 B2 | 2/2015 | Jung et al. |
| 8,956,983 B2 | 2/2015 | Swaminathan |
| D724,553 S | 3/2015 | Choi |
| D724,701 S | 3/2015 | Yamagishi et al. |
| D725,168 S | 3/2015 | Yamagishi |
| 8,967,608 B2 | 3/2015 | Mitsumori et al. |
| 8,986,456 B2 | 3/2015 | Fondurulia et al. |
| 8,991,887 B2 | 3/2015 | Shin et al. |
| 8,993,054 B2 | 3/2015 | Jung et al. |
| D726,365 S | 4/2015 | Weigensberg |
| D726,884 S | 4/2015 | Yamagishi et al. |
| 9,005,539 B2 | 4/2015 | Halpin et al. |
| 9,017,481 B1 | 4/2015 | Pettinger et al. |
| 9,018,093 B2 | 4/2015 | Tsuji et al. |
| 9,018,111 B2 | 4/2015 | Milligan et al. |
| 9,021,985 B2 | 5/2015 | Alokozai et al. |
| 9,023,737 B2 | 5/2015 | Beynet et al. |
| 9,029,253 B2 | 5/2015 | Milligan et al. |
| 9,029,272 B1 | 5/2015 | Nakano et al. |
| D732,145 S | 6/2015 | Yamagishi |
| D732,644 S | 6/2015 | Yamagishi et al. |
| D733,261 S | 6/2015 | Yamagishi et al. |
| D733,843 S | 7/2015 | Yamagishi et al. |
| D734,377 S | 7/2015 | Hirakida |
| D735,836 S | 8/2015 | Yamagishi |
| 9,096,931 B2 | 8/2015 | Yednak et al. |
| 9,117,657 B2 | 8/2015 | Nakano et al. |
| 9,117,866 B2 | 8/2015 | Marquardt et al. |
| D739,222 S | 9/2015 | Chadbourne |
| 9,123,510 B2 | 9/2015 | Nakano et al. |
| 9,136,108 B2 | 9/2015 | Matsushita et al. |

(56) References Cited

U.S. PATENT DOCUMENTS

| | | | |
|---|---|---|---|
| 9,142,393 B2 | 9/2015 | Okabe et al. | |
| 9,169,975 B2 | 10/2015 | Sarin et al. | |
| 9,171,714 B2 | 10/2015 | Mori | |
| 9,171,716 B2 | 10/2015 | Fukuda | |
| D743,513 S | 11/2015 | Yamagishi | |
| 9,177,784 B2 | 11/2015 | Raisanen et al. | |
| 9,190,263 B2 | 11/2015 | Ishikawa et al. | |
| 9,196,483 B1 | 11/2015 | Lee et al. | |
| 9,202,727 B2 | 12/2015 | Dunn et al. | |
| 9,228,259 B2 | 1/2016 | Haukka et al. | |
| 9,240,412 B2 | 1/2016 | Xie et al. | |
| 9,455,138 B1 * | 9/2016 | Fukazawa | H01L 21/0228 |
| 2001/0017103 A1 | 8/2001 | Takeshita et al. | |
| 2001/0018267 A1 | 8/2001 | Shinriki et al. | |
| 2001/0019777 A1 | 9/2001 | Tanaka et al. | |
| 2001/0019900 A1 | 9/2001 | Hasegawa | |
| 2001/0028924 A1 | 10/2001 | Sherman | |
| 2001/0046765 A1 | 11/2001 | Cappellani et al. | |
| 2001/0049202 A1 | 12/2001 | Maeda et al. | |
| 2002/0001974 A1 | 1/2002 | Chan | |
| 2002/0011210 A1 | 1/2002 | Satoh et al. | |
| 2002/0014204 A1 | 2/2002 | Pyo | |
| 2002/0064592 A1 | 5/2002 | Datta et al. | |
| 2002/0076507 A1 | 6/2002 | Chiang et al. | |
| 2002/0079714 A1 | 6/2002 | Soucy et al. | |
| 2002/0088542 A1 | 7/2002 | Nishikawa et al. | |
| 2002/0098627 A1 | 7/2002 | Pomarede et al. | |
| 2002/0108670 A1 | 8/2002 | Baker et al. | |
| 2002/0110991 A1 | 8/2002 | Li | |
| 2002/0114886 A1 | 8/2002 | Chou et al. | |
| 2002/0115252 A1 | 8/2002 | Haukka et al. | |
| 2002/0172768 A1 | 11/2002 | Endo et al. | |
| 2002/0187650 A1 | 12/2002 | Blalock et al. | |
| 2002/0197849 A1 | 12/2002 | Mandal | |
| 2003/0003635 A1 | 1/2003 | Paranjpe et al. | |
| 2003/0010452 A1 | 1/2003 | Park et al. | |
| 2003/0012632 A1 | 1/2003 | Saeki | |
| 2003/0019428 A1 | 1/2003 | Ku et al. | |
| 2003/0019580 A1 | 1/2003 | Strang | |
| 2003/0025146 A1 | 2/2003 | Narwankar et al. | |
| 2003/0040158 A1 | 2/2003 | Saitoh | |
| 2003/0042419 A1 | 3/2003 | Katsumata et al. | |
| 2003/0049375 A1 | 3/2003 | Nguyen et al. | |
| 2003/0054670 A1 | 3/2003 | Wang et al. | |
| 2003/0059535 A1 | 3/2003 | Luo et al. | |
| 2003/0059980 A1 | 3/2003 | Chen et al. | |
| 2003/0066826 A1 | 4/2003 | Lee et al. | |
| 2003/0075925 A1 | 4/2003 | Lindfors et al. | |
| 2003/0082307 A1 | 5/2003 | Chung et al. | |
| 2003/0091938 A1 | 5/2003 | Fairbairn et al. | |
| 2003/0094133 A1 | 5/2003 | Yoshidome et al. | |
| 2003/0111963 A1 | 6/2003 | Tolmachev et al. | |
| 2003/0134038 A1 | 7/2003 | Paranjpe | |
| 2003/0141820 A1 | 7/2003 | White et al. | |
| 2003/0157436 A1 | 8/2003 | Manger et al. | |
| 2003/0168001 A1 | 9/2003 | Sneh | |
| 2003/0170583 A1 | 9/2003 | Nakashima et al. | |
| 2003/0180458 A1 | 9/2003 | Sneh | |
| 2003/0183156 A1 | 10/2003 | Dando et al. | |
| 2003/0192875 A1 | 10/2003 | Bieker et al. | |
| 2003/0198587 A1 | 10/2003 | Kaloyeros et al. | |
| 2003/0209323 A1 | 11/2003 | Yokogaki | |
| 2003/0228772 A1 | 12/2003 | Cowans | |
| 2003/0232138 A1 | 12/2003 | Tuominen et al. | |
| 2004/0009679 A1 | 1/2004 | Yeo et al. | |
| 2004/0013577 A1 | 1/2004 | Ganguli et al. | |
| 2004/0013818 A1 | 1/2004 | Moon et al. | |
| 2004/0016637 A1 | 1/2004 | Yang | |
| 2004/0018307 A1 | 1/2004 | Park et al. | |
| 2004/0018750 A1 | 1/2004 | Sophie et al. | |
| 2004/0023516 A1 | 2/2004 | Londergan et al. | |
| 2004/0029052 A1 | 2/2004 | Park et al. | |
| 2004/0036129 A1 | 2/2004 | Forbes et al. | |
| 2004/0063289 A1 | 4/2004 | Ohta | |
| 2004/0071897 A1 | 4/2004 | Verplancken et al. | |
| 2004/0077182 A1 | 4/2004 | Lim et al. | |
| 2004/0079960 A1 | 4/2004 | Shakuda | |
| 2004/0080697 A1 | 4/2004 | Song | |
| 2004/0082171 A1 | 4/2004 | Shin et al. | |
| 2004/0101622 A1 | 5/2004 | Park et al. | |
| 2004/0103914 A1 | 6/2004 | Cheng et al. | |
| 2004/0106249 A1 | 6/2004 | Huotari | |
| 2004/0124549 A1 | 7/2004 | Curran | |
| 2004/0134429 A1 | 7/2004 | Yamanaka | |
| 2004/0144980 A1 | 7/2004 | Ahn et al. | |
| 2004/0146644 A1 | 7/2004 | Xiao et al. | |
| 2004/0168627 A1 | 9/2004 | Conley et al. | |
| 2004/0169032 A1 | 9/2004 | Murayama et al. | |
| 2004/0198069 A1 | 10/2004 | Metzner et al. | |
| 2004/0200499 A1 | 10/2004 | Harvey et al. | |
| 2004/0209477 A1 | 10/2004 | Buxbaum et al. | |
| 2004/0212947 A1 | 10/2004 | Nguyen | |
| 2004/0213921 A1 * | 10/2004 | Leu | C23C 16/401 427/569 |
| 2004/0214445 A1 | 10/2004 | Shimizu et al. | |
| 2004/0219793 A1 | 11/2004 | Hishiya et al. | |
| 2004/0221807 A1 | 11/2004 | Verghese et al. | |
| 2004/0247779 A1 | 12/2004 | Selvamanickam et al. | |
| 2004/0261712 A1 | 12/2004 | Hayashi et al. | |
| 2004/0266011 A1 | 12/2004 | Lee et al. | |
| 2005/0003662 A1 | 1/2005 | Jursich et al. | |
| 2005/0008799 A1 | 1/2005 | Tomiyasu et al. | |
| 2005/0019026 A1 | 1/2005 | Wang et al. | |
| 2005/0020071 A1 | 1/2005 | Sonobe et al. | |
| 2005/0023624 A1 | 2/2005 | Ahn et al. | |
| 2005/0034674 A1 | 2/2005 | Ono | |
| 2005/0037154 A1 | 2/2005 | Koh et al. | |
| 2005/0051093 A1 | 3/2005 | Makino et al. | |
| 2005/0054228 A1 | 3/2005 | March | |
| 2005/0059262 A1 | 3/2005 | Yin et al. | |
| 2005/0064207 A1 | 3/2005 | Senzaki et al. | |
| 2005/0064719 A1 | 3/2005 | Liu et al. | |
| 2005/0066893 A1 | 3/2005 | Soininen | |
| 2005/0069651 A1 | 3/2005 | Miyoshi et al. | |
| 2005/0070123 A1 | 3/2005 | Hirano | |
| 2005/0070729 A1 | 3/2005 | Kiyomori et al. | |
| 2005/0072357 A1 | 4/2005 | Shero et al. | |
| 2005/0074983 A1 | 4/2005 | Shinriki et al. | |
| 2005/0092249 A1 | 5/2005 | Kilpela et al. | |
| 2005/0095770 A1 | 5/2005 | Kumagai et al. | |
| 2005/0100669 A1 | 5/2005 | Kools et al. | |
| 2005/0101154 A1 | 5/2005 | Huang | |
| 2005/0106893 A1 | 5/2005 | Wilk | |
| 2005/0110069 A1 | 5/2005 | Kil et al. | |
| 2005/0120962 A1 | 6/2005 | Ushioda et al. | |
| 2005/0123690 A1 | 6/2005 | Derderian et al. | |
| 2005/0133161 A1 | 6/2005 | Carpenter et al. | |
| 2005/0142361 A1 | 6/2005 | Nakanishi | |
| 2005/0145338 A1 | 7/2005 | Park et al. | |
| 2005/0153571 A1 | 7/2005 | Senzaki | |
| 2005/0173003 A1 | 8/2005 | Laverdiere et al. | |
| 2005/0181535 A1 | 8/2005 | Yun et al. | |
| 2005/0187647 A1 | 8/2005 | Wang et al. | |
| 2005/0191828 A1 | 9/2005 | Al-Bayati et al. | |
| 2005/0199013 A1 | 9/2005 | Vandroux et al. | |
| 2005/0208718 A1 | 9/2005 | Lim et al. | |
| 2005/0212119 A1 | 9/2005 | Shero | |
| 2005/0214457 A1 | 9/2005 | Schmitt et al. | |
| 2005/0214458 A1 | 9/2005 | Meiere | |
| 2005/0218462 A1 | 10/2005 | Ahn et al. | |
| 2005/0221618 A1 | 10/2005 | AmRhein et al. | |
| 2005/0223994 A1 | 10/2005 | Blomiley et al. | |
| 2005/0227502 A1 | 10/2005 | Schmitt et al. | |
| 2005/0229848 A1 | 10/2005 | Shinriki | |
| 2005/0229972 A1 | 10/2005 | Hoshi et al. | |
| 2005/0241176 A1 | 11/2005 | Shero et al. | |
| 2005/0241763 A1 | 11/2005 | Huang et al. | |
| 2005/0255257 A1 | 11/2005 | Choi et al. | |
| 2005/0258280 A1 | 11/2005 | Goto et al. | |
| 2005/0260347 A1 | 11/2005 | Narwankar et al. | |
| 2005/0260850 A1 | 11/2005 | Loke | |
| 2005/0263075 A1 | 12/2005 | Wang et al. | |
| 2005/0263932 A1 | 12/2005 | Heugel | |
| 2005/0271813 A1 | 12/2005 | Kher et al. | |

(56) References Cited

U.S. PATENT DOCUMENTS

| | | |
|---|---|---|
| 2005/0274323 A1 | 12/2005 | Seidel et al. |
| 2005/0282101 A1 | 12/2005 | Adachi |
| 2005/0287725 A1 | 12/2005 | Kitagawa |
| 2005/0287771 A1 | 12/2005 | Seamons et al. |
| 2006/0013946 A1 | 1/2006 | Park et al. |
| 2006/0014384 A1 | 1/2006 | Lee et al. |
| 2006/0014397 A1 | 1/2006 | Seamons et al. |
| 2006/0016783 A1 | 1/2006 | Wu et al. |
| 2006/0019033 A1 | 1/2006 | Muthukrishnan et al. |
| 2006/0019502 A1 | 1/2006 | Park et al. |
| 2006/0021703 A1 | 2/2006 | Umotoy et al. |
| 2006/0024439 A2 | 2/2006 | Tuominen et al. |
| 2006/0046518 A1 | 3/2006 | Hill et al. |
| 2006/0051520 A1 | 3/2006 | Behle et al. |
| 2006/0051925 A1 | 3/2006 | Ahn et al. |
| 2006/0060930 A1 | 3/2006 | Metz et al. |
| 2006/0062910 A1 | 3/2006 | Meiere |
| 2006/0063346 A1 | 3/2006 | Lee et al. |
| 2006/0068121 A1 | 3/2006 | Lee et al. |
| 2006/0068125 A1 | 3/2006 | Radhakrishnan |
| 2006/0105566 A1 | 5/2006 | Waldfried et al. |
| 2006/0110934 A1 | 5/2006 | Fukuchi |
| 2006/0113675 A1 | 6/2006 | Chang et al. |
| 2006/0113806 A1 | 6/2006 | Tsuji et al. |
| 2006/0128168 A1 | 6/2006 | Ahn et al. |
| 2006/0130767 A1 | 6/2006 | Herchen |
| 2006/0137609 A1 | 6/2006 | Puchacz et al. |
| 2006/0147626 A1 | 7/2006 | Blomberg |
| 2006/0148180 A1 | 7/2006 | Ahn et al. |
| 2006/0163612 A1 | 7/2006 | Kouvetakis et al. |
| 2006/0172531 A1 | 8/2006 | Lin et al. |
| 2006/0191555 A1 | 8/2006 | Yoshida et al. |
| 2006/0193979 A1 | 8/2006 | Meiere et al. |
| 2006/0199357 A1 | 9/2006 | Wan et al. |
| 2006/0205223 A1 | 9/2006 | Smayling |
| 2006/0208215 A1 | 9/2006 | Metzner et al. |
| 2006/0213439 A1 | 9/2006 | Ishizaka |
| 2006/0223301 A1 | 10/2006 | Vanhaelemeersch et al. |
| 2006/0226117 A1 | 10/2006 | Bertram et al. |
| 2006/0228888 A1 | 10/2006 | Lee et al. |
| 2006/0236934 A1 | 10/2006 | Choi et al. |
| 2006/0240574 A1 | 10/2006 | Yoshie |
| 2006/0240662 A1 | 10/2006 | Conley et al. |
| 2006/0251827 A1 | 11/2006 | Nowak et al. |
| 2006/0257563 A1 | 11/2006 | Doh et al. |
| 2006/0257584 A1 | 11/2006 | Derderian et al. |
| 2006/0258078 A1 | 11/2006 | Lee et al. |
| 2006/0258173 A1 | 11/2006 | Xiao et al. |
| 2006/0260545 A1 | 11/2006 | Ramaswamy et al. |
| 2006/0264060 A1 | 11/2006 | Ramaswamy et al. |
| 2006/0264066 A1 | 11/2006 | Bartholomew et al. |
| 2006/0266289 A1 | 11/2006 | Verghese et al. |
| 2006/0269692 A1 | 11/2006 | Balseanu |
| 2006/0278524 A1 | 12/2006 | Stowell |
| 2007/0006806 A1 | 1/2007 | Imai |
| 2007/0010072 A1 | 1/2007 | Bailey et al. |
| 2007/0020953 A1 | 1/2007 | Tsai et al. |
| 2007/0022954 A1 | 2/2007 | Iizuka et al. |
| 2007/0028842 A1 | 2/2007 | Inagawa et al. |
| 2007/0031598 A1 | 2/2007 | Okuyama et al. |
| 2007/0031599 A1 | 2/2007 | Gschwandtner et al. |
| 2007/0032082 A1 | 2/2007 | Ramaswamy et al. |
| 2007/0037412 A1 | 2/2007 | Dip et al. |
| 2007/0042117 A1 | 2/2007 | Kuppurao et al. |
| 2007/0049053 A1 | 3/2007 | Mahajani |
| 2007/0054499 A1 | 3/2007 | Jang |
| 2007/0059948 A1 | 3/2007 | Metzner et al. |
| 2007/0062453 A1 | 3/2007 | Ishikawa |
| 2007/0065578 A1 | 3/2007 | McDougall |
| 2007/0066010 A1 | 3/2007 | Ando |
| 2007/0066079 A1 | 3/2007 | Kloster et al. |
| 2007/0077355 A1 | 4/2007 | Chacin et al. |
| 2007/0082132 A1 | 4/2007 | Shinriki |
| 2007/0084405 A1 | 4/2007 | Kim |
| 2007/0096194 A1 | 5/2007 | Streck et al. |
| 2007/0098527 A1 | 5/2007 | Hall et al. |
| 2007/0107845 A1 | 5/2007 | Ishizawa et al. |
| 2007/0111545 A1 | 5/2007 | Lee et al. |
| 2007/0116873 A1 | 5/2007 | Li et al. |
| 2007/0123037 A1 | 5/2007 | Lee et al. |
| 2007/0125762 A1 | 6/2007 | Cui et al. |
| 2007/0128538 A1 | 6/2007 | Fairbairn et al. |
| 2007/0134942 A1 | 6/2007 | Ahn et al. |
| 2007/0146621 A1 | 6/2007 | Yeom |
| 2007/0148990 A1 | 6/2007 | Deboer et al. |
| 2007/0155138 A1 | 7/2007 | Tomasini et al. |
| 2007/0158026 A1 | 7/2007 | Amikura |
| 2007/0163440 A1 | 7/2007 | Kim et al. |
| 2007/0166457 A1 | 7/2007 | Yamoto et al. |
| 2007/0166966 A1 | 7/2007 | Todd et al. |
| 2007/0166999 A1 | 7/2007 | Vaartstra |
| 2007/0173071 A1 | 7/2007 | Afzali-Ardakani et al. |
| 2007/0175393 A1 | 8/2007 | Nishimura et al. |
| 2007/0175397 A1 | 8/2007 | Tomiyasu et al. |
| 2007/0186952 A1 | 8/2007 | Honda et al. |
| 2007/0207275 A1 | 9/2007 | Nowak et al. |
| 2007/0209590 A1 | 9/2007 | Li |
| 2007/0210890 A1 | 9/2007 | Hsu et al. |
| 2007/0215048 A1 | 9/2007 | Suzuki et al. |
| 2007/0218200 A1 | 9/2007 | Suzuki et al. |
| 2007/0218705 A1 | 9/2007 | Matsuki et al. |
| 2007/0224777 A1 | 9/2007 | Hamelin |
| 2007/0224833 A1 | 9/2007 | Morisada et al. |
| 2007/0232031 A1 | 10/2007 | Singh et al. |
| 2007/0232071 A1 | 10/2007 | Balseanu et al. |
| 2007/0232501 A1 | 10/2007 | Tonomura |
| 2007/0234955 A1 | 10/2007 | Suzuki et al. |
| 2007/0237697 A1 | 10/2007 | Clark |
| 2007/0241688 A1 | 10/2007 | DeVincentis et al. |
| 2007/0248767 A1 | 10/2007 | Okura |
| 2007/0249131 A1 | 10/2007 | Allen et al. |
| 2007/0251444 A1 | 11/2007 | Gros-Jean et al. |
| 2007/0252244 A1 | 11/2007 | Srividya et al. |
| 2007/0252532 A1 | 11/2007 | DeVincentis et al. |
| 2007/0264807 A1 | 11/2007 | Leone et al. |
| 2007/0275166 A1 | 11/2007 | Thridandam et al. |
| 2007/0277735 A1 | 12/2007 | Mokhlesi et al. |
| 2007/0281496 A1 | 12/2007 | Ingle et al. |
| 2007/0298362 A1 | 12/2007 | Rocha-Alvarez et al. |
| 2008/0003824 A1 | 1/2008 | Padhi et al. |
| 2008/0003838 A1 | 1/2008 | Haukka et al. |
| 2008/0006208 A1 | 1/2008 | Ueno et al. |
| 2008/0023436 A1* | 1/2008 | Gros-Jean ............ C23C 16/405 216/6 |
| 2008/0026574 A1 | 1/2008 | Brcka |
| 2008/0026597 A1 | 1/2008 | Munro et al. |
| 2008/0029790 A1 | 2/2008 | Ahn et al. |
| 2008/0036354 A1 | 2/2008 | Letz et al. |
| 2008/0038485 A1 | 2/2008 | Fukazawa et al. |
| 2008/0054332 A1 | 3/2008 | Kim et al. |
| 2008/0054813 A1 | 3/2008 | Espiau et al. |
| 2008/0057659 A1 | 3/2008 | Forbes et al. |
| 2008/0061667 A1 | 3/2008 | Gaertner et al. |
| 2008/0066778 A1 | 3/2008 | Matsushita et al. |
| 2008/0069955 A1 | 3/2008 | Hong et al. |
| 2008/0075881 A1 | 3/2008 | Won et al. |
| 2008/0076266 A1 | 3/2008 | Fukazawa et al. |
| 2008/0081104 A1 | 4/2008 | Hasebe et al. |
| 2008/0081113 A1 | 4/2008 | Clark |
| 2008/0081121 A1 | 4/2008 | Morita et al. |
| 2008/0085226 A1 | 4/2008 | Fondurulia et al. |
| 2008/0092815 A1 | 4/2008 | Chen et al. |
| 2008/0113094 A1 | 5/2008 | Casper |
| 2008/0113096 A1 | 5/2008 | Mahajani |
| 2008/0113097 A1 | 5/2008 | Mahajani et al. |
| 2008/0124197 A1 | 5/2008 | van der Meulen et al. |
| 2008/0124908 A1 | 5/2008 | Forbes et al. |
| 2008/0124946 A1 | 5/2008 | Xiao et al. |
| 2008/0133154 A1 | 6/2008 | Krauss et al. |
| 2008/0149031 A1 | 6/2008 | Chu et al. |
| 2008/0152463 A1 | 6/2008 | Chidambaram et al. |
| 2008/0153311 A1 | 6/2008 | Padhi et al. |
| 2008/0173240 A1 | 7/2008 | Furukawahara et al. |
| 2008/0173326 A1 | 7/2008 | Gu et al. |

(56) References Cited

U.S. PATENT DOCUMENTS

| | | |
|---|---|---|
| 2008/0176375 A1 | 7/2008 | Erben et al. |
| 2008/0178805 A1 | 7/2008 | Paterson et al. |
| 2008/0179715 A1 | 7/2008 | Coppa |
| 2008/0182075 A1 | 7/2008 | Chopra |
| 2008/0182390 A1 | 7/2008 | Lemmi et al. |
| 2008/0191193 A1 | 8/2008 | Li et al. |
| 2008/0199977 A1 | 8/2008 | Weigel et al. |
| 2008/0203487 A1 | 8/2008 | Hohage et al. |
| 2008/0211423 A1 | 9/2008 | Shinmen et al. |
| 2008/0211526 A1 | 9/2008 | Shinma |
| 2008/0216077 A1 | 9/2008 | Emani et al. |
| 2008/0220619 A1 | 9/2008 | Matsushita et al. |
| 2008/0224240 A1 | 9/2008 | Ahn et al. |
| 2008/0233288 A1 | 9/2008 | Clark |
| 2008/0237572 A1 | 10/2008 | Chui et al. |
| 2008/0241384 A1 | 10/2008 | Jeong et al. |
| 2008/0242116 A1 | 10/2008 | Clark |
| 2008/0248310 A1 | 10/2008 | Kim et al. |
| 2008/0257494 A1 | 10/2008 | Hayashi et al. |
| 2008/0261413 A1 | 10/2008 | Mahajani |
| 2008/0264337 A1 | 10/2008 | Sano et al. |
| 2008/0267598 A1 | 10/2008 | Nakamura |
| 2008/0277715 A1 | 11/2008 | Ohmi et al. |
| 2008/0282970 A1 | 11/2008 | Heys et al. |
| 2008/0295872 A1 | 12/2008 | Riker et al. |
| 2008/0299326 A1 | 12/2008 | Fukazawa |
| 2008/0302303 A1 | 12/2008 | Choi et al. |
| 2008/0305246 A1 | 12/2008 | Choi et al. |
| 2008/0305443 A1 | 12/2008 | Nakamura |
| 2008/0315292 A1 | 12/2008 | Ji et al. |
| 2008/0317972 A1 | 12/2008 | Hendriks |
| 2009/0000550 A1 | 1/2009 | Tran et al. |
| 2009/0000551 A1 | 1/2009 | Choi et al. |
| 2009/0011608 A1 | 1/2009 | Nabatame |
| 2009/0020072 A1 | 1/2009 | Mizunaga et al. |
| 2009/0023229 A1 | 1/2009 | Matsushita |
| 2009/0029528 A1 | 1/2009 | Sanchez et al. |
| 2009/0029564 A1 | 1/2009 | Yamashita et al. |
| 2009/0033907 A1 | 2/2009 | Watson |
| 2009/0035947 A1 | 2/2009 | Horii |
| 2009/0041952 A1 | 2/2009 | Yoon et al. |
| 2009/0041984 A1 | 2/2009 | Mayers et al. |
| 2009/0045829 A1 | 2/2009 | Awazu |
| 2009/0050621 A1 | 2/2009 | Awazu |
| 2009/0061644 A1 | 3/2009 | Chiang et al. |
| 2009/0061647 A1 | 3/2009 | Mallick et al. |
| 2009/0085156 A1 | 4/2009 | Dewey et al. |
| 2009/0090382 A1 | 4/2009 | Morisada et al. |
| 2009/0093094 A1 | 4/2009 | Ye et al. |
| 2009/0095221 A1 | 4/2009 | Tam et al. |
| 2009/0104789 A1 | 4/2009 | Mallick et al. |
| 2009/0107404 A1 | 4/2009 | Ogliari et al. |
| 2009/0120580 A1 | 5/2009 | Kagoshima et al. |
| 2009/0122293 A1 | 5/2009 | Shibazaki |
| 2009/0136668 A1 | 5/2009 | Gregg et al. |
| 2009/0136683 A1 | 5/2009 | Fukasawa et al. |
| 2009/0139657 A1 | 6/2009 | Lee et al. |
| 2009/0142935 A1 | 6/2009 | Fukuzawa et al. |
| 2009/0146322 A1 | 6/2009 | Weling et al. |
| 2009/0156015 A1 | 6/2009 | Park et al. |
| 2009/0209081 A1 | 8/2009 | Matero |
| 2009/0211523 A1 | 8/2009 | Kuppurao et al. |
| 2009/0211525 A1 | 8/2009 | Sarigiannis et al. |
| 2009/0239386 A1 | 9/2009 | Suzaki et al. |
| 2009/0242957 A1 | 10/2009 | Ma et al. |
| 2009/0246374 A1 | 10/2009 | Vukovic |
| 2009/0246399 A1 | 10/2009 | Goundar |
| 2009/0246971 A1 | 10/2009 | Reid et al. |
| 2009/0250955 A1 | 10/2009 | Aoki |
| 2009/0261331 A1 | 10/2009 | Yang et al. |
| 2009/0269506 A1 | 10/2009 | Okura et al. |
| 2009/0275205 A1 | 11/2009 | Kiehlbauch et al. |
| 2009/0277510 A1 | 11/2009 | Shikata |
| 2009/0283041 A1 | 11/2009 | Tomiyasu et al. |
| 2009/0283217 A1 | 11/2009 | Lubomirsky et al. |
| 2009/0286400 A1 | 11/2009 | Heo et al. |
| 2009/0286402 A1 | 11/2009 | Xia et al. |
| 2009/0289300 A1 | 11/2009 | Sasaki et al. |
| 2009/0304558 A1 | 12/2009 | Patton |
| 2009/0311857 A1 | 12/2009 | Todd et al. |
| 2010/0001409 A1 | 1/2010 | Humbert et al. |
| 2010/0006031 A1 | 1/2010 | Choi et al. |
| 2010/0014479 A1 | 1/2010 | Kim |
| 2010/0015813 A1 | 1/2010 | McGinnis et al. |
| 2010/0024727 A1 | 2/2010 | Kim et al. |
| 2010/0025796 A1 | 2/2010 | Dabiran |
| 2010/0040441 A1 | 2/2010 | Obikane |
| 2010/0041179 A1 | 2/2010 | Lee |
| 2010/0041243 A1 | 2/2010 | Cheng et al. |
| 2010/0055312 A1 | 3/2010 | Kato et al. |
| 2010/0055442 A1 | 3/2010 | Kellock |
| 2010/0075507 A1 | 3/2010 | Chang et al. |
| 2010/0089320 A1 | 4/2010 | Kim |
| 2010/0093187 A1 | 4/2010 | Lee et al. |
| 2010/0102417 A1 | 4/2010 | Ganguli et al. |
| 2010/0116209 A1 | 5/2010 | Kato |
| 2010/0124610 A1 | 5/2010 | Aikawa et al. |
| 2010/0124618 A1 | 5/2010 | Kobayashi et al. |
| 2010/0124621 A1 | 5/2010 | Kobayashi et al. |
| 2010/0126605 A1 | 5/2010 | Stones |
| 2010/0130017 A1 | 5/2010 | Luo et al. |
| 2010/0134023 A1 | 6/2010 | Mills |
| 2010/0136216 A1 | 6/2010 | Tsuei et al. |
| 2010/0140221 A1 | 6/2010 | Kikuchi |
| 2010/0144162 A1 | 6/2010 | Lee et al. |
| 2010/0151206 A1 | 6/2010 | Wu et al. |
| 2010/0159638 A1 | 6/2010 | Jeong et al. |
| 2010/0162752 A1 | 7/2010 | Tabata et al. |
| 2010/0170441 A1 | 7/2010 | Won et al. |
| 2010/0178137 A1 | 7/2010 | Chintalapati et al. |
| 2010/0178423 A1 | 7/2010 | Shimizu et al. |
| 2010/0184302 A1 | 7/2010 | Lee et al. |
| 2010/0193501 A1 | 8/2010 | Zucker et al. |
| 2010/0195392 A1 | 8/2010 | Freeman |
| 2010/0221452 A1 | 9/2010 | Kang |
| 2010/0230051 A1 | 9/2010 | Iizuka |
| 2010/0233886 A1 | 9/2010 | Yang et al. |
| 2010/0243166 A1 | 9/2010 | Hayashi |
| 2010/0244688 A1 | 9/2010 | Braun et al. |
| 2010/0255198 A1 | 10/2010 | Cleary et al. |
| 2010/0255625 A1 | 10/2010 | De Vries |
| 2010/0259152 A1 | 10/2010 | Yasuda et al. |
| 2010/0270675 A1 | 10/2010 | Harada |
| 2010/0275846 A1 | 11/2010 | Kitagawa |
| 2010/0285319 A1 | 11/2010 | Kwak et al. |
| 2010/0294199 A1 | 11/2010 | Tran et al. |
| 2010/0301752 A1 | 12/2010 | Bakre et al. |
| 2010/0304047 A1 | 12/2010 | Yang et al. |
| 2010/0307415 A1 | 12/2010 | Shero et al. |
| 2010/0317198 A1 | 12/2010 | Antonelli |
| 2010/0322604 A1 | 12/2010 | Fondurulia et al. |
| 2011/0000619 A1 | 1/2011 | Suh |
| 2011/0006402 A1 | 1/2011 | Zhou |
| 2011/0006406 A1 | 1/2011 | Urbanowicz et al. |
| 2011/0014795 A1 | 1/2011 | Lee |
| 2011/0027999 A1 | 2/2011 | Sparks et al. |
| 2011/0034039 A1 | 2/2011 | Liang et al. |
| 2011/0048642 A1 | 3/2011 | Mihara et al. |
| 2011/0052833 A1 | 3/2011 | Hanawa et al. |
| 2011/0056513 A1 | 3/2011 | Hombach et al. |
| 2011/0056626 A1 | 3/2011 | Brown et al. |
| 2011/0061810 A1 | 3/2011 | Ganguly et al. |
| 2011/0070380 A1 | 3/2011 | Shero et al. |
| 2011/0081519 A1 | 4/2011 | Dillingh |
| 2011/0086516 A1 | 4/2011 | Lee et al. |
| 2011/0089469 A1 | 4/2011 | Merckling |
| 2011/0097901 A1 | 4/2011 | Banna et al. |
| 2011/0107512 A1 | 5/2011 | Gilbert |
| 2011/0108194 A1 | 5/2011 | Yoshioka et al. |
| 2011/0108741 A1 | 5/2011 | Ingram |
| 2011/0108929 A1 | 5/2011 | Meng |
| 2011/0117490 A1 | 5/2011 | Bae et al. |
| 2011/0117737 A1 | 5/2011 | Agarwala et al. |
| 2011/0124196 A1 | 5/2011 | Lee |

(56) References Cited

U.S. PATENT DOCUMENTS

| | | |
|---|---|---|
| 2011/0139748 A1 | 6/2011 | Donnelly et al. |
| 2011/0143032 A1 | 6/2011 | Vrtis et al. |
| 2011/0143461 A1 | 6/2011 | Fish et al. |
| 2011/0159202 A1 | 6/2011 | Matsushita et al. |
| 2011/0159673 A1 | 6/2011 | Hanawa et al. |
| 2011/0175011 A1 | 7/2011 | Ehrne et al. |
| 2011/0183079 A1 | 7/2011 | Jackson et al. |
| 2011/0183269 A1 | 7/2011 | Zhu |
| 2011/0192820 A1 | 8/2011 | Yeom et al. |
| 2011/0198736 A1 | 8/2011 | Shero et al. |
| 2011/0210468 A1 | 9/2011 | Shannon et al. |
| 2011/0220874 A1 | 9/2011 | Hanrath et al. |
| 2011/0236600 A1 | 9/2011 | Fox et al. |
| 2011/0239936 A1 | 10/2011 | Suzaki et al. |
| 2011/0254052 A1 | 10/2011 | Kouvetakis |
| 2011/0256675 A1 | 10/2011 | Avouris |
| 2011/0256726 A1 | 10/2011 | Lavoie et al. |
| 2011/0256727 A1 | 10/2011 | Beynet et al. |
| 2011/0256734 A1 | 10/2011 | Hausmann et al. |
| 2011/0265549 A1 | 11/2011 | Cruse et al. |
| 2011/0265951 A1 | 11/2011 | Xu et al. |
| 2011/0275166 A1 | 11/2011 | Shero et al. |
| 2011/0281417 A1 | 11/2011 | Gordon et al. |
| 2011/0283933 A1 | 11/2011 | Makarov et al. |
| 2011/0294075 A1 | 12/2011 | Chen et al. |
| 2011/0308460 A1 | 12/2011 | Hong et al. |
| 2012/0003500 A1 | 1/2012 | Yoshida et al. |
| 2012/0006489 A1 | 1/2012 | Okita |
| 2012/0024479 A1 | 2/2012 | Palagashvili et al. |
| 2012/0032311 A1 | 2/2012 | Gates |
| 2012/0043556 A1 | 2/2012 | Dube et al. |
| 2012/0052681 A1 | 3/2012 | Marsh |
| 2012/0070136 A1 | 3/2012 | Koelmel et al. |
| 2012/0070997 A1 | 3/2012 | Larson |
| 2012/0090704 A1 | 4/2012 | Laverdiere et al. |
| 2012/0098107 A1 | 4/2012 | Raisanen et al. |
| 2012/0100464 A1 | 4/2012 | Kageyama |
| 2012/0103264 A1 | 5/2012 | Choi et al. |
| 2012/0103939 A1 | 5/2012 | Wu et al. |
| 2012/0107607 A1 | 5/2012 | Takaki et al. |
| 2012/0114877 A1 | 5/2012 | Lee |
| 2012/0121823 A1 | 5/2012 | Chhabra |
| 2012/0122302 A1 | 5/2012 | Weidman et al. |
| 2012/0128897 A1 | 5/2012 | Xiao et al. |
| 2012/0135145 A1 | 5/2012 | Je et al. |
| 2012/0156108 A1 | 6/2012 | Fondurulia et al. |
| 2012/0160172 A1 | 6/2012 | Wamura et al. |
| 2012/0164327 A1 | 6/2012 | Sato |
| 2012/0164837 A1 | 6/2012 | Tan et al. |
| 2012/0164842 A1 | 6/2012 | Watanabe |
| 2012/0171391 A1 | 7/2012 | Won |
| 2012/0171874 A1 | 7/2012 | Thridandam et al. |
| 2012/0207456 A1 | 8/2012 | Kim et al. |
| 2012/0212121 A1 | 8/2012 | Lin |
| 2012/0214318 A1 | 8/2012 | Fukazawa et al. |
| 2012/0220139 A1 | 8/2012 | Lee et al. |
| 2012/0225561 A1 | 9/2012 | Watanabe |
| 2012/0240858 A1 | 9/2012 | Taniyama et al. |
| 2012/0263876 A1 | 10/2012 | Haukka et al. |
| 2012/0270339 A1 | 10/2012 | Xie et al. |
| 2012/0270393 A1 | 10/2012 | Pore et al. |
| 2012/0289053 A1 | 11/2012 | Holland et al. |
| 2012/0295427 A1 | 11/2012 | Bauer |
| 2012/0304935 A1 | 12/2012 | Oosterlaken et al. |
| 2012/0305196 A1 | 12/2012 | Mori et al. |
| 2012/0315113 A1 | 12/2012 | Hiroki |
| 2012/0318334 A1 | 12/2012 | Bedell et al. |
| 2012/0321786 A1 | 12/2012 | Satitpunwaycha et al. |
| 2012/0322252 A1 | 12/2012 | Son et al. |
| 2012/0325148 A1 | 12/2012 | Yamagishi et al. |
| 2012/0328780 A1 | 12/2012 | Yamagishi et al. |
| 2013/0005122 A1 | 1/2013 | Schwarzenbach et al. |
| 2013/0011983 A1 | 1/2013 | Tsai |
| 2013/0014697 A1 | 1/2013 | Kanayama |
| 2013/0014896 A1 | 1/2013 | Shoji et al. |
| 2013/0019944 A1 | 1/2013 | Hekmatshoar-Tabari et al. |
| 2013/0019945 A1 | 1/2013 | Hekmatshoar-Tabari et al. |
| 2013/0023129 A1 | 1/2013 | Reed |
| 2013/0048606 A1 | 2/2013 | Mao et al. |
| 2013/0064973 A1 | 3/2013 | Chen et al. |
| 2013/0068970 A1 | 3/2013 | Matsushita |
| 2013/0078392 A1 | 3/2013 | Xiao et al. |
| 2013/0081702 A1 | 4/2013 | Mohammed et al. |
| 2013/0084156 A1 | 4/2013 | Shimamoto |
| 2013/0084714 A1 | 4/2013 | Oka et al. |
| 2013/0104988 A1 | 5/2013 | Yednak et al. |
| 2013/0104992 A1 | 5/2013 | Yednak et al. |
| 2013/0115383 A1 | 5/2013 | Lu et al. |
| 2013/0115763 A1 | 5/2013 | Takamure et al. |
| 2013/0122712 A1 | 5/2013 | Kim et al. |
| 2013/0126515 A1 | 5/2013 | Shero et al. |
| 2013/0129577 A1 | 5/2013 | Halpin et al. |
| 2013/0134148 A1 | 5/2013 | Tachikawa et al. |
| 2013/0168354 A1 | 7/2013 | Kanarik |
| 2013/0180448 A1 | 7/2013 | Sakaue et al. |
| 2013/0183814 A1 | 7/2013 | Huang et al. |
| 2013/0210241 A1 | 8/2013 | Lavoie et al. |
| 2013/0217239 A1 | 8/2013 | Mallick et al. |
| 2013/0217240 A1 | 8/2013 | Mallick et al. |
| 2013/0217241 A1 | 8/2013 | Underwood et al. |
| 2013/0217243 A1 | 8/2013 | Underwood et al. |
| 2013/0224964 A1 | 8/2013 | Fukazawa |
| 2013/0230814 A1 | 9/2013 | Dunn et al. |
| 2013/0256838 A1 | 10/2013 | Sanchez et al. |
| 2013/0264659 A1 | 10/2013 | Jung |
| 2013/0288480 A1 | 10/2013 | Sanchez et al. |
| 2013/0292047 A1 | 11/2013 | Tian et al. |
| 2013/0292676 A1 | 11/2013 | Milligan et al. |
| 2013/0292807 A1 | 11/2013 | Raisanen et al. |
| 2013/0295779 A1 | 11/2013 | Chandra et al. |
| 2013/0319290 A1 | 12/2013 | Xiao et al. |
| 2013/0323435 A1 | 12/2013 | Xiao et al. |
| 2013/0330165 A1 | 12/2013 | Wimplinger |
| 2013/0330911 A1 | 12/2013 | Huang et al. |
| 2013/0330933 A1 | 12/2013 | Fukazawa et al. |
| 2013/0337583 A1 | 12/2013 | Kobayashi et al. |
| 2014/0000843 A1 | 1/2014 | Dunn et al. |
| 2014/0014642 A1 | 1/2014 | Elliot et al. |
| 2014/0014644 A1 | 1/2014 | Akiba et al. |
| 2014/0020619 A1 | 1/2014 | Vincent et al. |
| 2014/0027884 A1 | 1/2014 | Tang et al. |
| 2014/0033978 A1 | 2/2014 | Adachi et al. |
| 2014/0036274 A1 | 2/2014 | Marquardt et al. |
| 2014/0048765 A1 | 2/2014 | Ma et al. |
| 2014/0056679 A1 | 2/2014 | Yamabe et al. |
| 2014/0060147 A1 | 3/2014 | Sarin et al. |
| 2014/0062304 A1* | 3/2014 | Nakano ............ H01J 37/32091 315/111.21 |
| 2014/0067110 A1 | 3/2014 | Lawson et al. |
| 2014/0073143 A1 | 3/2014 | Alokozai et al. |
| 2014/0077240 A1 | 3/2014 | Roucka et al. |
| 2014/0084341 A1 | 3/2014 | Weeks |
| 2014/0087544 A1 | 3/2014 | Tolle |
| 2014/0094027 A1 | 4/2014 | Azumo et al. |
| 2014/0096716 A1 | 4/2014 | Chung et al. |
| 2014/0099798 A1 | 4/2014 | Tsuji |
| 2014/0103145 A1 | 4/2014 | White et al. |
| 2014/0116335 A1 | 5/2014 | Tsuji et al. |
| 2014/0120487 A1 | 5/2014 | Kaneko |
| 2014/0127907 A1 | 5/2014 | Yang |
| 2014/0141625 A1 | 5/2014 | Fukazawa et al. |
| 2014/0159170 A1 | 6/2014 | Raisanen et al. |
| 2014/0174354 A1 | 6/2014 | Arai |
| 2014/0175054 A1 | 6/2014 | Carlson et al. |
| 2014/0182053 A1 | 7/2014 | Huang |
| 2014/0217065 A1 | 8/2014 | Winkler et al. |
| 2014/0220247 A1 | 8/2014 | Haukka et al. |
| 2014/0225065 A1 | 8/2014 | Rachmady et al. |
| 2014/0227072 A1 | 8/2014 | Lee et al. |
| 2014/0251953 A1 | 9/2014 | Winkler et al. |
| 2014/0251954 A1 | 9/2014 | Winkler et al. |
| 2014/0283747 A1 | 9/2014 | Kasai et al. |
| 2014/0346650 A1 | 11/2014 | Raisanen et al. |
| 2014/0349033 A1 | 11/2014 | Nonaka et al. |

(56) References Cited

U.S. PATENT DOCUMENTS

| | | |
|---|---|---|
| 2014/0363980 A1 | 12/2014 | Kawamata et al. |
| 2014/0363985 A1 | 12/2014 | Jang et al. |
| 2014/0367043 A1 | 12/2014 | Bishara et al. |
| 2015/0004316 A1 | 1/2015 | Thompson et al. |
| 2015/0004317 A1 | 1/2015 | Dussarrat et al. |
| 2015/0007770 A1 | 1/2015 | Chandrasekharan et al. |
| 2015/0014632 A1 | 1/2015 | Kim et al. |
| 2015/0017794 A1* | 1/2015 | Takamure ......... H01L 21/02129 438/558 |
| 2015/0021599 A1 | 1/2015 | Ridgeway et al. |
| 2015/0024609 A1 | 1/2015 | Milligan et al. |
| 2015/0048485 A1 | 2/2015 | Tolle |
| 2015/0078874 A1 | 3/2015 | Sansoni |
| 2015/0079311 A1* | 3/2015 | Nakano ................. C23C 16/405 427/579 |
| 2015/0086316 A1 | 3/2015 | Greenberg |
| 2015/0091057 A1 | 4/2015 | Xie et al. |
| 2015/0096973 A1 | 4/2015 | Dunn et al. |
| 2015/0099072 A1 | 4/2015 | Takamure et al. |
| 2015/0132212 A1 | 5/2015 | Winkler et al. |
| 2015/0140210 A1 | 5/2015 | Jung et al. |
| 2015/0147483 A1 | 5/2015 | Fukazawa |
| 2015/0147877 A1 | 5/2015 | Jung |
| 2015/0167159 A1 | 6/2015 | Halpin et al. |
| 2015/0170954 A1 | 6/2015 | Agarwal et al. |
| 2015/0174768 A1 | 6/2015 | Rodnick |
| 2015/0184291 A1 | 7/2015 | Alokozai et al. |
| 2015/0187568 A1 | 7/2015 | Pettinger et al. |
| 2015/0217456 A1 | 8/2015 | Tsuji et al. |
| 2015/0240359 A1 | 8/2015 | Jdira et al. |
| 2015/0267295 A1 | 9/2015 | Hill et al. |
| 2015/0267297 A1 | 9/2015 | Shiba |
| 2015/0267299 A1 | 9/2015 | Hawkins et al. |
| 2015/0267301 A1 | 9/2015 | Hill et al. |
| 2015/0284848 A1 | 10/2015 | Nakano et al. |
| 2015/0287626 A1 | 10/2015 | Arai |
| 2015/0308586 A1 | 10/2015 | Shugrue et al. |
| 2015/0315704 A1 | 11/2015 | Nakano et al. |
| 2016/0013024 A1 | 1/2016 | Milligan et al. |
| 2016/0020092 A1* | 1/2016 | Kang ................. H01L 21/02274 438/761 |
| 2016/0024656 A1 | 1/2016 | White et al. |
| 2016/0051964 A1 | 2/2016 | Tolle et al. |
| 2016/0099150 A1* | 4/2016 | Tsai .................... H01L 21/2252 257/401 |
| 2016/0190137 A1* | 6/2016 | Tsai .................... H01L 27/0924 257/369 |

FOREIGN PATENT DOCUMENTS

| | | |
|---|---|---|
| CN | 101522943 | 9/2009 |
| CN | 101423937 | 9/2011 |
| DE | 102008052750 | 6/2009 |
| EP | 2036600 | 3/2009 |
| EP | 2426233 | 7/2012 |
| JP | 2845163 | 1/1991 |
| JP | 03-044472 | 2/1991 |
| JP | H04115531 | 4/1992 |
| JP | 06-53210 | 2/1994 |
| JP | 07-130731 | 5/1995 |
| JP | 07-034936 | 8/1995 |
| JP | 7-272694 | 10/1995 |
| JP | H07283149 | 10/1995 |
| JP | 08-181135 | 7/1996 |
| JP | H08335558 | 12/1996 |
| JP | 10-064696 | 3/1998 |
| JP | 10-0261620 | 9/1998 |
| JP | 2001-15698 | 1/2001 |
| JP | 2001342570 | 12/2001 |
| JP | 2004014952 | 1/2004 |
| JP | 2004091848 | 3/2004 |
| JP | 2004128019 | 4/2004 |
| JP | 2004134553 | 4/2004 |
| JP | 2004294638 | 10/2004 |
| JP | 2004310019 | 11/2004 |
| JP | 2004538374 | 12/2004 |
| JP | 2005507030 | 3/2005 |
| JP | 2006186271 | 7/2006 |
| JP | 3140111 | 3/2008 |
| JP | 2008060304 | 3/2008 |
| JP | 2008527748 | 7/2008 |
| JP | 2008202107 | 9/2008 |
| JP | 2009016815 | 1/2009 |
| JP | 2009099938 | 5/2009 |
| JP | 2010067940 | 3/2010 |
| JP | 2010097834 | 4/2010 |
| JP | 2010205967 | 9/2010 |
| JP | 2010251444 | 10/2010 |
| JP | 2012089837 | 5/2012 |
| JP | 2012146939 | 8/2012 |
| KR | 20100020834 | 2/2010 |
| TW | I226380 | 1/2005 |
| TW | 200701301 | 1/2007 |
| WO | 9832893 | 7/1998 |
| WO | 2004008827 | 1/2004 |
| WO | 2004010467 | 1/2004 |
| WO | 2006054854 | 5/2006 |
| WO | 2006056091 | 6/2006 |
| WO | 2006078666 | 7/2006 |
| WO | 2006080782 | 8/2006 |
| WO | 2006101857 | 9/2006 |
| WO | 2007140376 | 12/2007 |
| WO | 2010039363 | 4/2010 |
| WO | 2010118051 | 1/2011 |
| WO | 2011019950 | 2/2011 |
| WO | 2013078065 | 5/2013 |
| WO | 2013078066 | 5/2013 |

OTHER PUBLICATIONS

USPTO; Office Action dated Feb. 15, 2011 in U.S. Appl. No. 12/118,596.

USPTO; Notice of Allowance dated Aug. 4, 2011 in U.S. Appl. No. 12/118,596.

USPTO; Non-Final Office Action dated Apr. 1, 2010 in U.S. Appl. No. 12/357,174.

USPTO; Final Office Action dated Sep. 1, 2010 in U.S. Appl. No. 12/357,174.

USPTO; Notice of Allowance dated Dec. 13, 2010 in U.S. Appl. No. 12/357,174.

USPTO; Non-Final Office Action dated Dec. 29, 2010 in U.S. Appl. No. 12/362,023.

USPTO; Non-Final Office Action dated Jul. 26, 2011 in U.S. Appl. No. 12/416,809.

USPTO; Final Office Action dated Dec. 6, 2011 in U.S. Appl. No. 12/416,809.

USPTO; Notice of Allowance dated Jun. 16, 2011 in U.S. Appl. No. 12/430,751.

USPTO; Notice of Allowance dated Jul. 27, 2011 in U.S. Appl. No. 12/430,751.

USPTO; Notice of Allowance dated Oct. 1, 2010 in U.S. Appl. No. 12/467,017.

USPTO; Non-Final Office Action dated Mar. 18, 2010 in U.S. Appl. No. 12/489,252.

USPTO; Notice of Allowance dated Sep. 2, 2010 in U.S. Appl. No. 12/489,252.

USPTO; Non-Final Office Action dated Dec. 15, 2010 in U.S. Appl. No. 12/553,759.

USPTO; Final Office Action dated May 4, 2011 in U.S. Appl. No. 12/553,759.

USPTO; Non-Final Office Action dated Sep. 6, 2011 in U.S. Appl. No. 12/553,759.

USPTO; Notice of Allowance dated Jan. 24, 2012 in U.S. Appl. No. 12/553,759.

USPTO; Non-Final Office Action dated Oct. 19, 2012 in U.S. Appl. No. 12/618,355.

USPTO; Final Office Action dated May 8, 2013 in U.S. Appl. No. 12/618,355.

(56) References Cited

OTHER PUBLICATIONS

USPTO; Non-Final Office Action dated Apr. 8, 2015 in U.S. Appl. No. 12/618,355.
USPTO; Final Office Action dated Oct. 22, 2015 in U.S. Appl. No. 12/618,355.
USPTO; Non-Final Office Action dated Feb. 16, 2012 in U.S. Appl. No. 12/618,419.
USPTO; Final Office Action dated Jun. 22, 2012 in U.S. Appl. No. 12/618,419.
USPTO; Non-Final Office Action dated Nov. 27, 2012 in U.S. Appl. No. 12/618,419.
USPTO; Notice of Allowance dated Apr. 12, 2013 in U.S. Appl. No. 12/618,419.
USPTO; Non-Final Office Action dated Dec. 6, 2011 in U.S. Appl. No. 12/718,731.
USPTO; Notice of Allowance dated Mar. 16, 2012 in U.S. Appl. No. 12/718,731.
USPTO; Restriction Requirement dated Jan. 15, 2013 in U.S. Appl. No. 12/754,223.
USPTO; Office Action dated Feb. 26, 2013 in U.S. Appl. No. 12/754,223.
USPTO; Final Office Action dated Jun. 28, 2013 in U.S. Appl. No. 12/754,223.
USPTO; Office Action dated Feb. 25, 2014 in U.S. Appl. No. 12/754,223.
USPTO; Final Office Action dated Jul. 14, 2014 in U.S. Appl. No. 12/754,223.
USPTO; Non-Final Office Action dated Mar. 25, 2015 in U.S. Appl. No. 12/754,223.
USPTO; Final Office Action dated Aug. 12, 2015 in U.S. Appl. No. 12/754,223.
USPTO; Office Action dated Apr. 23, 2013 in U.S. Appl. No. 12/763,037.
USPTO; Final Office Action dated Oct. 21, 2013 in U.S. Appl. No. 12/763,037.
USPTO; Office Action dated Oct. 8, 2014 in U.S. Appl. No. 12/763,037.
USPTO; Notice of Allowance dated Jan. 27, 2015 in U.S. Appl. No. 12/763,037.
USPTO; Non-Final Office Action dated Jan. 24, 2011 in U.S. Appl. No. 12/778,808.
USPTO; Notice of Allowance dated May 9, 2011 in U.S. Appl. No. 12/778,808.
USPTO; Notice of Allowance dated Oct. 12, 2012 in U.S. Appl. No. 12/832,739.
USPTO; Non-Final Office Action dated Oct. 16, 2012 in U.S. Appl. No. 12/847,848.
USPTO; Final Office Action dated Apr. 22, 2013 in U.S. Appl. No. 12/847,848.
USPTO; Notice of Allowance dated Jan. 16, 2014 in U.S. Appl. No. 12/847,848.
USPTO; Restriction Requirement dated Sep. 25, 2012 in U.S. Appl. No. 12/854,818.
USPTO; Office Action dated Dec. 6, 2012 in U.S. Appl. No. 12/854,818.
USPTO; Final Office Action dated Mar. 13, 2013 in U.S. Appl. No. 12/854,818.
USPTO; Office Action dated Aug. 30, 2013 in U.S. Appl. No. 12/854,818.
USPTO; Final Office Action dated Mar. 26, 2014 in U.S. Appl. No. 12/854,818.
USPTO; Office Action dated Jun. 3, 2014 in U.S. Appl. No. 12/854,818.
USPTO; Non-Final Office Action dated Jul. 11, 2012 in U.S. Appl. No. 12/875,889.
USPTO; Notice of Allowance dated Jan. 4, 2013 in U.S. Appl. No. 12/875,889.
USPTO; Notice of Allowance dated Jan. 9, 2012 in U.S. Appl. No. 12/901,323.
USPTO; Non-Final Office Action dated Nov. 20, 2013 in U.S. Appl. No. 12/910,607.
USPTO; Final Office Action dated Apr. 28, 2014 in U.S. Appl. No. 12/910,607.
USPTO; Notice of Allowance dated Aug. 15, 2014 in U.S. Appl. No. 12/910,607.
USPTO; Non-Final Office Action dated Oct. 24, 2012 in U.S. Appl. No. 12/940,906.
USPTO; Final Office Action dated Feb. 13, 2013 in U.S. Appl. No. 12/940,906.
USPTO; Notice of Allowance dated Apr. 23, 2013 in U.S. Appl. No. 12/940,906.
USPTO; Non-Final Office Action dated Dec. 7, 2012 in U.S. Appl. No. 12/953,870.
USPTO; Final Office Action dated Apr. 22, 2013 in U.S. Appl. No. 12/953,870.
USPTO; Non-Final Office Action dated Sep. 19, 2012 in U.S. Appl. No. 13/016,735.
USPTO; Final Office Action dated Feb. 11, 2013 in U.S. Appl. No. 13/016,735.
USPTO; Notice of Allowance dated Apr. 24, 2013 in U.S. Appl. No. 13/016,735.
USPTO; Non-Final Office Action dated Apr. 4, 2012 in U.S. Appl. No. 13/030,438.
USPTO; Final Office Action dated Aug. 22, 2012 in U.S. Appl. No. 13/030,438.
USPTO; Notice of Allowance dated Oct. 24, 2012 in U.S. Appl. No. 13/030,438.
USPTO; Non-Final Office Action dated Dec. 3, 2012 in U.S. Appl. No. 13/040,013.
USPTO; Notice of Allowance dated May 3, 2013 in U.S. Appl. No. 13/040,013.
USPTO; Notice of Allowance dated Sep. 13, 2012 in U.S. Appl. No. 13/085,698.
USPTO; Non-Final Office Action dated Mar. 29, 2013 in U.S. Appl. No. 13/094,402.
USPTO; Final Office Action dated Jul. 17, 2013 in U.S. Appl. No. 13/094,402.
USPTO; Notice of Allowance dated Sep. 30, 2013 in U.S. Appl. No. 13/094,402.
USPTO; Restriction Requirement dated May 8, 2013 in U.S. Appl. No. 13/102,980.
USPTO; Office Action dated Oct. 7, 2013 in U.S. Appl. No. 13/102,980.
USPTO; Final Office Action dated Mar. 25, 2014 in U.S. Appl. No. 13/102,980.
USPTO; Notice of Allowance dated Jul. 3, 2014 in U.S. Appl. No. 13/102,980.
USPTO; Non-Final Office Action dated Jul. 17, 2014 in U.S. Appl. No. 13/154,271.
USPTO; Final Office Action dated Jan. 2, 2015 in U.S. Appl. No. 13/154,271.
USPTO; Non-Final Office Action dated May 27, 2015 in U.S. Appl. No. 13/154,271.
USPTO; Final Office Action dated Nov. 23, 2015 in U.S. Appl. No. 13/154,271.
USPTO; Notice of Allowance dated Feb. 10, 2016 in U.S. Appl. No. 13/154,271.
USPTO; Non-Final Office Action dated Oct. 27, 2014 in U.S. Appl. No. 13/169,951.
USPTO; Final Office Action dated May 26, 2015 in U.S. Appl. No. 13/169,591.
USPTO; Non-Final Office Action dated Sep. 1, 2015 in U.S. Appl. No. 13/169,951.
USPTO; Non-Final Office Action dated Jun. 24, 2014 in U.S. Appl. No. 13/181,407.
USPTO; Final Office Action dated Sep. 24, 2014 in U.S. Appl. No. 13/181,407.
USPTO; Non-Final Office Action dated Jan. 2, 2015 in U.S. Appl. No. 13/181,407.
USPTO; Final Office Action dated Apr. 8, 2015 in U.S. Appl. No. 13/181,407.

(56) References Cited

OTHER PUBLICATIONS

USPTO; Non-Final Office Action dated Jan. 23, 2013 in U.S. Appl. No. 13/184,351.
USPTO; Final Office Action dated Jul. 29, 2013 in U.S. Appl. No. 13/184,351.
USPTO; Non-Final Office Action dated Jul. 16, 2014 in U.S. Appl. No. 13/184,351.
USPTO; Final Office Action dated Feb. 17, 2015 in U.S. Appl. No. 13/184,351.
USPTO; Non-Final Office Action dated Aug. 10, 2015 in U.S. Appl. No. 13/184,351.
USPTO; Non-Final Office Action dated Sep. 17, 2014 in U.S. Appl. No. 13/187,300.
USPTO; Final Office Action dated Apr. 15, 2015 in U.S. Appl. No. 13/187,300.
USPTO; Non-Final Office Action dated Apr. 7, 2016 in U.S. Appl. No. 13/187,300.
USPTO; Non-Final Office Action dated Oct. 1, 2012 in U.S. Appl. No. 13/191,762.
USPTO; Final Office Action dated Apr. 10, 2013 in U.S. Appl. No. 13/191,762.
USPTO; Notice of Allowance dated Aug. 15, 2013 in U.S. Appl. No. 13/191,762.
USPTO; Non-Final Office Action dated Oct. 22, 2012 in U.S. Appl. No. 13/238,960.
USPTO; Final Office Action dated May 3, 2013 in U.S. Appl. No. 13/238,960.
USPTO; Non-Final Office Action dated Apr. 26, 2013 in U.S. Appl. No. 13/250,721.
USPTO; Notice of Allowance dated Sep. 11, 2013 in U.S. Appl. No. 13/250,721.
USPTO; Non-Final Office Action dated Jul. 2, 2014 in U.S. Appl. No. 13/283,408.
USPTO; Final Office Action dated Jan. 29, 2015 in U.S. Appl. No. 13/283,408.
USPTO; Non-Final Office Action dated Jun. 17, 2015 in U.S. Appl. No. 13/283,408.
USPTO; Final Office Action dated Dec. 18, 2015 in U.S. Appl. No. 13/283,408.
USPTO; Notice of Allowance dated Mar. 28, 2016 in U.S. Appl. No. 13/283,408.
USPTO; Restriction Requirement dated Dec. 16, 2013 in U.S. Appl. No. 13/284,642.
USPTO; Restriction Requirement dated Apr. 21, 2014 in U.S. Appl. No. 13/284,642.
USPTO; Office Action dated Jul. 30, 2014 in U.S. Appl. No. 13/284,642.
USPTO; Notice of Allowance dated Feb. 11, 2015 in U.S. Appl. No. 13/284,642.
USPTO; Office Action dated Jan. 28, 2014 in U.S. Appl. No. 13/312,591.
USPTO; Final Office Action dated May 14, 2014 in U.S. Appl. No. 13/312,591.
USPTO; Non-Final Office Action dated Nov. 26, 2014 in U.S. Appl. No. 13/312,591.
USPTO; Final Office Action dated Mar. 20, 2015 in U.S. Appl. No. 13/312,591.
USPTO; Notice of Allowance dated May 14, 2015 in U.S. Appl. No. 13/312,591.
USPTO; Non-Final Office Action dated Apr. 9, 2014 in U.S. Appl. No. 13/333,420.
USPTO; Notice of Allowance dated Sep. 15, 2014 in U.S. Appl. No. 13/333,420.
USPTO; Office Action dated Jan. 10, 2013 in U.S. Appl. No. 13/339,609.
USPTO; Office Action dated Feb. 11, 2013 in U.S. Appl. No. 13/339,609.
USPTO; Final Office Action dated May 17, 2013 in U.S. Appl. No. 13/339,609.
USPTO; Office Action dated Aug. 29, 2013 in U.S. Appl. No. 13/339,609.
USPTO; Final Office Action dated Dec. 18, 2013 in U.S. Appl. No. 13/339,609.
USPTO; Notice of Allowance dated Apr. 7, 2014 in U.S. Appl. No. 13/339,609.
USPTO; Non-Final Office Action dated Oct. 10, 2012 in U.S. Appl. No. 13/406,791.
USPTO; Final Office Action dated Jan. 31, 2013 in U.S. Appl. No. 13/406,791.
USPTO; Non-Final Office Action dated Apr. 25, 2013 in U.S. Appl. No. 13/406,791.
USPTO; Final Office Action dated Aug. 23, 2013 in U.S. Appl. No. 13/406,791.
USPTO; Non-Final Office Action dated Dec. 4, 2013 in U.S. Appl. No. 13/406,791.
USPTO; Final Office Action dated Apr. 21, 2014 in U.S. Appl. No. 13/406,791.
USPTO; Non-Final Office Action dated Jan. 14, 2013 in U.S. Appl. No. 13/410,970.
USPTO; Notice of Allowance dated Feb. 14, 2013 in U.S. Appl. No. 13/410,970.
USPTO; Non-Final Office Action dated Feb. 13, 2014 in U.S. Appl. No. 13/411,271.
USPTO; Non-Final Office Action dated Jul. 31, 2014 in U.S. Appl. No. 13/411,271.
USPTO; Final Office Action dated Jan. 16, 2015 in U.S. Appl. No. 13/411,271.
USPTO; Notice of Allowance dated Oct. 6, 2015 in U.S. Appl. No. 13/411,271.
USPTO; Restriction Requirement dated Oct. 29, 2013 in U.S. Appl. No. 13/439,528.
USPTO; Office Action dated Feb. 4, 2014 in U.S. Appl. No. 13/439,528.
USPTO; Final Office Action dated Jul. 8, 2014 in U.S. Appl. No. 13/439,528.
UPPTO; Notice of Allowance dated Oct. 21, 2014 in U.S. Appl. No. 13/439,528.
USPTO; Non-Final Office Action dated Apr. 11, 2013 in U.S. Appl. No. 13/450,368.
USPTO; Notice of Allowance dated Jul. 17, 2013 in U.S. Appl. No. 13/450,368.
USPTO; Office Action dated May 23, 2013 in U.S. Appl. No. 13/465,340.
USPTO; Final Office Action dated Oct. 30, 2013 in U.S. Appl. No. 13/465,340.
USPTO; Notice of Allowance dated Feb. 12, 2014 in U.S. Appl. No. 13/465,340.
USPTO; Non-Final Office Action dated Oct. 17, 2013 in U.S. Appl. No. 13/493,897.
USPTO; Notice of Allowance dated Mar. 20, 2014 in U.S. Appl. No. 13/493,897.
USPTO; Office Action dated Dec. 20, 2013 in U.S. Appl. No. 13/535,214.
USPTO; Final Office Action dated Jun. 18, 2014 in U.S. Appl. No. 13/535,214.
USPTO; Notice of Allowance dated Oct. 23, 2014 in U.S. Appl. No. 13/535,214.
USPTO; Non-Final Office Action dated Sep. 11, 2013 in U.S. Appl. No. 13/550,419.
USPTO; Final Office Action dated Jan. 27, 2014 in U.S. Appl. No. 13/550,419.
USPTO; Notice of Allowance dated May 29, 2014 in U.S. Appl. No. 13/550,419.
USPTO; Non-Final Office Action dated Aug. 8, 2014 in U.S. Appl. No. 13/563,066.
USPTO; Final Office Action dated Feb. 12, 2015 in U.S. Appl. No. 13/563,066.
USPTO; Notice of Allowance dated Jun. 12, 2015 in U.S. Appl. No. 13/563,066.
USPTO; Notice of Allowance dated Jul. 16, 2015 in U.S. Appl. No. 13/563,066.

(56) References Cited

OTHER PUBLICATIONS

USPTO; Non-Final Office Action dated Nov. 7, 2013 in U.S. Appl. No. 13/565,564.
USPTO; Final Office Action dated Feb. 28, 2014 in U.S. Appl. No. 13/565,564.
USPTO; Non-Final Office Action dated Jul. 2, 2014 in U.S. Appl. No. 13/565,564.
USPTO; Notice of Allowance dated Nov. 3, 2014 in U.S. Appl. No. 13/565,564.
USPTO; Non-Final Office Action dated Aug. 30, 2013 in U.S. Appl. No. 13/570,067.
USPTO; Notice of Allowance dated Jan. 6, 2014 in U.S. Appl. No. 13/570,067.
USPTO; Non-Final Office Action dated Oct. 15, 2014 in U.S. Appl. No. 13/597,043.
USPTO; Final Office Action dated Mar. 13, 2015 in U.S. Appl. No. 13/597,043.
USPTO; USPTO; Notice of Allowance dated Aug. 28, 2015 in U.S. Appl. No. 13/597,043.
USPTO; Non-Final Office Action dated Feb. 12, 2015 in U.S. Appl. No. 13/597,108.
USPTO; Final Office Action dated Jun. 1, 2015 in U.S. Appl. No. 13/597,108.
USPTO; Non-Final Office Action dated Dec. 8, 2015 in U.S. Appl. No. 13/597,108.
USPTO; Notice of Allowance dated Mar. 27, 2014 in U.S. Appl. No. 13/604,498.
USPTO; Office Action dated Nov. 15, 2013 in U.S. Appl. No. 13/612,538.
USPTO; Office Action dated Jul. 10, 2014 in U.S. Appl. No. 13/612,538.
USPTO; Non-Final Office Action dated Apr. 15, 2015 in U.S. Appl. No. 13/646,403.
USPTO; Final Office Action dated Oct. 15, 2015 in U.S. Appl. No. 13/646,403.
USPTO; Notice of Allowance dated Feb. 2, 2016 in U.S. Appl. No. 13/646,403.
USPTO; Non-Final Office Action dated May 15, 2014 in U.S. Appl. No. 13/646,471.
USPTO; Final Office Action dated Aug. 18, 2014 in U.S. Appl. No. 13/646,471.
USPTO; Non-Final Office Action dated Dec. 16, 2014 in U.S. Appl. No. 13/646,471.
USPTO; Final Office Action dated Apr. 21, 2015 in U.S. Appl. No. 13/646,471.
USPTO; Non-Final Office Action dated Aug. 19, 2015 in U.S. Appl. No. 13/646,471.
USPTO; Final Office Action dated Jan. 22, 2016 in U.S. Appl. No. 13/646,471.
USPTO; Non-Final Office Action dated May 28, 2015 in U.S. Appl. No. 13/651,144.
USPTO; Final Office Action dated Nov. 19, 2015 in U.S. Appl. No. 13/651,144.
USPTO; Non-Final Office Action dated Nov. 19, 2015 in U.S. Appl. No. 14/659,437.
USPTO; Non-Final Office Action dated Jun. 18, 2015 in U.S. Appl. No. 13/665,366.
USPTO; Non-Final Office Action dated Apr. 3, 2015 in U.S. Appl. No. 13/677,133.
USPTO; Notice of Allowance dated Aug. 4, 2015 in U.S. Appl. No. 13/677,133.
USPTO; Office Action dated Jun. 2, 2014 in U.S. Appl. No. 13/677,151.
USPTO; Final Office Action dated Nov. 14, 2014 in U.S. Appl. No. 13/677,151.
USPTO; Notice of Allowance dated Feb. 26, 2015 in U.S. Appl. No. 13/677,151.
USPTO; Non-Final Office Action dated Aug. 20, 2013 in U.S. Appl. No. 13/679,502.
USPTO; Final Office Action dated Feb. 25, 2014 in U.S. Appl. No. 13/679,502.
USPTO; Notice of Allowance dated May 2, 2014 in U.S. Appl. No. 13/679,502.
USPTO; Non-Final Office Action dated Jul. 21, 2015 in U.S. Appl. No. 13/727,324.
USPTO; Final Office Action dated Jan. 22, 2016 in U.S. Appl. No. 13/727,324.
USPTO; Non-Final Office Action dated Oct. 24, 2013 in U.S. Appl. No. 13/749,878.
USPTO; Non-Final Office Action dated Jun. 18, 2014 in U.S. Appl. No. 13/749,878.
USPTO; Final Office Action dated Dec. 10, 2014 in U.S. Appl. No. 13/749,878.
USPTO; Notice of Allowance Mar. 13, 2015 dated in U.S. Appl. No. 13/749,878.
USPTO; Office Action dated Apr. 23, 2014 in U.S. Appl. No. 13/784,362.
USPTO; Notice of Allowance dated Aug. 13, 2014 in U.S. Appl. No. 13/784,362.
USPTO; Non-Final Office Action dated Dec. 19, 2013 in U.S. Appl. No. 13/784,388.
USPTO; Notice of Allowance dated Jun. 4, 2014 in U.S. Appl. No. 13/784,388.
USPTO; Restriction Requirement dated May 8, 2014 in U.S. Appl. No. 13/791,246.
USPTO; Non-Final Office Action dated Sep. 19, 2014 in U.S. Appl. No. 13/791,246.
USPTO; Final Office Action dated Mar. 25, 2015 in U.S. Appl. No. 13/791,246.
USPTO; Non-Final Office Action dated Oct. 26, 2015 in U.S. Appl. No. 13/791,246.
USPTO; Final Office Action dated Apr. 20, 2016 in U.S. Appl. No. 13/791,246.
USPTO; Non-Final Office Action dated Nov. 6, 2015 in U.S. Appl. No. 13/791,339.
USPTO; Final Office Action dated Apr. 12, 2016 in U.S. Appl. No. 13/791,339.
USPTO; Non-Final Office Action dated Mar. 21, 2014 in U.S. Appl. No. 13/799,708.
USPTO; Notice of Allowance dated Oct. 31, 2014 in U.S. Appl. No. 13/799,708.
USPTO; Restriction Requirement dated Jun. 26, 2014 in U.S. Appl. No. 13/874,708.
USPTO; Non-Final Office Action dated Oct. 9, 2014 in U.S. Appl. No. 13/874,708.
USPTO; Notice of Allowance dated Mar. 10, 2015 in U.S. Appl. No. 13/874,708.
USPTO; Notice of Allowance dated Apr. 10, 2014 in U.S. Appl. No. 13/901,341.
USPTO; Notice of Allowance dated Jun. 6, 2014 in U.S. Appl. No. 13/901,341.
USPTO; Non-Final Office Action dated Jan. 2, 2015 in U.S. Appl. No. 13/901,372.
USPTO; Final Office Action dated Apr. 16, 2015 in U.S. Appl. No. 13/901,372.
USPTO; Non-Final Office Action dated Jul. 8, 2015 in U.S. Appl. No. 13/901,400.
USPTO; Final Office Action dated Jan. 14, 2016 in U.S. Appl. No. 13/901,400.
USPTO; Notice of Allowance dated Aug. 5, 2015 in U.S. Appl. No. 13/901,372.
USPTO; Non-Final Office Action dated Apr. 24, 2014 in U.S. Appl. No. 13/912,666.
USPTO; Final Office Action dated Sep. 25, 2014 in U.S. Appl. No. 13/912,666.
USPTO; Non-Final Office Action dated Jan. 26, 2015 in U.S. Appl. No. 13/912,666.
USPTO; Notice of Allowance dated Jun. 25, 2015 in U.S. Appl. No. 13/912,666.
USPTO; Non-Final Office Action dated Dec. 16, 2014 in U.S. Appl. No. 13/915,732.

(56) References Cited

OTHER PUBLICATIONS

USPTO; Final Office Action dated Apr. 10, 2015 in U.S. Appl. No. 13/915,732.
USPTO; Notice of Allowance dated Jun. 19, 2015 in U.S. Appl. No. 13/915,732.
USPTO; Notice of Allowance dated Mar. 17, 2015 in U.S. Appl. No. 13/923,197.
USPTO; Non-Final Office Action dated Sep. 12, 2014 in U.S. Appl. No. 13/941,134.
USPTO; Notice of Allowance dated Jan. 20, 2015 in U.S. Appl. No. 13/941,134.
USPTO; Restriction Requirement dated Apr. 30, 2015 in U.S. Appl. No. 13/941,216.
USPTO; Non-Final Office Action dated Jul. 30, 2015 in U.S. Appl. No. 13/941,216.
USPTO; Restriction Requirement dated Sep. 16, 2014 in U.S. Appl. No. 13/948,055.
USPTO; Non-Final Office Action dated Oct. 30, 2014 in U.S. Appl. No. 13/948,055.
USPTO; Non-Final Office Action dated Jun. 29, 2015 in U.S. Appl. No. 13/966,782.
USPTO; Final Office Action dated Jan. 4, 2016 in U.S. Appl. No. 13/966,782.
USPTO; Notice of Allowance dated Oct. 7, 2015 in U.S. Appl. No. 13/973,777.
USPTO; Non-Final Office Action dated Feb. 20, 2015 in U.S. Appl. No. 14/018,231.
USPTO; Notice of Allowance dated Jul. 20, 2015 in U.S. Appl. No. 14/018,231.
USPTO; Restriction Requirement Action dated Jan. 28, 2015 in U.S. Appl. No. 14/018,345.
USPTO; Non-Final Office Action dated Apr. 7, 2015 in U.S. Appl. No. 14/018,345.
USPTO; Final Office Action dated Sep. 14, 2015 in U.S. Appl. No. 14/018,345.
USPTO; Notice of Allowance dated Jan. 14, 2016 in U.S. Appl. No. 14/018,345.
USPTO; Notice of Allowance dated Mar. 17, 2016 in U.S. Appl. No. 14/018,345.
USPTO; Non-Final Office Action dated Mar. 26, 2015 in U.S. Appl. No. 14/031,982.
USPTO; Final Office Action dated Aug. 28, 2015 in U.S. Appl. No. 14/031,982.
USPTO; Notice of Allowance dated Nov. 17, 2015 in U.S. Appl. No. 14/031,982.
USPTO; Non-Final Office Action dated Apr. 28, 2015 in U.S. Appl. No. 14/040,196.
USPTO; Notice of Allowance dated Sep. 11, 2015 in U.S. Appl. No. 14/040,196.
USPTO; Non-Final Action dated Dec. 3, 2015 in U.S. Appl. No. 14/050,150.
USPTO; Non-Final Office Action dated Dec. 15, 2014 in U.S. Appl. No. 14/065,114.
USPTO; Final Office Action dated Jun. 19, 2015 in U.S. Appl. No. 14/065,114.
USPTO; Non-Final Office Action dated Oct. 7, 2015 in U.S. Appl. No. 14/065,114.
USPTO; Notice of Allowance dated Feb. 22, 2016 in U.S. Appl. No. 14/065,114.
USPTO; Non-Final Office Action dated Nov. 14, 2014 in U.S. Appl. No. 14/069,244.
USPTO; Notice of Allowance dated Mar. 25, 2015 in U.S. Appl. No. 14/069,244.
USPTO; Non-Final Office Action dated Sep. 9, 2015 in U.S. Appl. No. 14/090,750.
USPTO; Final Office Action dated Feb. 11, 2016 U.S. Appl. No. 14/090,750.
USPTO; Non-Final Office Action dated Mar. 19, 2015 in U.S. Appl. No. 14/079,302.
USPTO; Final Office Action dated Sep. 1, 2015 in U.S. Appl. No. 14/079,302.
USPTO; Non-Final Office Action dated Mar. 19, 2015 in U.S. Appl. No. 14/166,462.
USPTO; Notice of Allowance dated Sep. 3, 2015 in U.S. Appl. No. 14/166,462.
USPTO; Non-Final Office Action dated Nov. 17, 2015 in U.S. Appl. No. 14/172,220.
USPTO; Office Action dated May 29, 2014 in U.S. Appl. No. 14/183,187.
USPTO; Final Office Action dated Nov. 7, 2014 in U.S. Appl. No. 14/183,187.
USPTO; Non-Final Office Action dated Mar. 16, 2015 in U.S. Appl. No. 14/183,187.
USPTO; Final Office Action dated Jul. 10, 2015 in U.S. Appl. No. 14/183,187.
USPTO; Non-Final Office Action dated Jan. 11, 2016 in U.S. Appl. No. 14/188,760.
USPTO; Non-Final Office Action dated Oct. 8, 2015 in U.S. Appl. No. 14/218,374.
USPTO; Final Office Action dated Feb. 23, 2016 in U.S. Appl. No. 14/218,374.
USPTO; Non-Final Office Action dated Sep. 22, 2015 in U.S. Appl. No. 14/219,839.
USPTO; Non-Final Office Action dated Nov. 25, 2015 in U.S. Appl. No. 14/219,879.
USPTO; Final Office Action dated Mar. 25, 2016 in U.S. Appl. No. 14/219,839.
USPTO; Non-Final Office Action dated Sep. 18, 2015 in U.S. Appl. No. 14/244,689.
USPTO; Notice of Allowance dated Feb. 11, 2016 in U.S. Appl. No. 14/244,689.
USPTO; Non-Final Office Action dated Oct. 7, 2015 in U.S. Appl. No. 14/246,969.
USPTO; Non-Final Office Action dated Nov. 20, 2015 in U.S. Appl. No. 14/260,701.
USPTO; Non-Final Office Action dated Aug. 19, 2015 in U.S. Appl. No. 14/268,348.
USPTO; Non-Final Office Action dated Jan. 6, 2016 in U.S. Appl. No. 14/268,348.
USPTO; Non-Final Office Action dated Oct. 20, 2015 in U.S. Appl. No. 14/281,477.
USPTO; Notice of Allowance dated Feb. 23, 2016 in U.S. Appl. No. 14/327,134.
USPTO; Non-Final Office Action dated Feb. 12, 2015 in U.S. Appl. No. 14/457,058.
USPTO; Final Office Action dated Jul. 14, 2015 in U.S. Appl. No. 14/457,058.
USPTO; Non-Final Office Action dated Nov. 6, 2015 in U.S. Appl. No. 14/457,058.
USPTO; Non-Final Office Action dated Nov. 24, 2015 in U.S. Appl. No. 14/498,036.
USPTO; Final Office Action dated Apr. 5, 2016 in U.S. Appl. No. 14/498,036.
USPTO; Non-Final Office Action dated Apr. 10, 2015 in U.S. Appl. No. 14/505,290.
USPTO; Notice of Allowance dated Aug. 21, 2015 in U.S. Appl. No. 14/505,290.
USPTO; Non-Final Office Action dated Jan. 16, 2015 in U.S. Appl. No. 14/563,044.
USPTO; Final Office Action dated Jul. 16, 2015 in U.S. Appl. No. 14/563,044.
USPTO; Notice of Allowance dated Oct. 15, 2015 in U.S. Appl. No. 14/563,044.
USPTO; Notice of Allowance dated Dec. 2, 2015 in U.S. Appl. No. 14/563,044.
USPTO; Non-Final Office Action dated Oct. 1, 2015 in U.S. Appl. No. 14/571,126.
USPTO; Final Office Action dated Feb. 22, 2016 in U.S. Appl. No. 14/571,126.
USPTO; Non-Final Office Action dated Nov. 25, 2015 in U.S. Appl. No. 14/598,532.

(56) References Cited

OTHER PUBLICATIONS

USPTO; Non-Final Office Action dated Jan. 15, 2016 in U.S. Appl. No. 14/606,364.
USPTO; Non-Final Office Action dated Mar. 3, 2016 in U.S. Appl. No. 14/622,603.
USPTO; Non-Final Office Action dated Mar. 21, 2016 in U.S. Appl. No. 14/659,152.
USPTO; Final Office Action dated Mar. 17, 2016 in U.S. Appl. No. 14/659,437.
USPTO;Notice of Allowance dated Mar. 25, 2016 in U.S. Appl. No. 14/693,138.
USPTO; Non-Final Office Action dated Mar. 30, 2016 in U.S. Appl. No. 14/808,979.
USPTO; Non-Final Office Action dated Mar. 22, 2016 in U.S. Appl. No. 14/987,420.
USPTO; Non-Final Office Action dated Mar. 16, 2015 in U.S. Appl. No. 29/447,298.
USPTO; Notice of Allowance dated Jul. 6, 2015 in U.S. Appl. No. 29/447,298.
USPTO; Notice of Allowance dated Nov. 26, 2014 in U.S. Appl. No. 29/481,301.
USPTO; Notice of Allowance dated Feb. 17, 2015 in U.S. Appl. No. 29/481,308.
USPTO; Notice of Allowance dated Jan. 12, 2015 in U.S. Appl. No. 29/481,312.
USPTO; Notice of Allowance dated Apr. 30, 2015 in U.S. Appl. No. 29/481,315.
USPTO; Notice of Allowance dated May 11, 2015 in U.S. Appl. No. 29/511,011.
USPTO; Notice of Allowance dated May 11, 2015 in U.S. Appl. No. 29/514,153.
USPTO; Notice of Allowance dated Dec. 14, 2015 in U.S. Appl. No. 29/514,264.
PCT; International Search report and Written Opinion dated Nov. 12, 2010 in Application No. PCT/US2010/030126.
PCT; International Preliminary Report on Patentability dated Oct. 11, 2011 Application No. PCT/US2010/030126.
PCT; International Search report and Written Opinion dated Jan. 20, 2011 in Application No. PCT/US2010/045368.
PCT; International Search report and Written Opinion dated Feb. 6, 2013 in Application No. PCT/US2012/065343.
PCT; International Search report and Written Opinion dated Feb. 13, 2013 in Application No. PCT/US2012/065347.
Chinese Patent Office; Office Action dated Jan. 10, 2013 in Application No. 201080015699.9.
Chinese Patent Office; Office Action dated Jan. 12, 2015 in Application No. 201080015699.9.
Chinese Patent Office; Office Action dated May 24, 2013 in Application No. 201080036764.6.
Chinese Patent Office; Office Action dated Jan. 2, 2014 in Application No. 201080036764.6.
Chinese Patent Office; Office Action dated Jul. 1, 2014 in Application No. 201080036764.6.
Chinese Patent Office; Office Action dated Feb. 8, 2014 in Application No. 201110155056.
Chinese Patent Office; Office Action dated Sep. 16, 2014 in Application No. 201110155056.
Chinese Patent Office; Office Action dated Feb. 9, 2015 in Application No. 201110155056.
Japanese Patent Office; Office Action dated Jan. 25, 2014 in Application No. 2012-504786.
Japanese Patent Office; Office Action dated Dec. 1, 2014 in Application No. 2012-504786.
Korean Patent Office; Office Action dated Dec. 10, 2015 in Application No. 10-2010-0028336.
Taiwan Patent Office; Office Action dated Jul. 4, 2014 in Application No. 099110511.
Taiwan Patent Office; Office Action dated Dec. 19, 2014 in Taiwan Application No. 099127063.

Bearzotti, et al., "Fast Humidity Response of a Metal Halide-Doped Novel Polymer," Sensors and Actuators B, 7, pp. 451-454, (1992).
Bhatnagar et al., "Copper Interconnect Advances to Meet Moore's Law Milestones," Solid State Technology, 52, 10 (2009).
Buriak, "Organometallic Chemistry on Silicon and Germanium Surfaces," Chemical Reviews, 102, 5 (2002).
Cant et al., "Chemisorption Sites on Porous Silica Glass and on Mixed-Oxide Catalysis," Can. J. Chem. 46, 1373 (1968).
Chang et al. "Small-Subthreshold-Swing and Low-Voltage Flexible Organic Thin-Film Transistors Which Use HfLaO as the Gate Dielectric," IEEE Electron Device Letters, 30, 2, IEEE Electron Device Society 133-135 (2009).
Chen et al., "A Self-Aligned Airgap Interconnect Scheme," IEEE International Interconnect Technology Conference, 1-3, 146-148 (2009).
Choi et al., "Improvement of Silicon Direct Bonding using Surfaces Activated by Hydrogen Plasma Treatment," Journal of the Korean Physical Society, 37, 6, 878-881 (2000).
Choi et al., "Low Temperature Formation of Silicon Oxide Thin Films by Atomic Layer Deposition Using NH3/O2 Plasma," ECS Solid State Letters, 2(12) 114-116 (2013).
Crowell, "Chemical methods of thin film deposition: Chemical vapor deposition, atomic layer deposition, and related technologies," Journal of Vacuum Science & Technology A 21.5, S88-S95 (2003).
Cui et al., "Impact of Reductive N2/H2 Plasma on Porous Low-Dielectric Constant SiCOH Thin Films," Journal of Applied Physics 97, 113302, 1-8 (2005).
Dingemans et al., "Comparison Between Aluminum Oxide Surface Passivation Films Deposited with Thermal Aid," Plasma Aid and Pecvd, 35th IEEE PVCS, Jun. (2010).
Drummond et al., "Hydrophobic Radiofrequency Plasma-Deposited Polymer Films: Dielectric Properties and Surface Forces," Colloids and Surfaces A, 129-130, 117-129 (2006).
Easley et al., "Thermal Isolation of Microchip Reaction Chambers for Rapid Non-Contact DNA Amplification," J. Micromech. Microeng. 17, 1758-1766 (2007).
Ge et al., "Carbon Nanotube-Based Synthetic Gecko Tapes," Department of Polymer Science, PNAS, 10792-10795 (2007).
George et al., "Atomic Layer Deposition: An Overview," Chem. Rev. 110, 111-131 (2010).
Grill et al., "The Effect of Plasma Chemistry on the Damage Induced Porous SiCOH Dielectrics," IBM Research Division, RC23683 (W0508-008), Materials Science, 1-19 (2005).
Gupta et al., "Conversion of Metal Carbides to Carbide Derived Carbon by Reactive Ion Etching in Halogen Gas," Proceedings of SPIE—The International Society for Optical Engineering and Nanotechnologies for Space Applications, ISSN: 0277-786X (2006).
Heo et al., "Structural Characterization of Nanoporous Low-Dielectric Constant SiCOH Films Using Organosilane Precursors," NSTI-Nanotech, vol. 4, 122-123 (2007).
H.J. Yun et al., "Comparison of Atomic Scale Etching of Poly-Si in Inductively Coupled Ar and He Plasmas," Korean Journal of Chemical Engineering, 24, 670-673 (2007).
Jung et al., "Double Patterning of Contact Array with Carbon Polymer," Proc. of SPIE, 6924, 69240C, 1-10 (2008).
Katamreddy et al., "ALD and Characterization of Aluminum Oxide Deposited on Si(100) using Tris(diethylamino) Aluminum and Water Vapor," Journal of the Electrochemical Society, 153 (10) C701-C706 (2006).
Kim et al., "Passivation Effect on Low-k S/OC Dielectrics by H2 Plasma Treatment," Journal of the Korean Physical Society, "40, 1, 94-98 (2002).
Kim et al., "Characteristics of Low Tempemure High Quality Silicon Oxide by Plasma Enhanced Atomic Layer Deposition with In-Situ Plasma Densification Process," The Electrochemical Society, ECS Transactions, College of Information and Communication Engineerign, Sungkyunkwan University, 53(1), 321-329 (2013).
King, Plasma Enhanced Atomic Layer Deposition of SiNx: H and SiO2," J. Vac. Sci. Technol., A29(4) (2011).

(56) References Cited

OTHER PUBLICATIONS

Kobayshi et al. "Temperature Dependence of SiO2 Film Growth with Plasma-Enhanced Atomic Layer Deposition," International Journal on the Science and Technology of Condensed Matter, 520, 3994-3998, (2012).

Koo et al., "Characteristics of Al203 Thin Films Deposited Using Dimethylaluminum Isopropoxide and Trimethylaluminum Precursors by the Plasma-Enhanced Atomic-Layer Deposition Method," Journal of Physical Society, 48, 1, 131-136 (2006).

Koutsokeras et al. Texture and Microstructure Evolution in Single-Phase TixTal-xN Alloys of Rocksalt Structure. Journal of Applied Physics, 110, 043535-1-043535-6, (2011).

Krenek et al. "IR Laser CVD of Nanodisperse Ge-Si-Sn Alloys Obtained by Dielectric Breakdown of GeH4/SiH4/SnH4 Mixtures", NanoCon, Brno, Czech Republic, EU (2014).

Kurosawa et al., "Synthesis and Characterization of Plasma-Polymerized Hexamethyldisiloxane Films," Thin Solid Films, 506-507, 176-179 (2006).

Lieberman, et al., "Principles of Plasma Discharges and Materials Processing," Second Edition, 368-381.

Lim et al., "Low-Temperature Growth of SiO2 Films by Plasma-Enhanced Atomic Layer Deposition," ETRI Journal, 27 (1), 118-121 (2005).

Liu et al., "Research, Design, and Experimen of End Effector for Wafer Transfer Robot," Industrial Robot: An International Journal, 79-91 (2012).

Mackus et al., "Optical Emission Spectroscopy as a Tool for Studying Optimizing, and Monitoring Plasma-Assisted Atomic Layer Deposition Processes," Journal of Vacuum Science and Technology, 77-87 (2010).

Maeno, "Gecko Tape Using Carbon Nanotubes," Nitto Denko Gihou, 47, 48-51.

Maeng et al., "Electrical properties of atomic layer disposition Hf02 and Hf0xNy on Si Substrates with Various Crystal Orientations," Journal of the Electrochemical Society, 155, Department of Materials Science and Engineering, Pohang University of Science and Technology, H267-H271 (2008).

Marsik et al., "Effect of Ultraviolet Curing Wavelength on Low-k Dielectric Material Properties and Plasma Damage Resistance," Sciencedirect.com, 519, 11, 3619-3626 (2011).

Moeen, "Design, Modelling and Characterization of Si/SiGe Structures for IR Bolometer Applications," KTH Royal Institute of Technology. Information and Communication Technology, Department of Integrated Devices and Circuits, Stockholm Sweden (2015).

Morishige et al., "Thermal Desorption and Infrared Studies of Ammonia Amines and Pyridines Chemisorbed on Chromic Oxide," J.Chem. Soc., Faraday Trans. 1, 78, 2947-2957 (1982).

Mukai et al., "A Study of CD Budget in Spacer Patterning Technology," Proc. of SPIE, 6924, 1-8 (2008).

Nogueira et al., "Production of Highly Hydrophobic Films Using Low Frequency and High Density Plasma," Revista Brasileira de Aplicacoes de Vacuo, 25(1), 45-53 (2006).

Novaro et al., "Theoretical Study on a Reaction Pathway of Ziegler-Natta-Type Catalysis," J. Chem. Phys. 68(5), 2337-2351 (1978).

Radamson et al.,"Growth of Sn-alloyed Group IV Materials for Photonic and Electronic Applications", Manufacturing Nano Structures, 5, 129-144.

Schmatz et al., "Unusual Isomerization Reactions in 1.3-Diaza-2-Silcyclopentanes," Organometallics, 23, 1180-1182 (2004).

Scientific and Technical Information Center EIC 2800 Search Report dated Feb. 16, 2012.

S.D. Athavale et al., "Realization of Atomic Layer Etching of Silicon", Journal of Vacuum Science and Technology B, 14, 3702-3705 (1996).

Sham Ma et al., "PDL Oxide Enabled Doubling," Proc. of SPIE, 6924, 69240D, 1-10 (2008).

Varma, et al., "Effect of Metal Halides on Thermal, Mechanical, and Electrical Properties of Polypyromelitimide Films," Journal of Applied Polymer Science, 32, 3987-4000, (1986).

Wirths, et al, "SiGeSn Growth tudies Using Reduced Pressure Chemical Vapor Deposition Towards Optoelecnic Applications," This Soid Films, 557, 183-187 (2014).

Yun et al., "Behavior of Various Organosilicon Molecules in PECVD Processes for Hydrocarbon-Doped Silicon Oxide Films," Solid State Phenomena, 124-126, 347-350 (2007).

\* cited by examiner (a)          (b)

Fig. 2

| | B/PSG film | | | | | | Cap film | | | | Post Treat |
|---|---|---|---|---|---|---|---|---|---|---|---|
| | amino-Si Feed | | B/P Feed + RF | | | | amino-Si Feed + RF | | | | RF |
| Parameter | Feed | Purge | Feed | Purge | RF | Purge | Feed | Purge | RF | Purge | RF |
| Precursor amino-Si | ⎍ | | | | | | ⎍ | | | | |
| Precursor B/P | | | ⎍ | | | | | | | | |
| Dilution (noble gas) | | | | | | | | | | | |
| Reactant (oxygen) | | | | | | | | | | | |
| RF | | | | | ⎍ | | | | ⎍ HP | | ⎍ |

⎵⎴⎵ p times ⎵⎴⎵ q times

Fig. 3

| | Lower Cap film | | | | Upper Cap film | | | |
|---|---|---|---|---|---|---|---|---|
| Parameter | Feed | Purge | RF | Purge | Feed | Purge | RF | Purge |
| Precursor | ⎍ | | | | ⎍ | | | |
| Dilution (noble gas) | | | | | | | | |
| Reactant (oxygen) | | | | | | | | |
| RF | | | ⎍ LP | | | | ⎍ HP | |

⎵⎴⎵ m times ⎵⎴⎵ n times

METHOD FOR FORMING SILICON OXIDE CAP LAYER FOR SOLID STATE DIFFUSION PROCESS

BACKGROUND

Field of the Invention

The present invention relates generally to a method for protecting a layer, including a method for capping a doped silicate glass layer to block diffusion of dopants, by forming a high-quality non-doped silicate glass layer by plasma-enhanced atomic layer deposition (PEALD).

Related Art

U.S. Patent Application Publication No. 2013/0115763 discloses methods for forming doped oxide thin films such as borosilicate glass (BSG), phosphosilicate glass (PSG), and arsenic silicate glass (ASG), the disclosure of which is herein incorporated by reference in its entirety, for forming a doped silicate glass layer. As described in the publication, solid state diffusion (SSD) is a technology to diffuse dopants such as phosphorus, boron, and arsenic in a silicon substrate by heat treatment of a doped thin film (e.g., PSG, BSG, ASG) containing the dopants formed on the substrate. One problem in SSD is that dopants vaporize and dissipate from the doped thin film with time elapsing after formation of the thin film and during the heat treatment, rather than dispersing into the silicon substrate, resulting in insufficient diffusion of the dopants in the substrate. Conventionally, in order to manage the above problem, a non-doped thin film (NSG) containing no dopant is formed on the doped thin film to inhibit dissipation of the dopants from the doped thin film.

As discussed above, dopants are likely to dissipate from a doped thin film before heat treatment for SSD, i.e., during storage (exposed to the atmosphere), and during the heat treatment. In order to inhibit dissipation of the dopants from the doped-thin film, a cap film made of non-doped silicon oxide or non-doped silicate glass (NSG) can be formed on the doped thin film. However, a desired level of dispersion of the dopants in the substrate has not been achieved in SSD. If the thickness of the cap film is increased, the cap film is expected to improve blocking dissipation of the dopants so as to increase the concentration of dopants dispersed or diffused in the substrate; however, a thick cap film is not suitable for processes which require thin layering.

The quality of a cap film (e.g., high resistance against wet etching) can be improved by densification of the film, but such a process likely causes oxidation of the underlying layer or the substrate.

The above discussion of problems and solutions and any other discussions disclosed in this disclosure in relation to the related art has been included solely for the purposes of providing a context for the present invention, and should not be taken as an admission that any or all of the discussion was known at the time the invention was made.

SUMMARY OF THE INVENTION

In some embodiments, in order to inhibit dissipation of dopants before and during heat treatment in SSD, a cap film is formed using a high RF power, and further, the quality of the cap film is improved by post-deposition plasma treatment (using, e.g., a plasma of Ar, $O_2$, or Ar and $O_2$). The "quality" of a film refers to resistance against wet etching (measured using a 100:1 dilute hydrofluoric acid (DHF) solution), for example. If the resistant against wet etching is close to that of a thermal oxide film, the quality of the film is considered to be improved. In some embodiments, in order to inhibit oxidation of a underlying layer (e.g., a substrate) which may occur by the above processes (depending on the conditions for high-RF-power deposition and/or post-deposition plasma treatment particularly using gas containing oxygen), a cap film is deposited using a low RF power or under low-oxidation conditions in combination with the above high-RF-power deposition (i.e., two-step deposition), thereby depositing a cap film without oxidizing the underlying layer.

For purposes of summarizing aspects of the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description which follows.

BRIEF DESCRIPTION OF THE DRAWINGS

These and other features of this invention will now be described with reference to the drawings of preferred embodiments which are intended to illustrate and not to limit the invention. The drawings are greatly simplified for illustrative purposes and are not necessarily to scale.

FIG. 2 illustrates a process sequence of formation of a BSG/PSG film and a cap film according to an embodiment of the present invention.

FIG. 3 illustrates a process sequence of formation of a lower cap film and an upper cap film according to an embodiment of the present invention.

DETAILED DESCRIPTION OF EMBODIMENTS

Figure 1A:
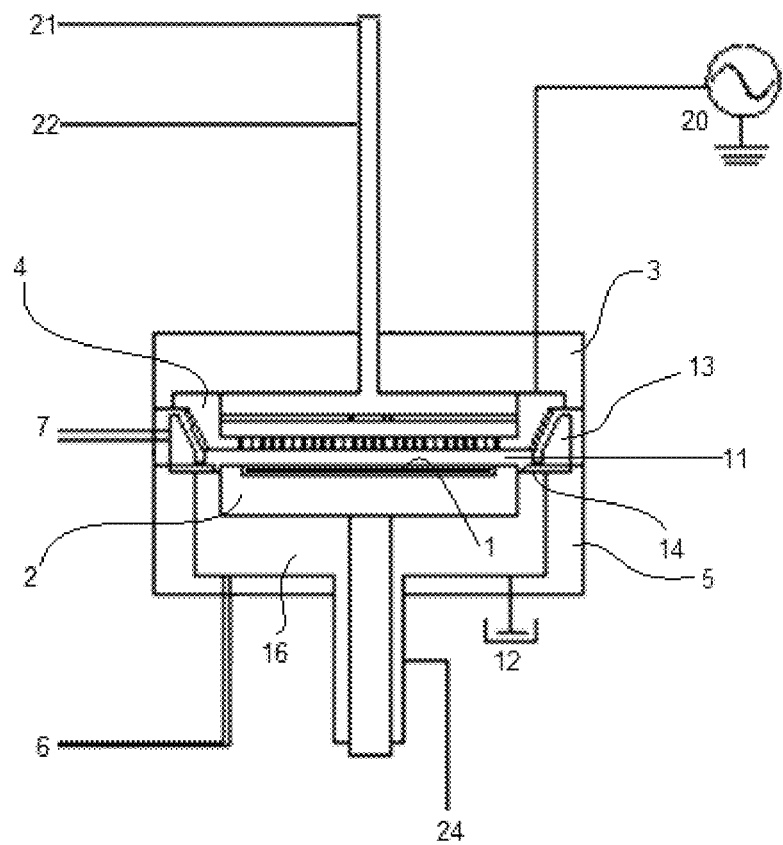
FIG. 1A is a schematic representation of a PEALD (plasma-enhanced atomic layer deposition) apparatus for depositing a protective film usable in an embodiment of the present invention.

In this disclosure, "gas" may include vaporized solid and/or liquid and may be constituted by a single gas or a mixture of gases. In this disclosure, a process gas introduced to a reaction chamber through a showerhead may be comprised of, consist essentially of, or consist of a silicon-containing gas and an additive gas. The silicon-containing gas and the additive gas can be introduced as a mixed gas or separately to a reaction space. The silicon-containing gas can be introduced with a carrier gas such as a noble gas. A gas other than the process gas, i.e., a gas introduced without passing through the showerhead, may be used for, e.g., sealing the reaction space, which includes a seal gas such as a noble gas. In some embodiments, "film" refers to a layer continuously extending in a direction perpendicular to a thickness direction substantially without pinholes to cover an entire target or concerned surface, or simply a layer covering a target or concerned surface. In some embodiments, "layer" refers to a structure having a certain thickness formed on a surface or a synonym of film or a non-film structure. A film or layer may be constituted by a discrete single film or layer having certain characteristics or multiple films or layers, and a boundary between adjacent films or layers may or may not be clear and may be established based on physical, chemical, and/or any other characteristics, formation processes or sequence, and/or functions or purposes of the adjacent films or layers.

Further, in this disclosure, the article "a" or "an" refers to a species or a genus including multiple species unless specified otherwise. The terms "constituted by" and "having" refer independently to "typically or broadly comprising", "comprising", "consisting essentially of", or "consisting of" in some embodiments. Also, in this disclosure, any defined meanings do not necessarily exclude ordinary and customary meanings in some embodiments.

Additionally, in this disclosure, any two numbers of a variable can constitute a workable range of the variable as the workable range can be determined based on routine work, and any ranges indicated may include or exclude the endpoints. Additionally, any values of variables indicated (regardless of whether they are indicated with "about" or not) may refer to precise values or approximate values and include equivalents, and may refer to average, median, representative, majority, etc. in some embodiments.

In the present disclosure where conditions and/or structures are not specified, the skilled artisan in the art can readily provide such conditions and/or structures, in view of the present disclosure, as a matter of routine experimentation. In all of the disclosed embodiments, any element used in an embodiment can be replaced with any elements equivalent thereto, including those explicitly, necessarily, or inherently disclosed herein, for the intended purposes. Further, the present invention can equally be applied to apparatuses and methods.

Some aspects of the present invention will be explained with respect to preferred embodiments. However, the present invention is not limited to the preferred embodiments.

In an embodiment, a method for protecting a doped silicate glass layer comprises: (i) forming a doped silicate glass layer on a substrate in a reaction chamber by plasma-enhanced atomic layer deposition (PEALD) using a first RF power; and (ii) forming a non-doped silicate glass layer having a thickness of less than 4 nm on the doped silicate glass layer in the reaction chamber, without breaking vacuum, by plasma-enhanced atomic layer deposition (PEALD) using a second RF power, wherein the second RF power is at least twice the first RF power. The term "protecting" refers generally to covering or shielding a surface of a doped silicate glass layer to control dissipation of dopants from the surface, or damage to or destruction of the surface.

The term "without breaking vacuum" refers to maintaining low pressure, without substantial pressure fluctuation, without being exposed to the atmosphere, and/or without opening a gate valve, depending on the embodiment.

In some embodiments, the second RF power is at least three times the first RF power (e.g., 3 to 5 times the first RF power).

In some embodiments, the doped silicate glass layer contains a dopant (which refers generally to an element introduced into a semiconductor to establish either p-type (acceptors) or n-type (donors) conductivity) which is selected from the group consisting of boron (B), phosphorous (P), arsenic (As), and antimony (Sb). Typically, the doped silicate glass layer is constituted by borosilicate glass (BSG) or phosphosilicate glass (PSG). The protective layer or cap layer can effectively block dissociation of the dopant elements from the doped layer during storage and during a subsequent annealing process (heat treatment). Further, the chemical resistance of the doped layer can be improved by the protective layer. In some embodiments, the doped layer can be formed by SSD processes or any other suitable processes, including any conventional methods such as plasma doping, ion-assisted deposition and doping (IADD), spin-on coating, sub-atmospheric pressure chemical vapour deposition (SACVD), or ALD. For example, in some embodiments, the SSD processes disclosed in U.S. Patent Application Publication No. 2013/0115763, the disclosure of which is herein incorporated by reference in its entirety, can be used to form a doped layer.

In some embodiments, the thickness of the doped silicate glass layer is about 1 nm to about 5 nm, typically about 1 nm to about 3 nm. In some embodiments, the non-doped silicate glass layer has a thickness of 3 nm or less.

In some embodiments, the non-doped silicate glass layer is deposited in contact with the doped silicate glass layer, i.e. with no intervening layer. In that case, the thickness of the non-doped silicate glass layer may be about 0.3 nm to about 2 nm, typically about 0.5 nm to about 1 nm. The term "in contact with" refers to physical and direct contact without any intervening layers or films except for negligible or unavoidable native oxide or natural oxidation layer or the like.

In some embodiments, the method further comprises, before forming the non-doped silicate glass layer as an upper non-doped silicate glass layer using the second RF power, forming a lower non-doped silicate glass layer on the doped silicate glass layer in the reaction chamber, without breaking vacuum, by plasma-enhanced atomic layer deposition (PEALD) using a third RF power, wherein the thickness of the lower non-doped silicate glass layer is such that the total thickness of the upper non-doped silicate glass layer and the lower non-doped silicate glass layer is less than 4 nm, and the third RF power is lower than the second RF power. In some embodiments, the third RF power is equivalent to or lower than the first RF power. In some embodiments, the upper non-doped silicate glass layer is deposited in contact with the lower non-doped silicate glass layer which is deposited in contact with the doped silicate glass layer. In that case, the thickness of the lower non-doped silicate glass layer may be about 0.3 nm to about 2.0 nm, typically about 0.5 nm to about 1.0 nm, whereas the thickness of the upper non-doped silicate glass layer may be about 0.5 nm to about 2.0 nm, typically about 0.5 nm to about 1.0 nm, wherein the total thickness combining the lower and upper non-doped silicate glass layers may be about 0.8 nm to about 4.0 nm, typically about 1.0 nm to about 2.0 nm.

In some embodiments, the method further comprises treating the non-doped silicate glass layer with a plasma without a precursor in the reaction chamber without breaking vacuum. The plasma treatment is considered to be post-deposition plasma treatment. The term "precursor" refers generally to a compound that participates in the chemical reaction that produces another compound, and particularly to a compound that constitutes a film matrix or a main skeleton of a film, whereas the term "reactant" refers to a compound, other than a precursor, that activates a precursor, modifies a precursor, or catalyzes a reaction of a precursor. The "reactant" does not include noble gases. Typical reactants include a gas containing oxygen, and $O_2$ gas. In some embodiments, the reactants may include or exclude $C_xO_y$ (e.g., $CO$, $C_2O$, $CO_2$, $C_3O_2$, $CO_3$, and $C_5O_2$) and $N_xO_y$ ($NO$, $N_2O$, $NO_2$, $N_2O_3$, $N_2O_4$, and $N_2O_5$). In some embodiments, the plasma of the post-deposition plasma treatment is an oxygen plasma and/or argon plasma.

In some embodiments, an alkylaminosilane precursor is supplied from a reservoir to the reaction chamber for the PEALD of the doped silicate glass layer and for the PEALD of the non-doped silicate glass layer. In some embodiments, an alkylaminosilane precursor is supplied from a reservoir to the reaction chamber for the PEALD of the doped silicate glass layer, for the PEALD of the upper non-doped silicate glass layer, and/or for the PEALD of the lower non-doped silicate glass layer. The alkylaminosilane precursor is typically (but not necessarily) liquid at room temperature, and when vaporization of the precursor is required upstream of the reaction chamber, the precursor is vaporized in a reservoir or bottle equipped with a heater. The quantity of the precursor supplied to the reaction chamber is determinable based on the vapor pressure of the precursor discharging from the reservoir, which vapor pressure is determined by the temperature of the reservoir. In some embodiments, the temperature of the reservoir is higher for the PEALD of the non-doped silicate glass layer (e.g., about 40° C. to about 60° C. when its boiling point is 70° C., for example) than the temperature of the reservoir for the PEALD of the doped silicate glass layer (e.g., about 20° C. to about 40° C. when its boiling point is 70° C., for example). In some embodiments, the temperature of the reservoir is higher for the PEALD of the upper and lower non-doped silicate glass layers (e.g., about 40° C. to about 60° C. when its boiling point is 70° C., for example) than the temperature of the reservoir for the PEALD of the doped silicate glass layer (e.g., about 20° C. to about 40° C. when its boiling point is 70° C., for example).

In some embodiments, the alkylaminosilane is selected from the group consisting of bisdiethylaminosilane (BDEAS), biszimethylaminosilane (BDMAS), hexylethylaminosilane (HEAD), tetraethylaminosilane (TEAS), tert-butylaminosilane (TBAS), bistert-butylaminosilena (BTBAS), bisdimethylaminodimethylaminosilane (BDMADMS), heptametyhlsilazane (HIVIDS), trimethysylyldiethlamine (TMSDEA), trimethylsyledimethlamine (TMSDMA), trimethyltoribinylcycletrisilazane (TMTVCTS), tri strimetylhydroxyamine (TTMSHA), bisdimethylsaminomethylsilane (BDMAMS), and dimetyhlsilyldimethlamine (DMSDMA).

In some embodiments, oxygen gas and a noble gas are continuously supplied to the reaction chamber throughout the PEALD of the doped silicate glass layer and the PEALD of the non-doped silicate glass layer. In some embodiments, oxygen gas and a noble gas are continuously supplied to the reaction chamber throughout the PEALD of the doped silicate glass layer, the PEALD of the non-doped silicate glass layer, and the oxygen plasma treatment. In some embodiments, oxygen gas and a noble gas are continuously supplied to the reaction chamber throughout the PEALD of the doped silicate glass layer, the PEALD of the lower non-doped silicate glass layer, and the PEALD of the upper non-doped silicate glass layer.

As a noble gas, Ar, He, Ne, Kr, and Xe can be used singly or in any combination of two or more.

Exemplary embodiments will be explained below with reference to the drawings. However, the exemplary embodiments are not intended to limit the present invention.

Figure 4:
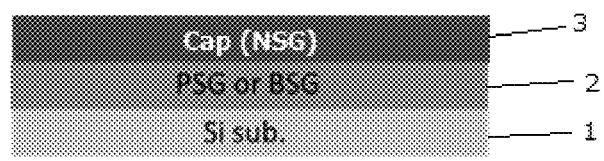
FIG. 4 is a schematic representation of a schematic cross section of a partially fabricated integrated circuit according to an embodiment of the present invention.

FIG. 4 is a schematic representation indicating a schematic cross section of a partially fabricated integrated circuit according to an embodiment of the present invention. In this embodiment, a dopant thin film 2 (e.g., BSG, PSG) is deposited on a silicon substrate 1 by, e.g., PEALD, and a cap film 3 (e.g., SiO) is deposited on the dopant thin film 2 by PEALD using an alkylaminosilane precursor, a reactant, and a noble gas. In this disclosure, the word "continuously" refers to at least one of the following: without breaking vacuum, without being exposed to air, without opening a chamber, as an in-situ process, without interruption as a step in sequence, without changing process conditions, and without causing chemical changes on a substrate surface between steps, depending on the embodiment. In some embodiments, an auxiliary step such as purging or other negligible step in the context does not count as a step, and thus, the word "continuously" does not exclude being intervened with the auxiliary step. The cap film 3 can significantly suppress dissipation or dissociation of dopant elements from the dopant thin film 2 before a subsequent annealing process and during the annealing process, and can improve chemical resistance, particularly.

Figure 5:
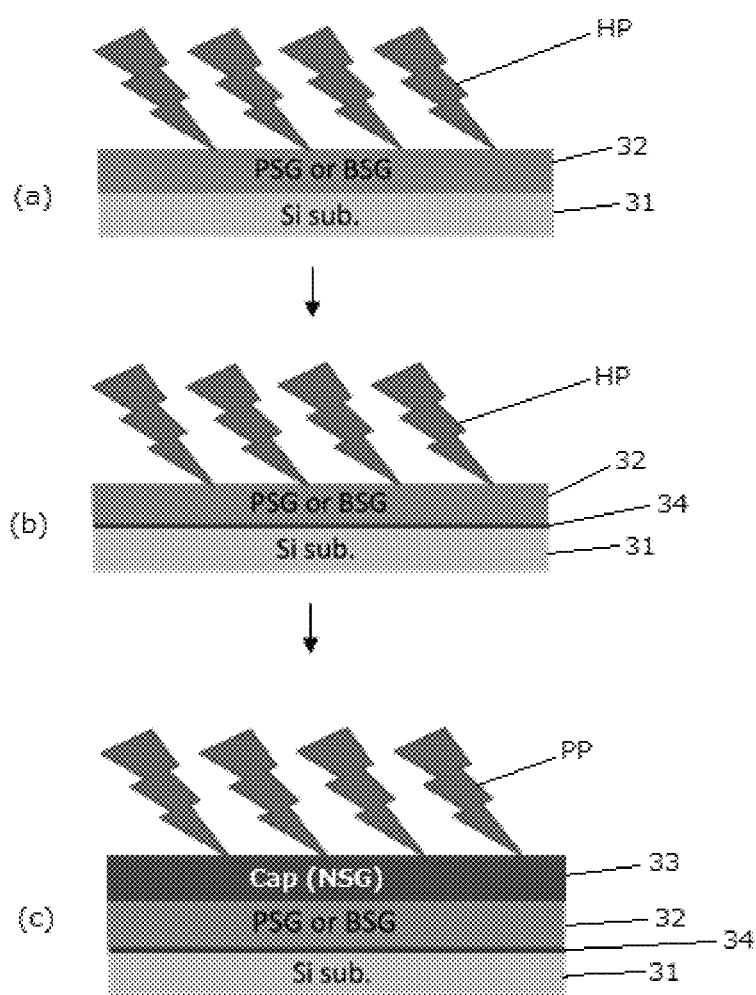
FIG. 5 is a schematic representation of processes (a) to (c), indicating schematic cross sections of a partially fabricated integrated circuit according to an embodiment of the present invention.

FIG. 5 is a schematic representation of processes (a) to (c), indicating schematic cross sections of a partially fabricated integrated circuit according to an embodiment of the present invention. In this embodiment, after a dopant thin film 32 is deposited on a silicon substrate 31 by PEALD, the dopant thin film 32 is exposed to high-RF-power plasma (HP) in step (a) for forming a cap film. Since the dopant thin film 32 is thin and also the cap film is gradually deposited (i.e., a layer is not immediately formed as a continuous film), the surface of the substrate 31 is damaged or oxidized by the high-RF-power plasma at the interface 34 between the dopant thin film 32 and the substrate 31 while a cap film is forming in step (b). After the cap film 33 is formed on the dopant thin film 32, the cap film 33 is subjected to post-deposition plasma treatment (PP) in step (c) so as to improve the quality of the cap film 33. In the above embodiment, the cap film 33 can effectively block dissipation or dissociation of the dopant from the dopant thin film 32; however, as shown in step (b), because high-RF-power plasma is used for depositing the cap film 32, the surface of the substrate 31 is oxidized.

Figure 6:
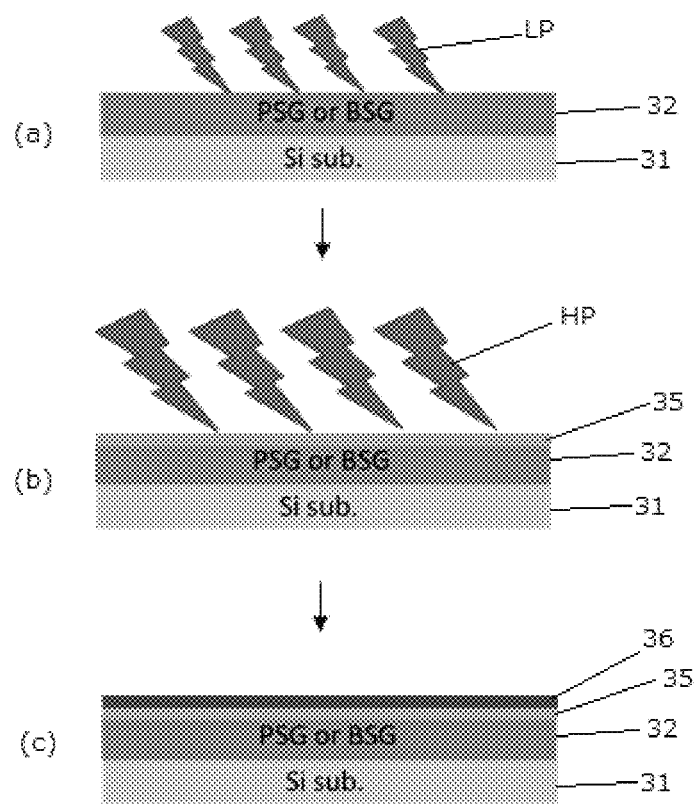
FIG. 6 is a schematic representation of processes (a) to (c), indicating schematic cross sections of a partially fabricated integrated circuit according to another embodiment of the present invention.

FIG. 6 is a schematic representation of processes (a) to (c), indicating schematic cross sections of a partially fabricated integrated circuit according to another embodiment of the present invention. In this embodiment, oxidation of the substrate discussed above can be avoided. After a dopant thin film 32 is deposited on a silicon substrate 31 by PEALD, the dopant thin film 32 is exposed to low-RF-power plasma (LP) in step (a) for forming a lower cap film. Since the low-RF-power plasma is used, the surface of the substrate 31 is not damaged or oxidized at the interface between the dopant thin film 32 and the substrate 31 while a lower cap film is forming in step (a). After the lower cap film 35 is formed on the dopant thin film 32, the lower cap film 35 is subjected to high-RF-power plasma (HP) in step (b) so as to form an upper cap film 36 on top of the lower cap film 35 in step (c). In the above embodiment, a cap film constituted by the lower cap film 35 and the upper cap film 36 can effectively block dissipation or dissociation of the dopant from the dopant thin film 32 without oxidizing the substrate. In some embodiments, after step (c), post-deposition plasma treatment illustrated in step (c) in FIG. 5 can also be performed so as to improve the quality of the cap film.

FIG. 2 illustrates a process sequence of formation of a BSG/PSG film and a cap film according to an embodiment of the present invention. In this disclosure, including FIG. 3, the width of each column does not necessarily represent the actual time length, and a raised level of the line in each row represents an ON-state whereas a bottom level of the line in each row represents an OFF-state. In this embodiment, the dopant thin film is boron-doped or phosphorous-doped silicon glass film (B/PSG film). Both the B/PSG film and the cap film are deposited by PEALD using the same aminosilane precursor and the same dilution gas, and typically, both films are continuously deposited in the same reactor. The PEALD process for the B/PSG film includes in sequence: (i) a feed step where a aminosilane precursor without a dopant precursor (B/P precursor) is supplied to a reaction space while supplying a dilution gas and a reactant gas without applying RF power to the reaction space, whereby the precursor is chemisorbed onto a substrate; (ii) a purge step where neither aminosilane precursor nor dopant precursor is supplied to the reaction space while continuously supplying the dilution gas and the reactant gas to the reaction space without applying RF power to the reaction space, whereby excess precursor components are removed from the substrate surface; (iii) a feed step where a dopant precursor without an aminosilane precursor is supplied to the reaction space while continuously supplying the dilution gas and the reactant gas without applying RF power to the reaction space, whereby the precursor is chemisorbed onto the substrate; (iv) a purge step where neither aminosilane precursor nor dopant precursor is supplied to the reaction space while continuously supplying the dilution gas and the reactant gas to the reaction space without applying RF power to the reaction space, whereby excess precursor components are removed from the substrate surface; (v) an RF step where neither aminosilane precursor nor dopant precursor is supplied to the reaction space while continuously supplying the dilution gas and the reactant gas to the reaction space, and RF power is applied to the reaction space, whereby a monolayer of a dopant thin film is formed; and (vi) a purge step where neither aminosilane precursor nor dopant precursor is supplied to the reaction space while continuously supplying the dilution gas and the reactant gas to the reaction space without applying RF power to the reaction space, whereby non-reacted components and reaction by-products, if any, are removed from the substrate surface. Steps (i) to (vi) constitute one cycle, and the cycle is repeated p times (p is an integer) as desired depending on the target thickness of the B/PSG film. The PEALD process for the cap film begins immediately after the completion of the PEALD process for the B/PSG film. The PEALD process for the cap film can be conducted under the same conditions as in the PEALD process (steps (i), (ii), (v), and (vi)) for the B/PSG film, except that no dopant precursor is supplied throughout the process, and also RF power (HP) applied for the cap film is about three or four times the RF power applied for the B/PSG film. The RF power for the B/PSG film cannot be as high as the RF power for the cap film because the dopant may directly bombard the substrate surface. As with the PEALD process for the B/PSG film, the steps constituting one cycle are repeated q times (q is an integer) as desired depending on the target thickness of the cap film.

After the deposition of the cap film, post-deposition plasma treatment begins, wherein RF power is applied to the reactor while supplying the dilution gas and the reactant gas without any precursor.

In some embodiments, the post-deposition plasma treatment can be conducted continuously in the same reaction chamber.

FIG. 3 illustrates a process sequence of formation of a lower cap film and an upper cap film according to an embodiment of the present invention, where the cap film is constituted by the lower cap film and the upper cap film. This process is conducted in place of the process for the cap film illustrated in FIG. 2. In this embodiment, both the lower cap film and the upper cap film are deposited by PEALD using the same precursor and the same dilution gas, and typically, both films are continuously deposited in the same reactor, wherein the difference between PEALD for the lower cap film and PEALD for the upper cap film is that RF power (LP) applied for the lower cap film is lower than RF power (HP) applied for the upper cap film. The PEALD process for the lower cap film includes in sequence: (i) a feed step where a precursor is supplied to a reaction space while supplying a dilution gas and a reactant gas without applying RF power to the reaction space, whereby the precursor is chemisorbed on a substrate; (ii) a purge step where no precursor is supplied to the reaction space while continuously supplying the dilution gas and the reactant gas to the reaction space without applying RF power to the reaction space, whereby excess precursor components are removed from the substrate surface; (iii) an RF step where no precursor is supplied to the reaction space while continuously supplying the dilution gas and the reactant gas to the reaction space, and RF power is applied to the reaction space, whereby a monolayer of a cap film is formed; and (iv) a purge step where no precursor is supplied to the reaction space while continuously supplying the dilution gas and the reactant gas to the reaction space without applying RF power to the reaction space, whereby non-reacted components and reaction by-products, if any, are removed from the substrate surface. Steps (i) to (iv) constitute one cycle, and the cycle is repeated m times (m is an integer) as desired depending on the target thickness of the cap film. The PEALD process for the upper cap film begins immediately after the completion of the PEALD process for the lower cap film. The PEALD process for the upper cap film can be conducted in the same sequence of steps as in the PEALD for the lower cap film and under the same conditions as in the PEALD process for the lower cap film, except that the RF power (HP) applied for the upper cap film is three or four times the RF power (LP) applied for the lower cap film. As with the PEALD process for the upper cap film, steps (i) to (iv) constituting one cycle are repeated n times (n is an integer) as desired depending on the target thickness of the upper cap film.

In some embodiments, the cap film (or upper cap film) can be deposited by PEALD, one cycle of which is conducted under conditions shown in Table 1 below. Since ALD is a self-limiting adsorption reaction process, the number of deposited precursor molecules is determined by the number of reactive surface sites and is independent of the precursor exposure after saturation, and a supply of the precursor is such that the reactive surface sites are saturated thereby per cycle. In the embodiments represented by Table 1, the precursor is fed to the reaction chamber together with a carrier gas which controls flow of the precursor.

TABLE 1

(numbers are approximate)

| | Conditions for Cap Film (or Upper Cap Film) |
|---|---|
| RF power (W) | 400 to 1000 (typically 500 to 800) |
| RF frequency (MHz) | 13.52 to 13.60 (typically 13.56) |
| Precursor | Aminosilane (typically bis(diethylamino) silane (BDEAS)) |
| Bottle temperature (° C.) | 35 to 65 (typically 45 . to 55.) |
| Carrier gas | Ar, $N_2$, He (typically Ar) |
| Carrier gas flow (sccm) | 50 to 6000 (typically 1000 to 4000) |
| Reactant | $O_2$ |
| Reactant flow (sccm) | 50 to 6000 (typically 1000 to 4000) |
| Dilution gas | Ar, $N_2$, He (typically Ar) |
| Dilution gas flow (sccm) | 50 to 6000 (typically 1000 to 4000) |
| Pressure (Pa) | 100 to 1000 (typically 200 to 600) |
| Temperature (° C.) | 50 to 500 |
| Precursor pulse (sec): Supply time | 0.2. to 0.5 |
| Purge upon the precursor pulse (sec) | 0.3 to 1.0 |
| RF power pulse (sec) | 0.2 to 1.0 |
| Purge upon the RF power pulse (sec) | 0.1 to 0.5 |
| Duration of one cycle | 0.8 to 3.5 |

In the above and in this disclosure, the RF power is the RF power applied to a reaction chamber (when a 300-mm substrate is in place), set in an RF power source. Also, the RF power pulse is the duration of RF power application, i.e., the duration of ON time of RF power. The precursor flow is not separately indicated because it corresponds to the flow of the carrier gas which passes through the reservoir and carries the precursor therefrom and enters the reaction chamber.

In some embodiments, the post-deposition plasma treatment may be conducted under conditions shown in Table 2 below.

TABLE 2

(numbers are approximate)

| | Post-deposition plasma treatment |
|---|---|
| RF power (W) | 500 to 1000 (typically 500 to 600) |
| RF frequency (MHz) | 13.52 to 13.60 (typically 13.56) |
| Reactant gas | $O_2$ |
| Reactant gas flow (sccm) | 0 to 6000 (typically 1000 to 4000) |
| Dilution gas | Ar, $N_2$, He |
| Dilution gas flow (sccm) | 50 to 6000 (typically 1000 to 4000) |
| Pressure (Pa) | 100 to 1000 (typically 200 to 600) |
| Temperature (° C.) | 50 to 500 (typically 50 to 500 |
| Duration (seconds) | 10 to 120 (typically 30 to 60) |

In some embodiments, the lower cap film can be deposited by PEALD, one cycle of which is conducted under conditions shown in Table 3 below. Since ALD is a self-limiting adsorption reaction process, the number of deposited precursor molecules is determined by the number of reactive surface sites and is independent of the precursor exposure after saturation, and a supply of the precursor is such that the reactive surface sites are saturated thereby per cycle. In the embodiments represented by Table 3, the precursor is fed to the reaction chamber together with a carrier gas which controls flow of the precursor.

TABLE 3

(numbers are approximate)

| | Conditions for Lower Cap Film |
|---|---|
| RF power (W) | 10 to 300 (typically 50 to 200) |
| RF frequency (MHz) | 13.52 to 13.60 (typically 13.56) |
| Precursor | Aminosilane (typically bis(diethylamino)silane (BDEAS)) |
| Bottle temperature (° C.) | 35 to 65 (typically 45 . to 55.) |
| Carrier gas | Ar, $N_2$, He (typically Ar) |
| Carrier gas flow (sccm) | 50 to 6000 (typically 1000 to 4000) |
| Reactant | $O_2$ |
| Reactant flow (sccm) | 50 to 6000 (typically 1000 to 4000) |
| Dilution gas | Ar, $N_2$, He (typically Ar) |
| Dilution gas flow (sccm) | 50 to 6000 (typically 1000 to 4000) |
| Pressure (Pa) | 100 to 1000 (typically 200 to 600) |
| Temperature (° C.) | 50 to 500 |
| Precursor pulse (sec): Supply time | 0.2. to 0.5 |
| Purge upon the precursor pulse (sec) | 0.3 to 1.0 |
| RF power pulse (sec) | 0.2 to 1.0 (typically 0.2 to 0.5) |
| Purge upon the RF power pulse (sec) | 0.1 to 0.5 |
| Duration of one cycle | 0.8 to 3.5 |

In some embodiments, RF power satisfies: (RF power for lower cap film)≤(RF power for depositing dielectric film)< (RF power for upper cap film).

In some embodiments, the dopant thin film may be formed as an SSD layer by PEALD, one cycle of which is conducted under conditions shown in Table 4 below.

TABLE 4

(numbers are approximate)
Conditions for B/PSG Film Deposition

| Substrate temperature | 50 to 500° C. (preferably 50 to 500° C.) |
|---|---|
| Pressure | 0.1 to 7.5 Torr (preferably 1.5 to 6.0 Torr) |
| Silicon precursor | Silicon-containing precursor such as bis(diethylamino)silane (BDEAS), |
| Silicon precursor pulse | 0.05 to 20 sec (preferably 0.1 to 5.0 sec) |
| Silicon precursor purge | 0.05 to 20 sec (preferably 0.1 to 5.0 sec) |
| Dopant precursor | B/P-containing precursor such as B/P-triethoxide |
| Dopant precursor pulse | 0.05 to 20 sec (preferably 0.1 to 5.0 sec) |
| Dopant precursor purge | 0.05 to 20 sec (preferably 0.1 to 5.0 sec) |
| Reactant | Oxidizing gas such as oxygen, ozone |
| Flow rate of reactant (continuous) | 50 to 6000 sccm (preferably 1000 to 4000 sccm) |
| Dilution gas (noble gas) | He, Ar |
| Flow rate of dilution gas (continuous) | 50 to 6000 sccm (preferably 1000 to 4000 sccm) |
| RF power (13.56 MHz) | 50 to 1000 W (preferably 50 to 800 W for a 300-mm wafer) |
| RF power pulse | 0.05 to 20 sec (preferably 0.1 to 5.0 sec) |
| Purge upon the RF power pulse | 0.05 to 20 sec (preferably 0.1 to 5.0 sec) |
| Thickness of film | 0.1 to 100 nm (preferably 0.5 to 50 nm) |

The dopant precursor may be provided with the aid of a carrier gas. Since ALD is a self-limiting adsorption reaction process, the number of deposited precursor molecules is determined by the number of reactive surface sites and is independent of the precursor exposure after saturation, and a supply of the precursor is such that the reactive surface sites are saturated thereby per cycle. The oxygen plasma may be generated in situ, for example in an oxygen gas that flows continuously throughout the ALD cycle. In other embodiments the oxygen plasma may be generated remotely and provided to the reaction chamber.

As mentioned above, each pulse or phase of each ALD cycle is preferably self-limiting. An excess of reactants is supplied in each phase to saturate the susceptible structure surfaces. Surface saturation ensures reactant occupation of all available reactive sites (subject, for example, to physical size or "steric hindrance" restraints) and thus ensures excellent step coverage. In some embodiments the pulse time of one or more of the reactants can be reduced such that complete saturation is not achieved and less than a monolayer is adsorbed on the substrate surface. However, in some embodiments the dopant precursor step is not self-limiting, for example, due to decomposition or gas phase reactions.

In some embodiments, the silicon precursor and the dopant precursor are both provided prior to any purge step. Thus, in some embodiments a pulse of silicon precursor is provided, a pulse of dopant precursor is provided, and any unreacted silicon and dopant precursor is purged from the reaction space. The silicon precursor and the dopant precursor may be provided sequentially, beginning with either the silicon precursor or the dopant precursor, or together. In some embodiments, the silicon precursor and dopant precursor are provided simultaneously. The ratio of the dopant precursor to the silicon precursor may be selected to obtain a desired concentration of dopant in the deposited thin film.

The ratio of silicon precursor cycles to dopant precursor cycles may be selected to control the dopant concentration in the ultimate film deposited by the PEALD process. For example, for a low dopant density, the ratio of dopant precursor cycles to silicon precursor cycles may be on the order of 1:10. For a higher concentration of dopant, the ratio may range up to about 1:1 or higher such as 1.5:1, 2:1, 2.5:1, 3:1, 4:1, etc. In some embodiments all of the deposition cycles in an ALD process may be dopant precursor cycles. The ratio of deposition cycles comprising dopant to deposition cycles that do not include dopant (such as the ratio of dopant precursor cycles to silicon precursor cycles, or the ratio of dopant oxide cycles to silicon precursor cycles) may be referred to as the control knob. For example, if one dopant precursor cycle is provided for every four silicon precursor cycles, the control knob is 0.25. If no undoped oxide cycles are used, the control knob may be considered to be infinite.

By controlling the ratio of dopant precursor cycles to silicon precursor cycles, the dopant concentration can be controlled from a density range of about 0 atoms of dopant to about 5E+22/cm$^3$ atoms of dopant. Density may be measured, for example, by SIMS (secondary-ion-probe mass spectrometry).

In addition, the dopant density can be varied across the thickness of the film by changing the ratio of dopant precursor cycles to silicon precursor cycles during the deposition process. For example, a high density of dopant may be provided near the substrate surface (lower ratio of silicon precursor cycles to dopant precursor cycles), such as near a Si surface and the density of dopant at the top surface away from the substrate may be low (higher ratio of silicon precursor cycles to dopant precursor cycles). In other embodiments a high density of dopant may be provided at the top surface with a lower density near the substrate surface.

In some embodiments, a dopant thin layer is formed by providing a dopant precursor cycle at certain intervals in a silicon oxide deposition process. The interval may be based, for example, on cycle number or thickness. For example, one or more dopant precursor deposition cycles may be provided after each set of a predetermined number of silicon precursor deposition cycles, such as after every 10, 20, 50, 100, 200, 500 etc. cycles. In some embodiments, undoped silicon oxide deposition cycles may be repeated until a silicon oxide layer of a predetermined thickness is reached, at which point one or more dopant precursor cycles are then carried out. This process is repeated such that dopant is incorporated in the film at specific thickness intervals. For example, one or more dopant precursor cycles may be provided after each 5 nm of undoped $SiO_2$ that is deposited. The process is then repeated until a dopant thin layer of a desired thickness and composition has been deposited.

In some embodiments, an in-situ plasma pre-treatment of the substrate is conducted before a dopant thin layer deposition to enhance doping efficiency into the Si film. For example, $H_2$ plasma pre-treatment can provide some tuning space for FinFET device design. The pre-treatment is not limited to only $H_2$ plasma. In some embodiments, the pre-treatment plasma may be selected from Ar, He, $H_2$, fluorine-containing gas, and their mixed gas plasma.

In some embodiments, the ALD cycle disclosed in U.S. Patent Application Publication No. 2013/0115763, the disclosure of which is incorporated by reference in its entirety, can be employed for an arsenosilicate glass (ASG) film.

In some embodiments, after depositing the protective layer, the substrate is subjected to annealing to diffuse dopant elements into the substrate. In some embodiments, the annealing may be conducted under conditions shown in Table 5 below.

TABLE 5

| (numbers are approximate) Conditions for Annealing | |
|---|---|
| Substrate temperature | 500 to 1200° C. (preferably 700 to 1100° C.) |
| Pressure | 1 to 101325 Pa (preferably 90000 to 101325 Pa) |
| Atmosphere | He, $N_2$, $H_2$ |
| Duration of annealing | 0.1 to 600 sec (preferably 0.5 to 300 sec) |

The embodiments will be explained with respect to preferred embodiments. However, the present invention is not limited to the preferred embodiments.

In the sequence illustrated in FIG. 2, the precursor is supplied in a pulse using a carrier gas which is continuously supplied. This can be accomplished using a flow-pass system (FPS) wherein a carrier gas line is provided with a detour line having a precursor reservoir (bottle), and the main line and the detour line are switched, wherein when only a carrier gas is intended to be fed to a reaction chamber, the detour line is closed, whereas when both the carrier gas and a precursor gas are intended to be fed to the reaction chamber, the main line is closed and the carrier gas flows through the detour line and flows out from the bottle together with the precursor gas. In this way, the carrier gas can continuously flow into the reaction chamber, and can carry the precursor gas in pulses by switching the main line and the detour line. FIG. 1B illustrates a precursor supply system using a flow-pass system (FPS) according to an embodiment of the present invention (black valves indicate that the valves are closed). As shown in (a) in FIG. 1B, when feeding a precursor to a reaction chamber (not shown), first, a carrier gas such as Ar (or He) flows through a gas line with valves b and c, and then enters a bottle (reservoir) 30. The carrier gas flows out from the bottle 30 while carrying a precursor gas in an amount corresponding to a vapor pressure inside the bottle 30, and flows through a gas line with valves f and e, and is then fed to the reaction chamber together with the precursor. In the above, valves a and d are closed. When feeding only the carrier gas (noble gas) to the reaction chamber, as shown in (b) in FIG. 1B, the carrier gas flows through the gas line with the valve a while bypassing the bottle 30. In the above, valves b, c, d, e, and f are closed.

The precursor may be provided with the aid of a carrier gas. Since ALD is a self-limiting adsorption reaction process, the number of deposited precursor molecules is determined by the number of reactive surface sites and is independent of the precursor exposure after saturation, and a supply of the precursor is such that the reactive surface sites are saturated thereby per cycle. A plasma for deposition may be generated in situ, for example, in an ammonia gas that flows continuously throughout the deposition cycle. In other embodiments the plasma may be generated remotely and provided to the reaction chamber.

As mentioned above, each pulse or phase of each deposition cycle is preferably self-limiting. An excess of reactants is supplied in each phase to saturate the susceptible structure surfaces. Surface saturation ensures reactant occupation of all available reactive sites (subject, for example, to physical size or "steric hindrance" restraints) and thus ensures excellent step coverage. In some embodiments the pulse time of one or more of the reactants can be reduced such that complete saturation is not achieved and less than a monolayer is adsorbed on the substrate surface.

Figure 1B:
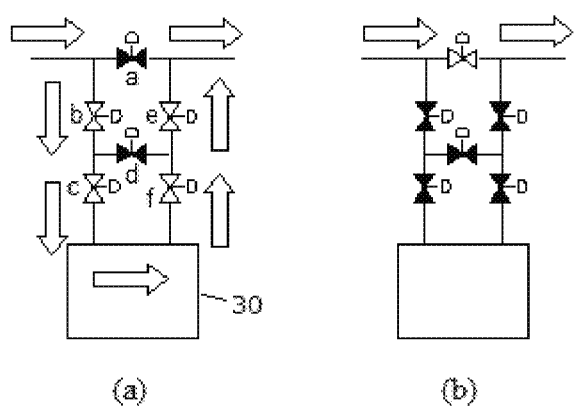
FIG. 1B illustrates a schematic representation of a precursor supply system using a flow-pass system (FPS) usable in an embodiment of the present invention.

The process cycle can be performed using any suitable apparatus including an apparatus illustrated in FIG. 1A, for example. FIG. 1A is a schematic view of a PEALD apparatus, desirably in conjunction with controls programmed to conduct the sequences described below, usable in some embodiments of the present invention. In this figure, by providing a pair of electrically conductive flat-plate electrodes 4, 2 in parallel and facing each other in the interior 11 (reaction zone) of a reaction chamber 3, applying HRF power (13.56 MHz or 27 MHz) 20 to one side, and electrically grounding the other side 12, a plasma is excited between the electrodes. A temperature regulator is provided in a lower stage 2 (the lower electrode), and a temperature of a substrate 1 placed thereon is kept constant at a given temperature. The upper electrode 4 serves as a shower plate as well, and reactant gas (and noble gas) and precursor gas are introduced into the reaction chamber 3 through a gas line 21 and a gas line 22, respectively, and through the shower plate 4. Additionally, in the reaction chamber 3, a circular duct 13 with an exhaust line 7 is provided, through which gas in the interior 11 of the reaction chamber 3 is exhausted. Additionally, a transfer chamber 5 disposed below the reaction chamber 3 is provided with a seal gas line 24 to introduce seal gas into the interior 11 of the reaction chamber 3 via the interior 16 (transfer zone) of the transfer chamber 5 wherein a separation plate 14 for separating the reaction zone and the transfer zone is provided (a gate valve through which a wafer is transferred into or from the transfer chamber 5 is omitted from this figure). The transfer chamber is also provided with an exhaust line 6. In some embodiments, the deposition of multi-element film and surface treatment are performed in the same reaction space, so that all the steps can continuously be conducted without exposing the substrate to air or other oxygen-containing atmosphere. In some embodiments, a remote plasma unit can be used for exciting a gas.

In some embodiments, in the apparatus depicted in FIG. 1A, the system of switching flow of an inactive gas and flow of a precursor gas illustrated in FIG. 1B (described earlier) can be used to introduce the precursor gas in pulses without substantially fluctuating pressure of the reaction chamber.

In some embodiments, a dual chamber reactor (two sections or compartments for processing wafers disposed closely to each other) can be used, wherein a reactant gas and a noble gas can be supplied through a shared line whereas a precursor gas is supplied through unshared lines.

A skilled artisan will appreciate that the apparatus includes one or more controller(s) (not shown) programmed or otherwise configured to cause the deposition and reactor cleaning processes described elsewhere herein to be conducted. The controller(s) are communicated with the various power sources, heating systems, pumps, robotics, and gas flow controllers or valves of the reactor, as will be appreciated by the skilled artisan.

The present invention is further explained with reference to working examples below. However, the examples are not intended to limit the present invention. In the examples where conditions and/or structures are not specified, the skilled artisan in the art can readily provide such conditions and/or structures, in view of the present disclosure, as a matter of routine experimentation. Also, the numbers applied in the specific examples can be modified by a range of at least ±50% in some embodiments, and the numbers are approximate.

EXAMPLES

Reference Example 1

A SiO cap film was deposited on a BSG film having a thickness of 5 nm formed on a Si substrate (0300 mm) by PEALD using the PEALD apparatus illustrated in FIG. 1A (including a modification illustrated in FIG. 1B) under conditions shown in Table 6 below with the sequence illustrated in FIG. 2 except that no post-deposition plasma treatment was conducted and RF power was not high, i.e., the SiO cap film was considered to be a standard cap film.

TABLE 6

(numbers are approximate)

| | | BSG film | | |
|---|---|---|---|---|
| | | AminoSi Feed | B Feed + RF | Cap SiO |
| Depo rate | SiO [times] | 1 | 0 | NA |
| | B [times] | 0 | 3 | |
| Bottle Temp | [° C.] | 35.0 | 35.0 | 50.0 |
| BTL Ar | [sccm] | 2,000 | 2,000 | 2,000 |
| O2/DCM | [sccm] | 1,000 | 1,000 | 1,000 |
| Ar/DCM | [sccm] | 1,000 | 1,000 | 1,000 |
| Seal He/DCM | [sccm] | 200 | 200 | 200 |
| RC Press | [Pa] | 400 | 400 | 400 |
| HRF | [W] | NA | 200 | 200 |
| SUS Temp | [° C.] | 300 | 300 | 300 |
| SHD Temp | [° C.] | 150 | 150 | 150 |
| Wal Temp | [° C.] | 130 | 130 | 130 |
| Gap | [mm] | 7.5 | 7.5 | 7.5 |
| Shift time [sec] | Source Feed | 0.3 | 0.3 | 0.2 |
| | Source Purge | 0.4 | 0.4 | 0.3 |
| | RF-ON | 0 | 0.2 | 0.2 |
| | Post Purge | 0 | 0.1 | 0.1 |
| | Cycle time [sec] | 0.7 | 1.0 | 0.8 |

In the table, "AminoSi Feed" denotes a step of forming a SiO sub-layer using a bisdiethylaminosilane (BDEAS) precursor; "B/P Feed+RF" denotes a step of forming a boron/phosphorus sub-layer using a boron-/phosphorus-triethoxide precursor in combination with application of RF power; "SiO [times]" denotes the number of cycles of forming the SiO sub-layer relative to the number of cycles of forming the B/P sub-layer; "B/P [times]" denotes the number of cycles of forming the B/P sub-layer relative to the number of cycles of forming the SiO sub-layer; "Bottle Temp" denotes a temperature of a bottle storing a liquid precursor; "BLT Ar" denotes an Ar flow rate flowing through the bottle, representing a flow of the precursor; "/DCM" denotes a flow rate per dual-chamber module; "RC Press" denotes a pressure of a reaction chamber; "HRF" denotes a power of high-frequency RF; "SUS Temp" denotes a temperature of a susceptor; "SHD Temp" denotes a temperature of a showerhead; "Wall Temp" denotes a temperature of a wall of the reaction chamber; "Gap" denotes a distance between the showerhead and the susceptor.

Based on the processes described above, six layer structures having different thicknesses of the cap film (a: 0 nm; b: 1 nm; c: 2 nm; d: 3 nm; e: 4 nm; f: 5 nm) were produced, by adjusting the number of cycle repetitions defined in Table 6.

Figure 7:
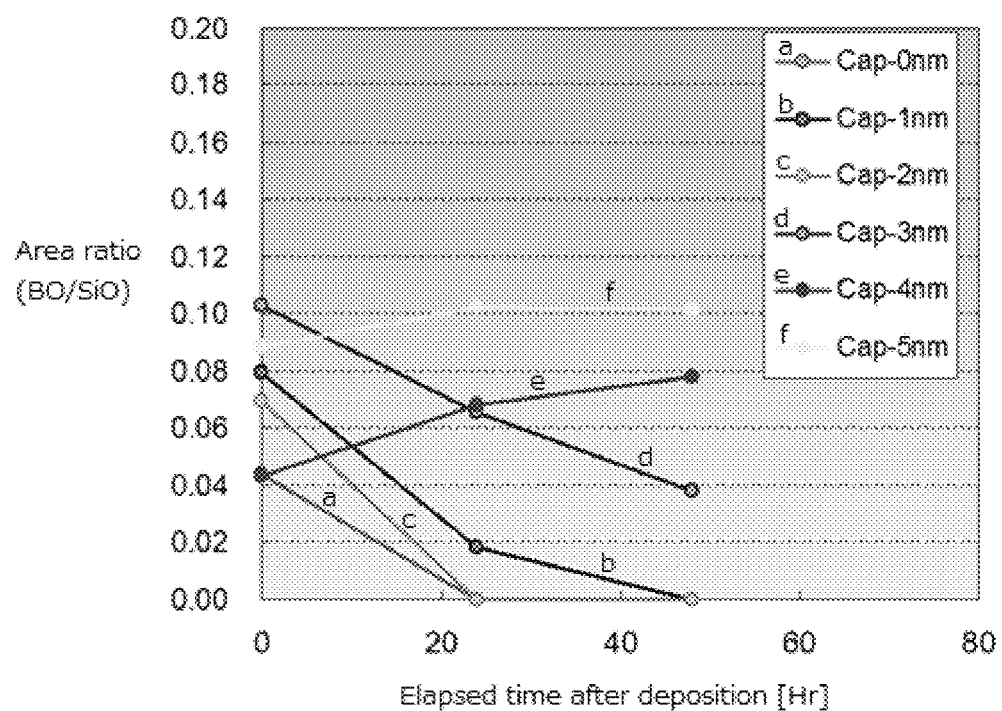
FIG. 7 is a graph showing changes in an area ratio of BO/SiO in FT-IR (infrared spectroscopy) with time elapsed after deposition according to comparative examples where a standard silicon oxide layer was used as a cap film.

After the completion of the deposition of each cap film, each substrate was exposed to nitrogen gas at room temperature, and the substrate was subjected to FT-IR (infrared spectroscopy) analysis to determine changes in the concentration of boron in the integrated film constituted by the BSG film and the cap film with elapsed time after deposition (evaluating how much boron was dissipated or dissociated from the integrated film with time). FIG. 7 is a graph showing changes in an area ratio of BO/SiO in FT-IR with time elapsed after deposition where a standard silicon oxide layer (comparative NSG) was used as a cap film. Since values at an elapsed time of zero fluctuate due to differences among individual substrates and among individual measuring conditions, the blocking effect of each cap film should be evaluated based on changes in the area ratio (BO/SiO) in FT-IR with time.

As can be seen in FIG. 7, when the thickness of the cap film was 3 nm or less (a, b, c, and d), the cap film was not capable of blocking dissipation or dissociation of boron from the BSG film during storage. In contrast, when the thickness of the cap film was 4 nm or more (e and f), the cap film was capable of blocking dissipation or dissociation of boron from the BSG film during storage. That is, it is confirmed that when the standard NSG was used as a cap film, the cap film had to have a thickness of 4 nm or more to block dissipation or dissociation of boron from the BSG film.

Example 1

Each of SiO cap films (g, h, i, and j) was deposited on a BSG film having a thickness of 2 nm formed on a Si substrate (0300 mm) by PEALD using the PEALD apparatus illustrated in FIG. 1A (including a modification illustrated in FIG. 1B) under conditions shown in Table 7 below with the sequence illustrated in FIG. 2 or 3 as follows:

g) the sequence of FIG. 2 except that no post-deposition plasma treatment was conducted, wherein the thickness of the cap film was 2 nm;

h) the sequence of FIG. 2 wherein post-deposition plasma treatment 1 was conducted, and the thickness of the cap film was 2 nm;

i) the sequence of FIG. 2 wherein post-deposition plasma treatment 2 was conducted, and the thickness of the cap film was 2 nm; and j) the sequence of FIG. 2 modified by FIG. 3 except that no post-deposition plasma treatment was conducted, wherein the thickness of the lower cap film was 1 nm and the thickness of the upper cap film was 1 nm.

Figure 8:
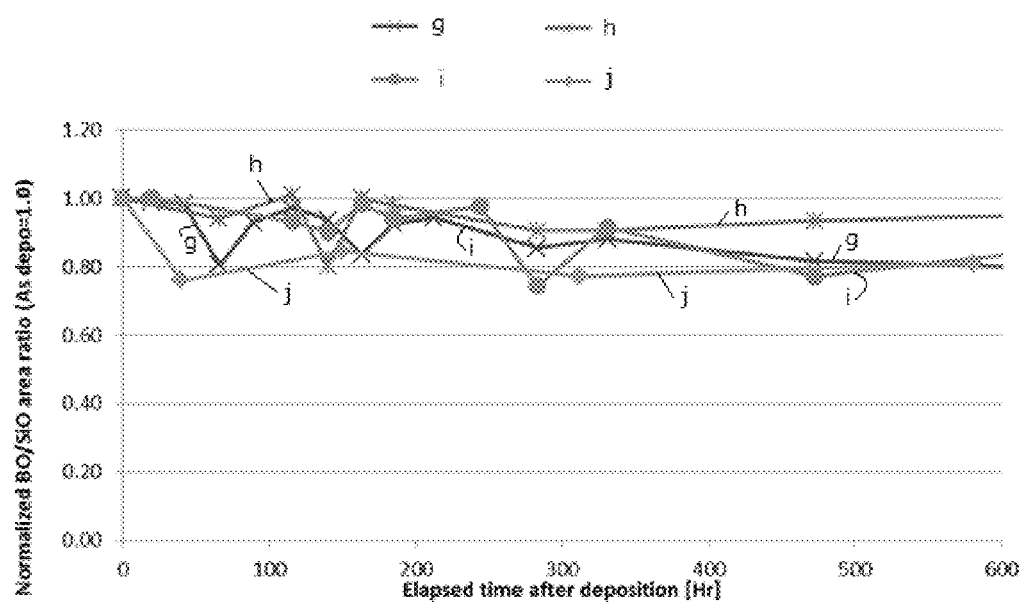
FIG. 8 is a graph showing changes in an area ratio of BO/SiO in FT-IR with time elapsed after deposition according to embodiments of the present invention where high-quality non-doped silicon oxide films were used cap films.

After the completion of the deposition of each cap film, each substrate was exposed to air at room temperature, and the substrate was subjected to FT-IR (infrared spectroscopy) analysis to determine changes in the concentration of boron in the integrated film constituted by the BSG film and the cap film with elapsed time after deposition (evaluating how much boron was dissipated or dissociated from the integrated film with time). FIG. 8 is a graph showing changes in an area ratio of BO/SiO in FT-IR with time elapsed after deposition where the cap film was a high-quality non-doped silicon oxide film. In this graph, the vertical axis indicates normalized BO/SiO area ratios as compared with the value of BO/SiO area ratio when the elapsed time was zero (i.e., the number was calculated by dividing each BO/SiO area ratio after deposition by the BO/SiO area ratio at the completion of deposition).

TABLE 7

(numbers are approximate)

| | | BSG film | | Low-oxidation Cap (low RF power) | High-quality Cap (high RF power) | Post-deposition plasma treatment 1 |
|---|---|---|---|---|---|---|
| | | AminoSi Feed | B Feed+RF | | | |
| Depo rate | SiO [times] | 1 | 0 | NA | NA | NA |
| | B [times] | 0 | 3 | | | |
| Bottle Temp | [° C.] | 35.0 | 35.0 | 50.0 | 50.0 | NA |
| BTL Ar | [sccm] | 2,000 | 2,000 | 2,000 | 2,000 | 2,000 |
| O2/DCM | [sccm] | 1,000 | 1,000 | 1,000 | 1,000 | 1,000 |
| Ar/DCM | [sccm] | 1,000 | 1,000 | 1,000 | 1,000 | 1,000 |
| Seal He/DCM | [sccm] | 200 | 200 | 200 | 200 | 200 |
| RC Press | [Pa] | 400 | 400 | 400 | 400 | 400 |
| HRF | [W] | NA | 200 | 200 | 800 | 200 |
| SUS Temp | [° C.] | 300 | 300 | 300 | 300 | 300 |
| SHD Temp | [° C.] | 150 | 150 | 150 | 150 | 150 |
| Wal Temp | [° C.] | 130 | 130 | 130 | 130 | 130 |
| Gap | [mm] | 7.5 | 7.5 | 7.5 | 7.5 | 7.5 |
| Shift time [sec] | Source Feed | 0.3 | 0.3 | 0.2 | 0.2 | NA |
| | Source Purge | 0.4 | 0.4 | 0.3 | 0.3 | NA |
| | RF-ON | 0 | 0.2 | 0.2 | 0.2 | 30 |
| | Post Purge | 0 | 0.1 | 0.1 | 0.1 | NA |
| | Cycle time [sec] | 0.7 | 1.0 | 0.8 | 0.8 | 30 |

In the above, "Low-oxidation Cap" corresponds to a lower cap film, whereas "High-quality Cap" corresponds to an upper cap film or a cap film formed by high-RF-power plasma. Incidentally, the conditions for "Low-oxidation cap" were the same as those for the "standard" cap film shown in Table 6. The conditions for post-deposition plasma treatment 2 are not shown in Table 7, which are the same as for "Post-deposition plasma treatment 1" in Table 7 except that oxygen gas (O2/DCM) was set zero.

As can be seen in FIG. 8, even though the thickness of each cap film was 2 nm, when the cap film was formed using a high-RF-power plasma (g, h, i, and j), the cap film was highly effectively capable of blocking dissipation or dissociation of boron from the BSG film during storage, surprisingly for over 600 hours.

Example 2

In this example, three cap films were deposited each on a BSG film formed on a Si substrate (Φ300 mm) by PEALD, in a manner substantially similar to that shown in Table 7:

k) the thickness of BSG film was 2 nm, and the sequence illustrated in FIG. 2 was conducted;

m) the thickness of BSG film was 1 nm, and the sequence illustrated in FIG. 2 was conducted; and n) the thickness of BSG film was 1 nm, and the sequence illustrated in FIG. 2 modified by the sequence illustrated in FIG. 3 was conducted.

The thickness of each substrate was measured as layering took place. The results are shown in Tables 8 (k), 9 (m), and 10 (n) below.

TABLE 8

(numbers are approximate)

| k) Layer structures | Target thickness | Measured thickness [nm] |
|---|---|---|
| Native oxide | | 1.24 |
| Si wafer | | |
| BSG | 2 nm | 3.40 |
| Native oxide | | |
| Si wafer | | |
| High-quality Cap | 2 nm | 5.60 |
| BSG | 2 nm | |
| Native oxide | | |
| Si wafer | | |
| Post-deposition plasma treatment | — | 5.67 |
| High-quality Cap | 2 nm | |
| BSG | 2 nm | |
| Native oxide | | |
| Si wafer | | |

TABLE 9

(the numbers are approximate)

| m) Layer structures | Target thickness | Measured thickness [nm] |
|---|---|---|
| Native oxide | | 1.24 |
| Si wafer | | |
| BSG | 1 nm | 2.52 |
| Native oxide | | |
| Si wafer | | |
| High-quality Cap | 2 nm | 5.43 |
| BSG | 1 nm | |
| Native oxide | | |
| Si wafer | | |
| Post-deposition | — | 5.57 |

TABLE 9-continued (the numbers are approximate)

| m) Layer structures | Target thickness | Measured thickness [nm] |
|---|---|---|
| plasma treatment | | |
| High-quality Cap | 2 nm | |
| BSG | 2 nm | |
| Native oxide | | |
| Si wafer | | |

TABLE 10

(numbers are approximate)

| n) Layer structures | Target thickness | Measured thickness [nm] |
|---|---|---|
| Native oxide | | 1.24 |
| Si wafer | | |
| BSG | 1 nm | 2.52 |
| Native oxide | | |
| Si wafer | | |
| High-quality Cap | 1 nm | 3.67 |
| BSG | 1 nm | |
| Native oxide | | |
| Si wafer | | |
| Post-deposition plasma treatment | 1 nm | 4.81 |
| High-quality Cap | 1 nm | |
| BSG | 1 nm | |
| Native oxide | | |
| Si wafer | | |
| Post-deposition plasma treatment | — | 5.03 |
| High-quality Cap (Upper Cap) | 1 nm | |
| Low-oxidation Cap (Lower Cap) | 1 nm | |
| BSG | 1 nm | |
| Native oxide | | |
| Si wafer | | |

As can be seen in Tables 8 and 9, when the BSG film had a thickness of 1 nm (Table 9), after depositing the cap film having a target thickness of 2 nm, the thickness of the layers was increased by 2.91 nm (5.43-2.52), whereas when the BSG film had a thickness of 2 nm (Table 8), after depositing the cap film having a target thickness of 2 nm, the thickness of the layers was increased by 2.20 nm (5.60-3.40). That is, when the BSG film was thin (Table 9), the surface of the silicon substrate was oxidized or damaged when depositing the cap film using the high-RF-power plasma, increasing the thickness of the silicon substrate as illustrated in FIG. 5. When the substrate is oxidized, the thickness of the substrate tends to increase, and by measuring a change in thickness, the degree of oxidation of the substrate can be evaluated. In contrast, when the low-oxidation cap film (the lower cap film) was deposited using the low-RF-power plasma before depositing the upper cap film using the high-RF-power plasma as shown in Table 10, even though the BSG film had a thickness of 1 nm as in Table 9, after depositing the upper cap film (the lower and upper cap films each having a target thickness of 1 nm), the thickness of the laminate was increased only by 1.14 nm (4.81-3.67), as compared with 2.91 nm in Table 9. This shows that by depositing the lower cap film using the low-RF-power plasma before depositing the upper cap film using the high-RF-power plasma, oxidation of the surface of the substrate can effectively be avoided as illustrated in FIG. 6. Incidentally, in Tables 8 to 10, after the post-deposition plasma treatment, the thickness of the layers increased, although the post-deposition plasma treatment was not expected to increase the thickness because no precursor was used. This may be because slight oxidation (or natural oxidation) may have occurred due to the high-RF-power application of the post-deposition plasma treatment.

Example 3

In this example, five cap films having a thickness of 30 nm were deposited each on a Si substrate (Φ300 mm) by PEALD (without BSG film), in a manner substantially similar to that shown in Table 7 except for the numbers shown in Table 11 below.

TABLE 11

(numbers are approximate)

|  | Wet etch rate @ 100:1 DHF (relative to wet etch rate of thermal oxide film assumed as one) |
| --- | --- |
| p) Low-oxidation Cap (RF 50 W, 0.2 sec) | 12.0 |
| q) Low-oxidation Cap (RF 200 W, 0.2 sec) | 9.3 |
| r) High-quality Cap (RF 500 W, 0.2 sec) | 3.2 |
| s) High-quality Cap (RF 800 W, 0.2 sec) | 2.3 |
| t) High-quality Cap (RF 800 W, 1.0 sec) | 2.0 |

As shown in Table 11, when the cap film was formed using high-RF-power plasma (r, s, t), the wet etch resistance of the film was high, as compared with the cap film formed using low-RF-power plasma (p, q). The higher the RF power, the higher the wet etch resistance of the film became. Further, when the duration of application of RF power was longer, the wet etch resistance of the film became higher (t).

It will be understood by those of skill in the art that numerous and various modifications can be made without departing from the spirit of the present invention. Therefore, it should be clearly understood that the forms of the present invention are illustrative only and are not intended to limit the scope of the present invention.

I claim:

1. A method for protecting a doped silicate glass layer, comprising:
   forming a doped silicate glass layer on a substrate in a reaction chamber by plasma-enhanced atomic layer deposition (PEALD) using a first RF power; and
   forming a non-doped silicate glass layer having a thickness of less than 4 nm on the doped silicate glass layer in the reaction chamber, without breaking vacuum, by plasma-enhanced atomic layer deposition (PEALD) using a second RF power,
   wherein the second RF power is at least twice the first RF power.

2. The method according to claim 1, wherein the second RF power is at least three times the first RF power.

3. The method according to claim 1, wherein the non-doped silicate glass layer has a thickness of 3 nm or less.

4. The method according to claim 1, wherein the doped silicate glass layer is constituted by borosilicate glass or phosphosilicate glass.

5. The method according to claim 1, wherein the non-doped silicate glass layer is deposited in contact with the doped silicate glass layer.

6. The method according to claim 1, further comprising treating the non-doped silicate glass layer with a plasma without a precursor in the reaction chamber without breaking vacuum.

7. The method according to claim 6, wherein the plasma is an oxygen plasma and/or argon plasma.

8. The method according to claim 1, further comprising, before forming the non-doped silicate glass layer as an upper non-doped silicate glass layer using the second RF power, forming a lower non-doped silicate glass layer on the doped silicate glass layer in the reaction chamber, without breaking vacuum, by plasma-enhanced atomic layer deposition (PEALD) using a third RF power, wherein the thickness of the lower non-doped silicate glass layer is such that the total thickness of the upper non-doped silicate glass layer and the lower non-doped silicate glass layer is less than 4 nm, and the third RF power is lower than the second RF power.

9. The method according to claim 8, wherein the third RF power is equivalent to or lower than the first RF power.

10. The method according to claim 8, wherein the lower non-doped silicate glass layer is deposited in contact with the lower non-doped silicate glass layer which is deposited in contact with the doped silicate glass layer.

11. The method according to claim 1, wherein an alkylaminosilane precursor is supplied from a reservoir to the reaction chamber for the PEALD of the doped silicate glass layer and for the PEALD of the non-doped silicate glass layer.

12. The method according to claim 11, wherein the temperature of the reservoir is higher for the PEALD of the non-doped silicate glass layer than the temperature of the reservoir for the PEALD of the doped silicate glass layer.

13. The method according to claim 8, wherein an alkylaminosilane precursor is supplied from a reservoir to the reaction chamber for the PEALD of the doped silicate glass layer, for the PEALD of the upper non-doped silicate glass layer, and for the PEALD of the lower non-doped silicate glass layer.

14. The method according to claim 13, wherein the temperature of the reservoir is higher for the PEALD of the upper and lower non-doped silicate glass layers than the temperature of the reservoir for the PEALD of the doped silicate glass layer.

15. The method according to claim 1, wherein oxygen gas and a noble gas are continuously supplied to the reaction chamber throughout the PEALD of the doped silicate glass layer and the PEALD of the non-doped silicate glass layer.

16. The method according to claim 7, wherein oxygen gas and a noble gas are continuously supplied to the reaction chamber throughout the PEALD of the doped silicate glass layer, the PEALD of the non-doped silicate glass layer, and the oxygen plasma treatment.

17. The method according to claim 8, wherein oxygen gas and a noble gas are continuously supplied to the reaction chamber throughout the PEALD of the doped silicate glass layer, the PEALD of the lower non-doped silicate glass layer, and the PEALD of the upper non-doped silicate glass layer.

18. The method according to claim 11, wherein the alkylaminosilane is selected from the group consisting of bisdiethylaminosilane (BDEAS), biszimethylaminosilane (BDMAS), hexylethylaminosilane (HEAD), tetraethylaminosilane (TEAS), tert-butylaminosilane (TBAS), bistert-butylaminosilena (BTBAS), bisdimethylaminodimethylaminosilane (BDMADMS), heptametyhlsilazane (HIVIDS), trimethysylyldiethlamine (TMSDEA), trimethylsyledimethlamine (TMSDMA), trimethyltoribinylcycletrisilazane (TMTVCTS), tri strimetylhydroxyamine (TTMSHA), bisdimethylsaminomethylsilane (BDMAMS), and dimetyhlsilyldimethlamine (DMSDMA).

19. The method according to claim 1, further comprising annealing the doped silicate glass layer and the non-doped silicate glass layer to diffuse a dopant contained in the doped silicate glass to the substrate.

20. The method according to claim 1, wherein a thickness of the doped silicate glass layer is 1 nm to 5 nm.

* * * * *